(12) United States Patent
Sugasaki et al.

(10) Patent No.: US 7,374,863 B2
(45) Date of Patent: May 20, 2008

(54) POLYMERIZABLE COMPOSITION

(75) Inventors: Atsushi Sugasaki, Shizuoka (JP); Kazuto Kunita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/046,720

(22) Filed: Feb. 1, 2005

(65) Prior Publication Data
US 2005/0170285 A1    Aug. 4, 2005

(30) Foreign Application Priority Data

Feb. 2, 2004 (JP) .......................... P.2004-026049
Aug. 25, 2004 (JP) .......................... P.2004-245537

(51) Int. Cl.
*G03F 7/038* (2006.01)

(52) U.S. Cl. .............. 430/284.1; 430/285.1; 430/287.1; 430/920; 430/945; 430/944; 522/63; 522/96

(58) Field of Classification Search ............... None
See application file for complete search history.

(56) References Cited

U.S. PATENT DOCUMENTS

| | | | |
|---|---|---|---|
| 2,850,445 A | | 9/1958 | Oster |
| 3,948,665 A | * | 4/1976 | Richter et al. ............ 430/284.1 |
| 4,228,232 A | * | 10/1980 | Rousseau ................. 430/284.1 |
| 4,438,189 A | * | 3/1984 | Geissler et al. .......... 430/284.1 |
| 4,708,925 A | | 11/1987 | Newman |
| 4,910,080 A | * | 3/1990 | Frost ...................... 428/307.3 |
| 5,185,234 A | * | 2/1993 | Nakatsukasa et al. .... 430/284.1 |
| 5,300,399 A | * | 4/1994 | Wilczak .................. 430/253 |
| 5,514,522 A | * | 5/1996 | Fitzgerald et al. ....... 430/284.1 |
| 6,689,537 B2 | * | 2/2004 | Urano et al. ............. 430/273.1 |
| 2003/0124460 A1 | * | 7/2003 | Munnelly et al. ........ 430/284.1 |
| 2003/0215745 A1 | * | 11/2003 | Fujimaki ................ 430/284.1 |

FOREIGN PATENT DOCUMENTS

| | | |
|---|---|---|
| EP | 0780239 A2 * | 6/1997 |
| EP | 1 096 314 A1 | 5/2001 |
| EP | 1 213 619 A1 | 6/2002 |
| EP | 1 344 783 A1 | 9/2003 |
| EP | 1 466 893 A1 | 10/2004 |
| EP | 1 502 735 A2 | 2/2005 |
| JP | 44-20189 B | 8/1969 |
| JP | 8-276558 A | 10/1996 |

OTHER PUBLICATIONS

Ciba Specialty Chemicals, Photoinitiators for UV Curing: Key Products Selection Guide, 8 pages, Edition 2003. printed Oct. 2003 in Switezerland.*

* cited by examiner

*Primary Examiner*—Cynthia Hamilton
(74) *Attorney, Agent, or Firm*—Sughrue Mion, PLLC

(57) ABSTRACT

A polymerizable composition comprising: (A) a non-acrylic binder polymer having an ethylenically unsaturated bond on a side chain; (B) a neutrally charged compound capable of generating a radical under light or heat; and (C) a compound having an ethylenically unsaturated bond, and a polymerizable composition comprising: (A') a polyurethane resin having an ethylenically unsaturated bond on a side chain, which is a reaction product of an isocyanate compound and a diol compound including a diol compound represented by the formula (G) defend herein; (B) a neutrally charged compound capable of generating a radical under light or heat; (C) a compound having an ethylenically unsaturated bond; (D') a 1,4-benzoquinone derivative; and (E') a dye having a maximum absorption wavelength in a region of from 350 to 450 nm.

10 Claims, No Drawings

POLYMERIZABLE COMPOSITION

FIELD OF THE INVENTION

The present invention relates to a polymerizable composition which is used for an image recording material such as synthetic resin relief printing plate, color proof, photoresist and color filter used in three-dimensional stereolithography, holography, lithographic printing plate material and flexographic printing, or for an ink, a coating material, an adhesive or the like. More specifically, the present invention relates to a polymerizable composition suitably used as an image-recording layer of a negative lithographic printing plate precursor capable of so-called direct plate-making of directly producing a printing plate based on digital signals of a computer or the like by using laser light.

BACKGROUND OF THE INVENTION

Lasers are recently making a remarkable progress. Particularly, as for the solid laser, semiconductor laser and gas laser of emitting ultraviolet light, visible light or infrared light at a wavelength of 300 to 1,200 nm, high-output compact lasers are easily available and these lasers are very useful as a recording light source in lithographic printing of directly producing a printing plate based on digital data of a computer or the like. Various studies are being made on the recording material sensitive to these various laser rays and, for example, a positive recording material for use with an infrared laser having a sensitive wavelength of 760 nm or more (see, U.S. Pat. No. 4,708,925) and an acid catalyst crosslinking-type negative recording material (see, JP-A-8-276558 (the term "JP-A" as used herein means an "unexamined published Japanese patent application")) are known. Also, radical polymerization-type negative recording materials for use with an ultraviolet or visible laser at 300 to 700 nm are known (see, U.S. Pat. No. 2,850,445 and JP-B44-20189 (the term "JP-B" as used herein means an "examined Japanese patent publication")).

Such a negative image recording material usually contains a compound capable of generating a radical under light or heat (hereinafter sometimes referred to as a "radical initiator") and a compound having an ethylenically unsaturated bond (hereinafter sometimes referred to as a "polymerizable compound"), and utilizes a recording system of bringing about a polymerization reaction of the polymerizable compound by using a radical generated under light or heat as the initiator. Particularly, a lithographic printing plate precursor comprising a hydrophilic support having provided thereon a photopolymerization-type recording layer having excellent photosensitization speed and containing a radical initiator, a polymerizable compound and a binder polymer soluble in an alkali developer has advantageous features such as excellent productivity, simple and easy development processing, high resolution and good inking property and therefore, can give a printing plate having desired printing performances.

With respect to the binder polymer soluble in an alkali developer, for example, an acrylic binder polymer such as acrylic acid copolymer and methacrylic acid copolymer is generally used, but use of various binder polymers is being studied for the purpose of more enhancing the performance.

SUMMARY OF THE INVENTION

An object of the present invention is to provide a polymerizable composition suitably used as an image-recording layer of a negative image recording material excellent in press life and image formability, more specifically, a polymerizable composition suitably used as an image recording layer of a negative lithographic printing plate precursor suitable for image drawing with laser light.

As a result of intensive investigations, the present inventors have found that when a non-acrylic binder polymer having an ethylenically unsaturated bond on the side chain and a neutrally charged compound capable of generating a radical under light or heat are used in combination, the above-described object can be attained. The present invention has been accomplished based on this finding.

That is, the polymerizable composition of the present invention is characterized by comprising (A) a non-acrylic binder polymer having an ethylenically unsaturated bond on the side chain, (B) a neutrally charged compound capable of generating a radical under light or heat, and (C) a compound having an ethylenically unsaturated bond.

The polymerizable composition of the present invention preferably further comprises (D) a polymerization inhibitor in addition to those components (A) to (C).

A preferred embodiment of the present invention is described below. The non-acrylic binder polymer (A) having an ethylenically unsaturated bond on the side chain is preferably a polyurethane resin having an ethylenically unsaturated bon on the side chain. More specifically, a polyurethane resin having 0.3 meq/g or more of an ethylenically unsaturated bond group on the side chain and at the same time, having 0.4 meq/g or more of a carboxyl group on the side chain is preferred. Such a polyurethane resin is a reaction product of a diisocyanate compound and a diol compound, and the diol compound used in this reaction preferably contains (i) at least one diol compound having an ethylenically unsaturated bond group, with at least one being a secondary alcohol, and (ii) at least one diol compound having a carboxyl group.

The diol compound (i) having an ethylenically unsaturated bond group is preferably a compound represented by the following formula (G):

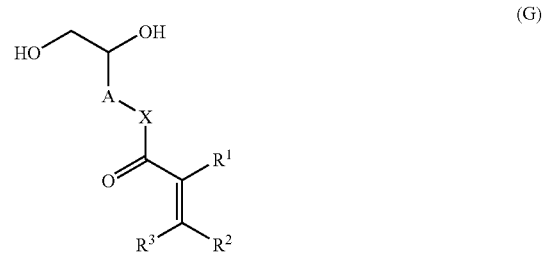

wherein $R^1$ to $R^3$ each independently represents a hydrogen atom or a monovalent organic group, A represents a divalent organic residue, X represents an oxygen atom, a sulfur atom or $-N(R^{12})-$, and $R^{12}$ represents a hydrogen atom or a monovalent organic group.

Other preferred embodiments include an embodiment where a metallocene compound is used as (B) the neutrally charged compound capable of generating a radical under light or heat, and an embodiment where a 1,4-benzoquinone derivative is contained as (D) the polymerization inhibitor.

From the standpoint of elevating the sensitivity, the polymerizable composition of the present invention preferably further comprises (E) a dye having a maximum absorption wavelength in the region from 350 to 450 nm.

In a more preferred embodiment of the polymerizable composition of the present invention, (A') a polyurethane resin having an ethylenically unsaturated bond on the side chain, which is a reaction product of an isocyanate compound and a diol compound containing a diol compound represented by formula (G), is used as (A) the non-acrylic binder polymer having an ethylenically unsaturated bond on the side chain, a metallocene compound is used as (B) the neutrally charged compound capable of generating a radical under light or heat, and in addition to these and (C) the compound having an ethylenically unsaturated bond, a 1,4-benzoquinone derivative as (D) the polymerization inhibitor and (E) a sensitizing dye, preferably (E') a dye having a maximum absorption wavelength in the region from 350 to 450 nm, are contained.

The operation of the present is not clearly known but is considered as follows.

The non-acrylic binder polymer (A) having an ethylenically unsaturated bond on the side chain (hereinafter sometimes referred to as a "specific binder polymer"), contained in the polymerizable composition of the present invention, has a small number of ester groups within the molecule as compared with acrylic binder polymers. Therefore, the polarity within the molecule is less deviated and excellent compatibility with a radical initiator is obtained. This effect is more enhanced particularly when a neutrally charged radical initiator is used. By virtue of such an effect, the radical initiator in the composition is prevented from coagulation and is uniformly dispersed, so that a sufficiently large amount of radicals can be generated upon exposure and at the same time, the radical can act on an adjacent compound having an ethylenically unsaturated bond to allow for swift occurrence progress of a polymerization reaction. As a result, excellent image formability is expressed and a strong film attributable to the efficient curing reaction is formed.

Also, the specific binder polymer for use in the present invention has an ethylenically unsaturated bond on the side chain and therefore, a strong crosslinked structure is formed not only between polymerizable compounds but also between binder polymers or between a binder polymer and a polymerizable compound, and this enhanced crosslinking density yields more elevated film strength.

Furthermore, in a preferred embodiment of the present invention, a polyurethane resin derived from a diol compound with at least one being a secondary alcohol is used as the specific binder polymer and by virtue of the secondary alcohol having a larger steric hindrance, the polymer main chain can be prevented from excessive molecular motion and the film strength can be more elevated.

The lithographic printing plate precursor where such a polymerizable composition is applied as a recording layer is excellent in the image formability and forms a strong image area upon exposure, so that the image area can be less damaged by an alkali developer at the development and an excellent press life can be obtained.

In particular, when (1) a lophine dimer compound or (2) a titanocene compound is present as a radical initiator together with the polyurethane resin having a secondary alcohol, the film strength is more elevated and the reason therefor is considered because when (1) a lophine dimer is used, the aromatic ring in the lophine dimer structure is prevented from the molecular motion and entropy loss of the interaction less occurs to allow for a π-π interaction with the ethylenically unsaturated bond of the polyurethane resin having a secondary alcohol in the increased interaction state, and when (2) a titanocene compound is used, the titanium atom in the titanocene compound electrostatically interacts with the urethane bond moiety in the polyurethane resin having a secondary alcohol.

According to the present invention, a polymerizable composition suitably used as an image-recording layer of a negative image recording material excellent in press life and image formability, more specifically, a polymerizable composition suitably used as an image recording layer of a negative lithographic printing plate precursor suitable for image drawing with laser light can be obtained.

DETAILED DESCRIPTION OF THE INVENTION

The polymerizable composition of the present invention is characterized by comprising (A) a non-acrylic binder polymer having an ethylenically unsaturated bond on the side chain, (B) a neutrally charged compound capable of generating a radical under light or heat, and (C) a compound having an ethylenically unsaturated bond. In the polymerizable composition of the present invention, (D) a polymerization inhibitor is preferably added for the purpose of preventing unnecessary thermal polymerization of the ethylenically unsaturated bond, and (E) a sensitizing dye capable of absorbing a light energy at a predetermined wavelength and converting it into a heat energy is also preferably added for the purpose of elevating the sensitivity.

The constituent components of the polymerizable composition of the present invention are sequentially described below.

[(A) Non-Acrylic Binder Polymer Having Ethylenically Unsaturated Bond on Side Chain]

As for the specific binder used in the present invention, non-acrylic polymers having an ethylenically unsaturated bond (carbon-carbon unsaturated double bond) on the side chain can be used without limitation. The "non-acrylic polymer" as used in the present invention means a polymer not containing a structure unit derived from an acrylic or methacrylic compound, as a structure unit of the polymer.

The specific binder polymer for use in the present invention is preferably a polymer soluble in or swellable with water or an aqueous alkali solution so that water development or development with an aqueous alkali solution can be performed. The "soluble in or swellable with water or an aqueous alkali solution" means that the specific binder polymer becomes a transparent uniform solution when added to water or an aqueous alkali solution at a pH of 7 or more or that when the specific binder polymer is added to water or an aqueous alkali solution at a pH of 7 or more, the specific polymer compound absorbs the water or aqueous solution and swells.

Specific examples of the specific binder polymer include a urethane resin, a novolak resin, an acetal resin, a styrene-based resin, a polyester-based resin, a polyamide-based resin, a polyurea resin and a polyimide resin each having an ethylenically unsaturated bond on the side chain. Among these, a urethane resin (hereinafter sometimes referred to as a "specific urethane resin") and a styrene-based resin (hereinafter sometimes referred to as a "specific styrene-based resin") are preferred in view of the effect.

(Urethane Resin Having Ethylenically Unsaturated Bond on Side Chain)

The specific urethane resin for use in the present invention includes a urethane resin having at least one functional group represented by the following formulae (1) to (3). The functional groups represented by the following formulae (1) to (3) are described below.

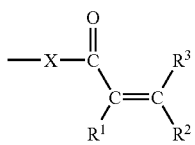

(1)

In formula (1), $R^1$ to $R^3$ each independently represents a hydrogen atom or a monovalent organic group. $R^1$ preferably includes a hydrogen atom or an alkyl group which may have a substituent. Among these, a hydrogen atom and a methyl group are more preferred in view of high radical reactivity. $R^2$ and $R^3$ each independently includes a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent. Among these, a hydrogen atom, a carboxyl group, an alkoxycarbonyl group, an alkyl group which may have a substituent, and an aryl group which may have a substituent are preferred in view of high radical reactivity.

X represents an oxygen atom, a sulfur atom or —N($R^{12}$)—, and $R^{12}$ represents a hydrogen atom or a monovalent organic group. $R^{12}$ includes an alkyl group which may have a substituent. Among these, a hydrogen atom, a methyl group, an ethyl group, and an isopropyl group are preferred in view of high radical reactivity.

Examples of the substituent which can be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

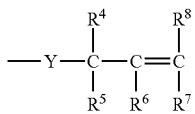

(2)

In formula (2), $R^4$ to $R^8$ each independently represents a hydrogen atom or a monovalent organic group. $R^4$ to $R^8$ each preferably includes a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent. Among these, a hydrogen atom, a carboxyl group, an alkoxycarbonyl group, an alkyl group which may have a substituent, and an aryl group which may have a substituent are more preferred.

Examples of the substituent which can be introduced are the same as those for formula (1). Y represents an oxygen atom, a sulfur atom or —N($R^{12}$)—. $R^{12}$ has the same meaning as $R^{12}$ in formula (1) and preferred examples thereof are also the same.

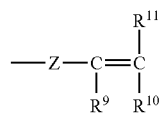

(3)

In formula (3), $R^9$ preferably includes a hydrogen atom and an alkyl group which may have a substituent. Among these, a hydrogen atom and a methyl group are preferred in view of high radical reactivity. $R^{10}$ and $R^{11}$ each independently includes a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent. Among these, a hydrogen atom, a carboxyl group, an alkoxycarbonyl group, an alkyl group which may have a substituent, and an aryl group which may have a substituent are preferred in view of high radical reactivity.

Examples of the substituent which can be introduced are the same as those for formula (1). Z represents an oxygen atom, a sulfur atom, —N($R^{13}$)— or a phenylene group which may have a substituent. $R^{13}$ includes an alkyl group which may have a substituent. Among these, a methyl group, an ethyl group and an isopropyl group are preferred in view of high radical reactivity.

The basic skeleton of the specific urethane resin according to the present invention is described below.

The specific urethane resin according to the present invention is a polyurethane resin having a basic skeleton comprising a structure unit which is a reaction product of at least one diisocyanate compound represented by the following formula (4) and at least one diol compound represented by formula (5) (hereinafter sometimes referred to as a "specific urethane resin").

OCN—$X^0$—NCO (4)

HO—$Y^0$—OH (5)

wherein $X^0$ and $Y^0$ each independently represents a divalent organic residue.

When at least either one of the diisocyanate compound represented by formula (4) and the diol compound represented by formula (5) contains at least one group represented by formulae (1) to (3), a specific polyurethane resin having introduced into the side chain the group represented by formulae (1) to (3) is produced as a reaction product of those diisocyanate compound and diol compound. According to such a method, the specific polyurethane resin for use in the present invention can be more easily produced than in the case of substituting and introducing a desired side chain after the reaction and production of a polyurethane resin.

1) Diisocyanate Compound

The diisocyanate compound represented by formula (4) is a reaction product obtained by addition-reacting, for example, a triisocyanate compound with one equivalent of a monofunctional alcohol or monofunctional amine compound having an unsaturated group.

Examples of the triisocyanate compound include, but are not limited to, those set forth below.

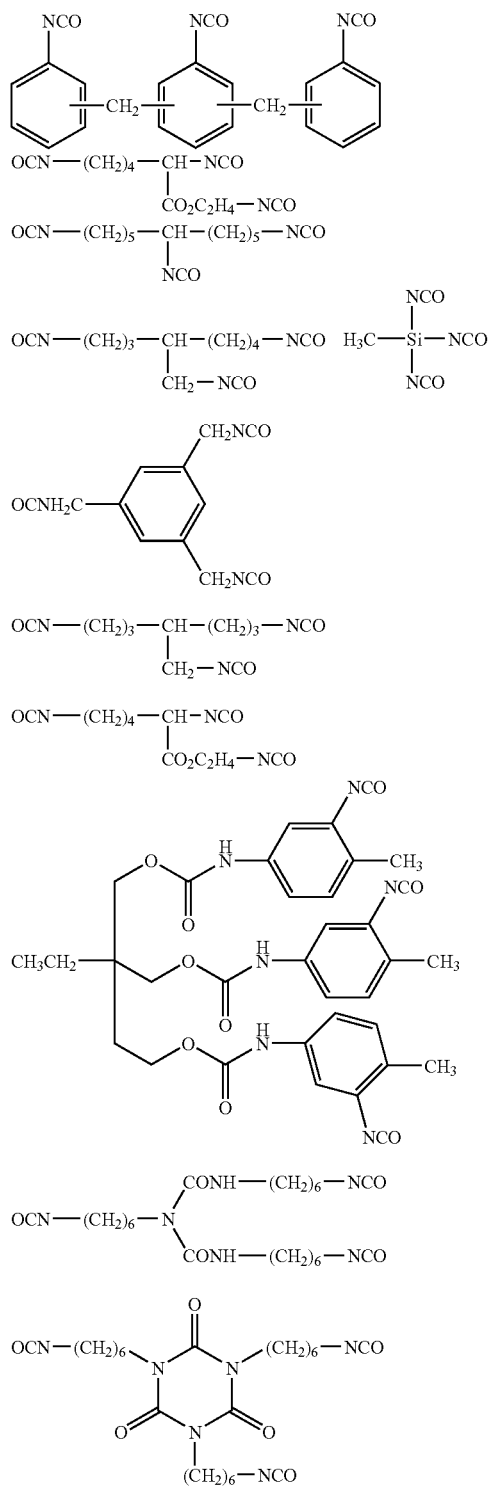

Examples of the monofunctional alcohol or monofunctional amine compound having an unsaturated group include, but are not limited to, those set forth below.

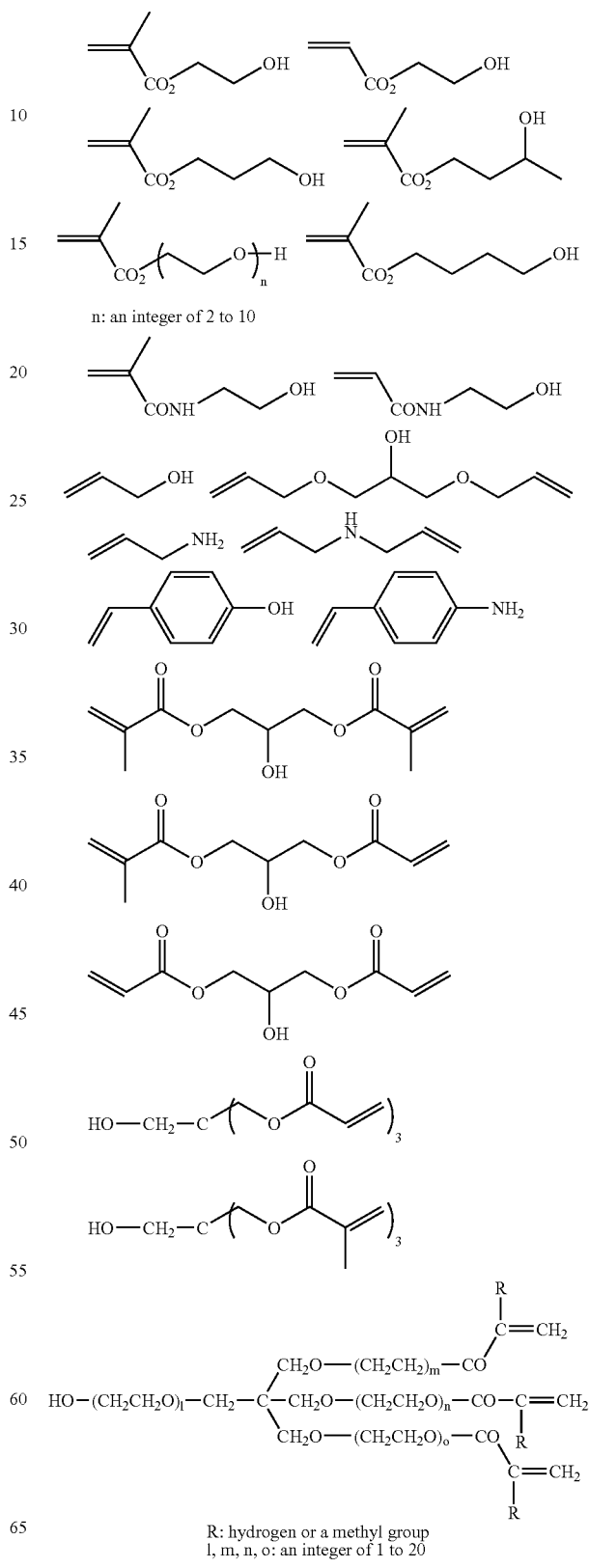

n: an integer of 2 to 10

R: hydrogen or a methyl group
l, m, n, o: an integer of 1 to 20

-continued

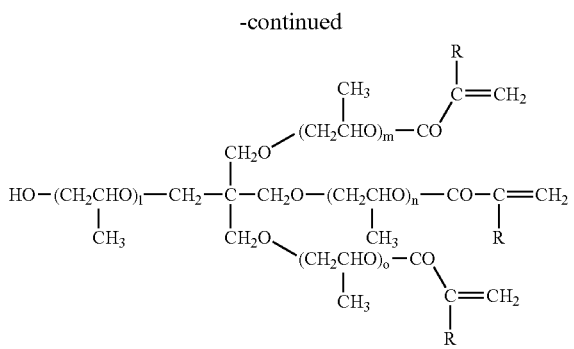

R: hydrogen or a methyl group
l, m, n, o: an integer of 1 to 20

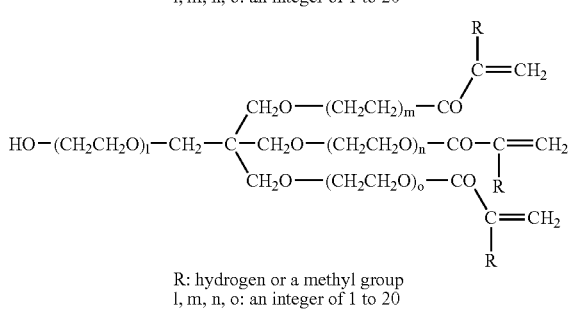

R: hydrogen or a methyl group
l, m, n, o: an integer of 1 to 20

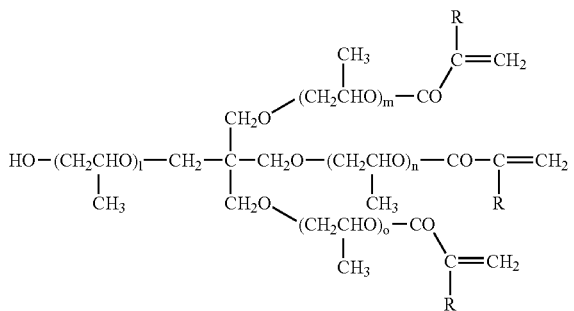

R: hydrogen or a methyl group
l, m, n, o: an integer of 1 to 20

-continued

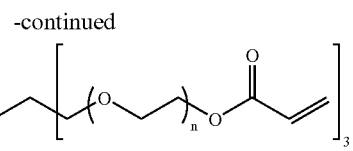

n: an integer of 1 to 20

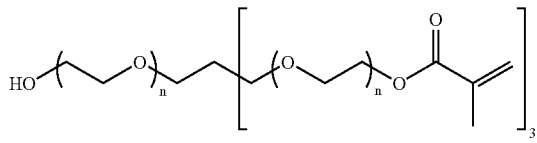

n: an integer of 1 to 20

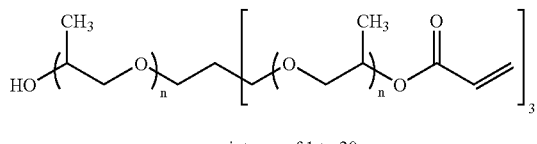

n: an integer of 1 to 20

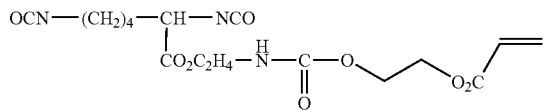

n: an integer of 1 to 20

As for the method of introducing an unsaturated group into the side chain of the polyurethane resin, a method where a diisocyanate compound containing an unsaturated group on the side chain is used as a raw material in the production of the polyurethane resin is preferred. Examples of the diisocyanate compound having an unsaturated group on the side chain, which can be obtained by the addition-reaction of a triisocyanate compound with one equivalent of a monofunctional alcohol or monofunctional amine compound having an unsaturated group, include, but are not limited to, those set forth below.

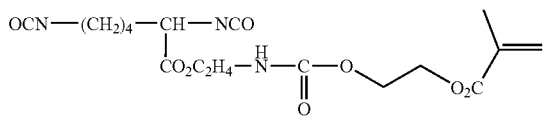

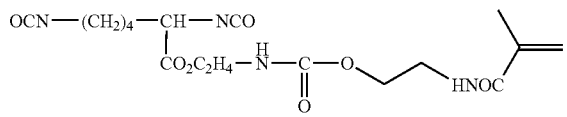

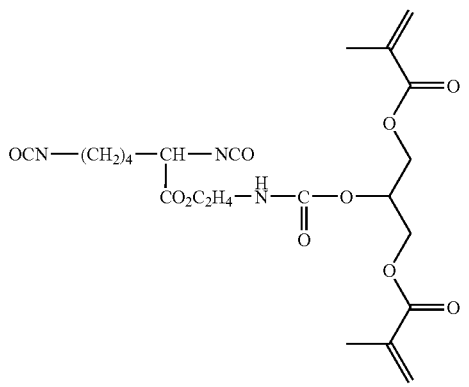

-continued
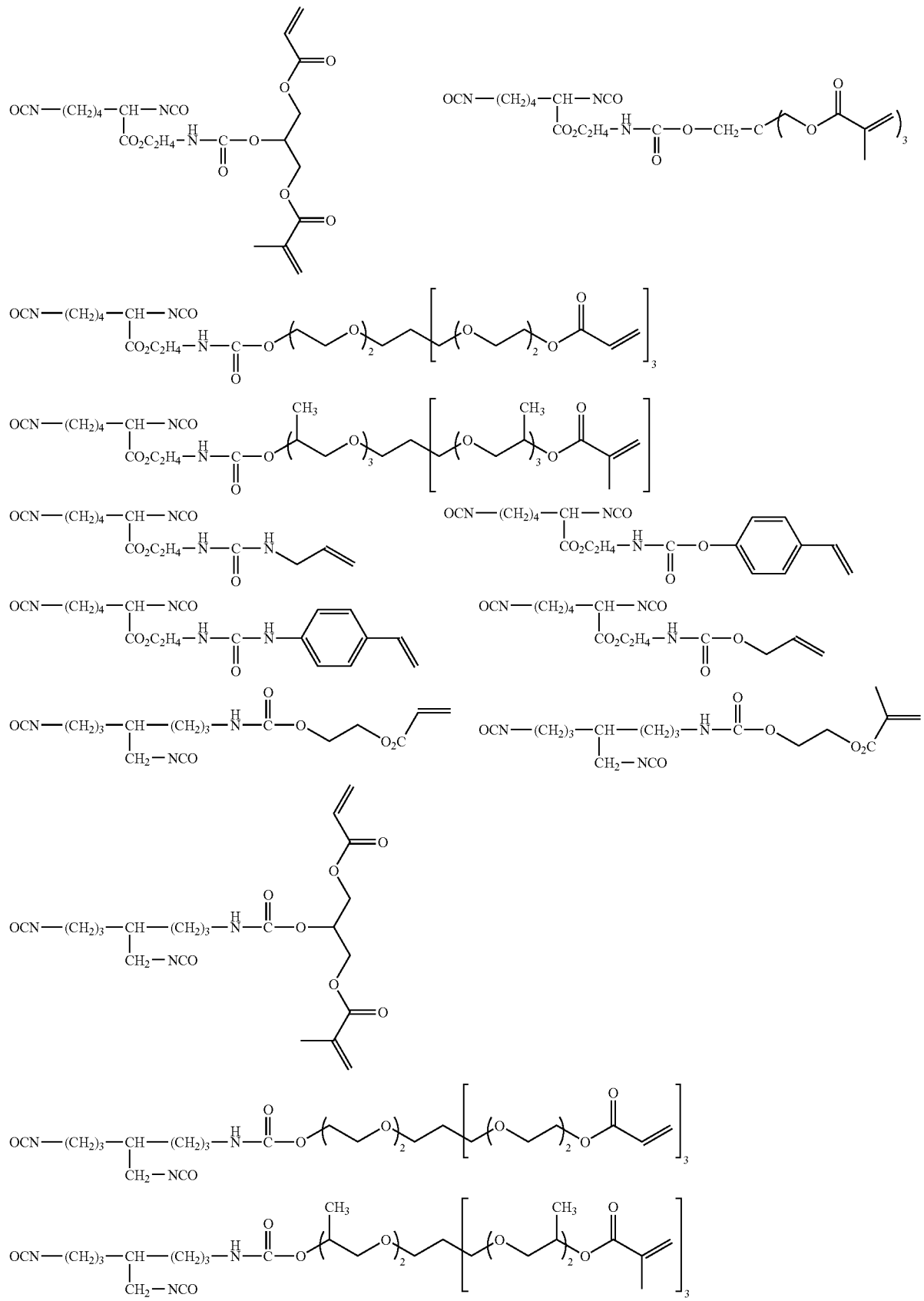

-continued
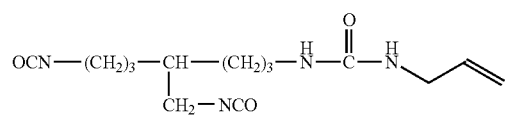
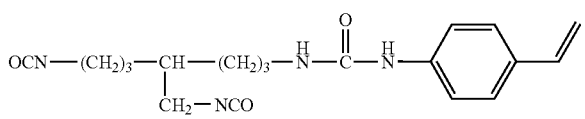
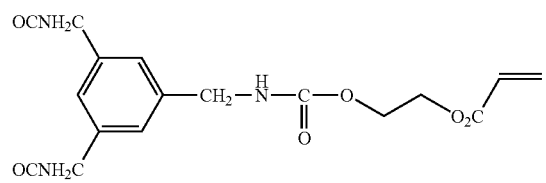
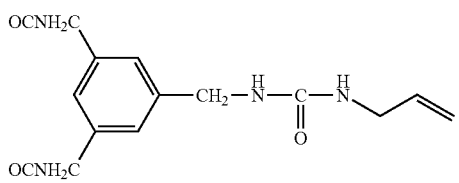
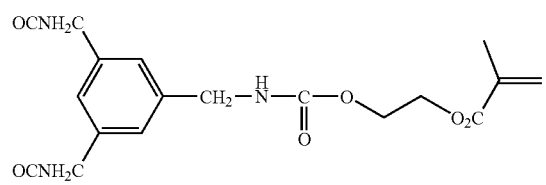
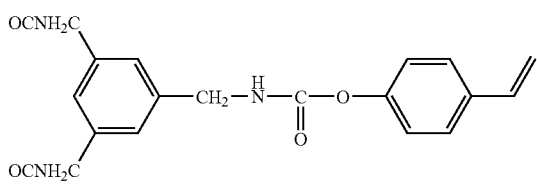
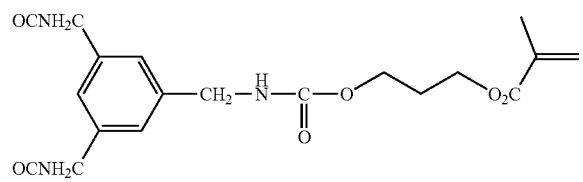
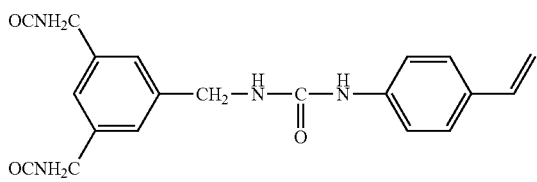
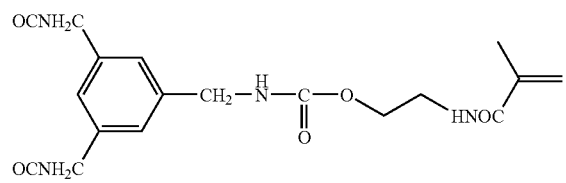
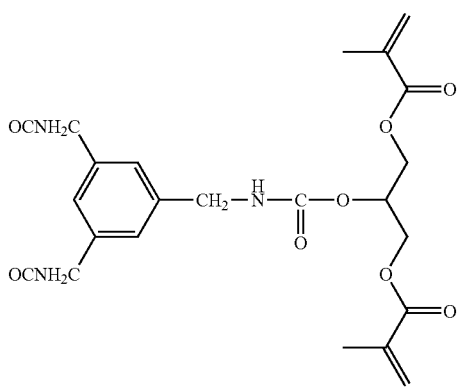
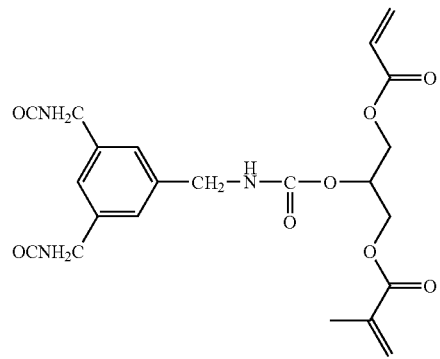
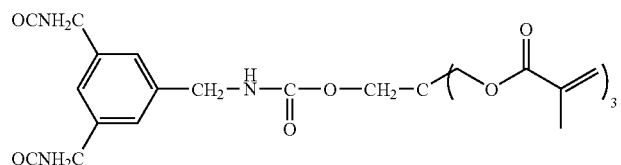
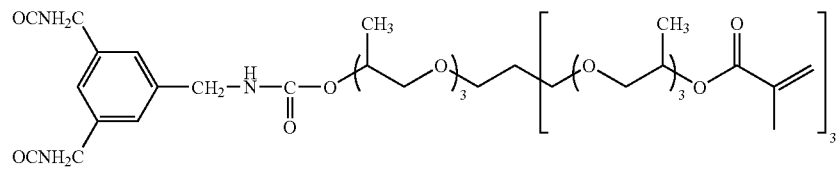

-continued

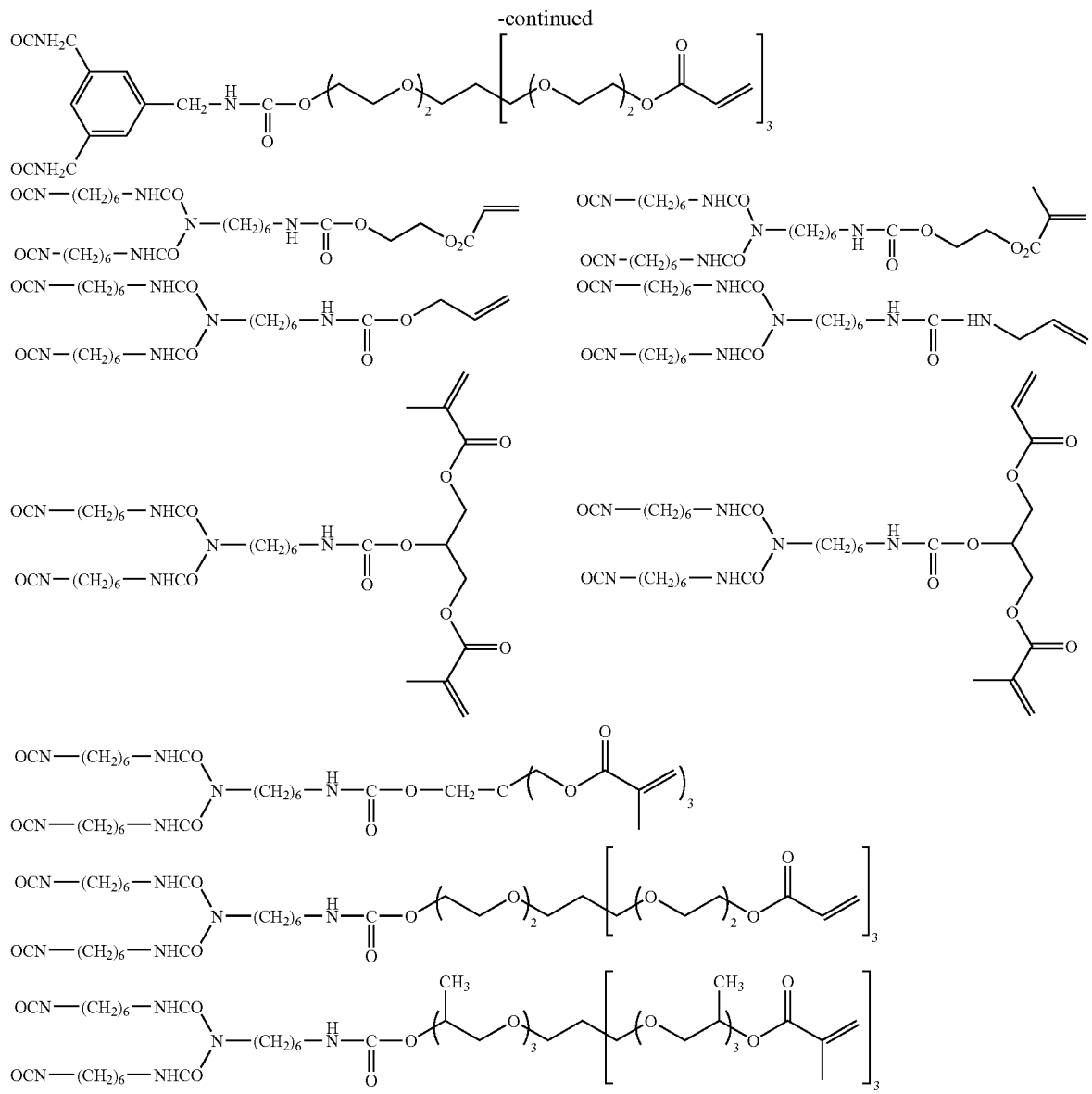

In the specific polyurethane resin for use in the present invention, a diisocyanate compound other than the above-described diisocyanate compound having an unsaturated group may be copolymerized from the standpoint of, for example, elevating the compatibility with other components in the polymerizable composition and enhancing the storage stability.

The diisocyanate compound which is copolymerized includes the followings and is preferably a diisocyanate compound represented by the following formula (6):

wherein $L^1$ represents a divalent aliphatic or aromatic hydrocarbon group which may have a divalent group. If desired, $L^1$ may contain another functional group which does not react with the isocyanate group, such as ester group, urethane group, amido group and ureido group.

Specific examples of the diisocyanate compound represented by formula (6) include the followings:

aromatic diisocyanate compounds such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate;

aliphatic diisocyanate compounds such as hexamethylene diisocyanate, trimethylhexamethylene diisocyanate, lysine diisocyanate and dimeric acid diisocyanate;

alicyclic diisocyanate compounds such as isophorone diisocyanate, 4,4'-methylenebis(cyclohexylisocyanate), methylcyclohexane-2,4(or 2,6)-diisocyanate and 1,3-(isocyanatomethyl)cyclohexane; and diisocyanate compounds which are a reaction product of a diol with a diisocyanate, such as an adduct of 1,3-butylene glycol (1 mol) and tolylene diisocyanate (2 mol).

2) Diol Compound

The diol compound represented by formula (5) widely includes polyether diol compounds, polyester diol compounds, polycarbonate diol compounds and the like.

As for the method of introducing an unsaturated group into the side chain of the polyurethane resin, in addition to the method described above, a method where a diol compound containing an unsaturated group on the side chain is used as a raw material in the production of the polyurethane is preferred. This diol compound may be, for example, a commercially available product such as trimethylolpropane monoallyl ether, or a compound easily produced by the reaction of a halogenated diol compound, triol compound or aminodiol compound with a carboxylic acid, acid chloride, isocyanate, alcohol, amine, thiol or halogenated alkyl compound having an unsaturated group. Specific examples of such a compound include, but are not limited to, the compounds set forth below.

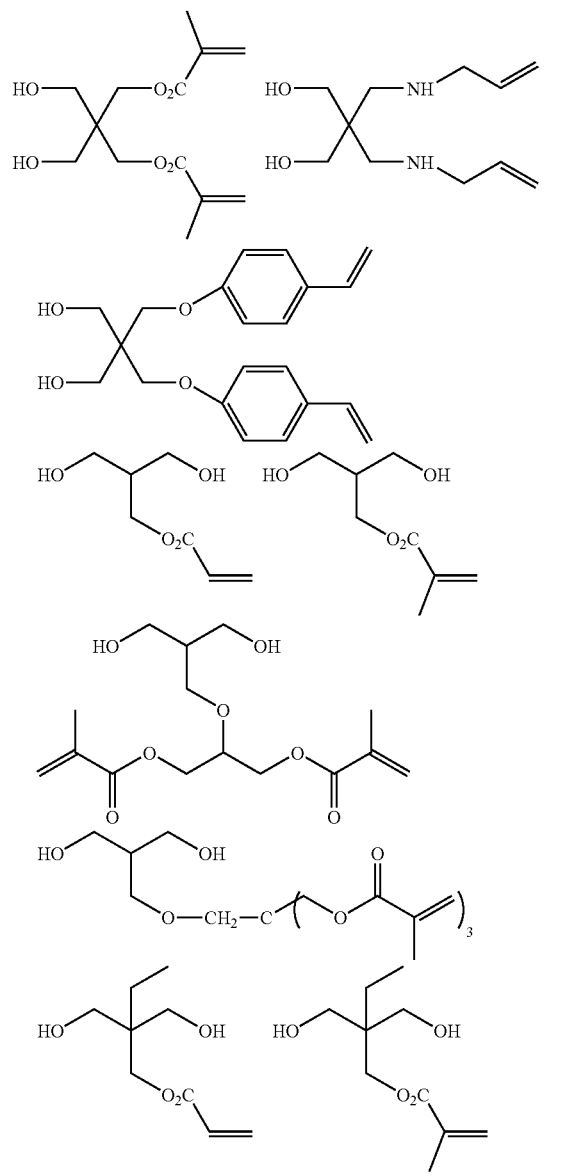

-continued

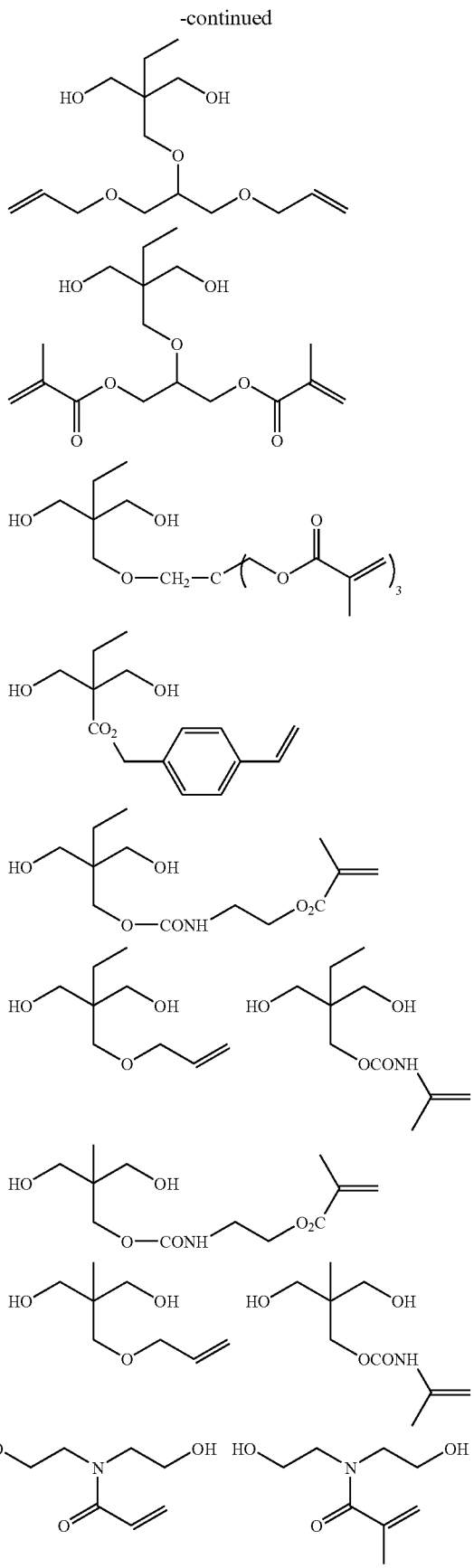

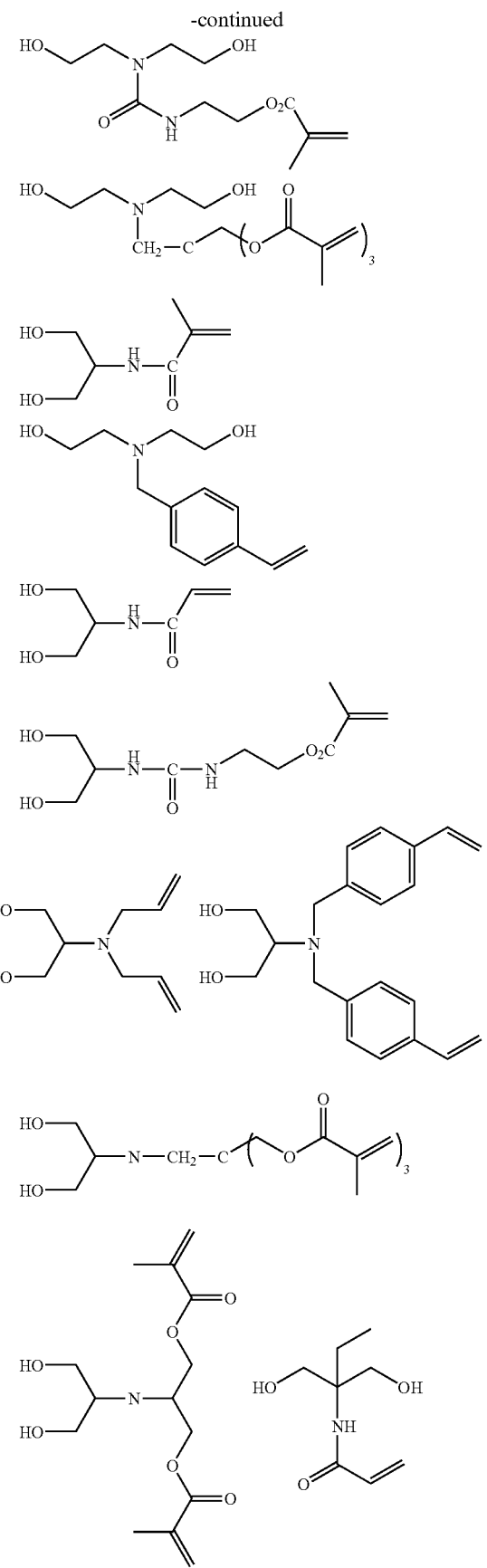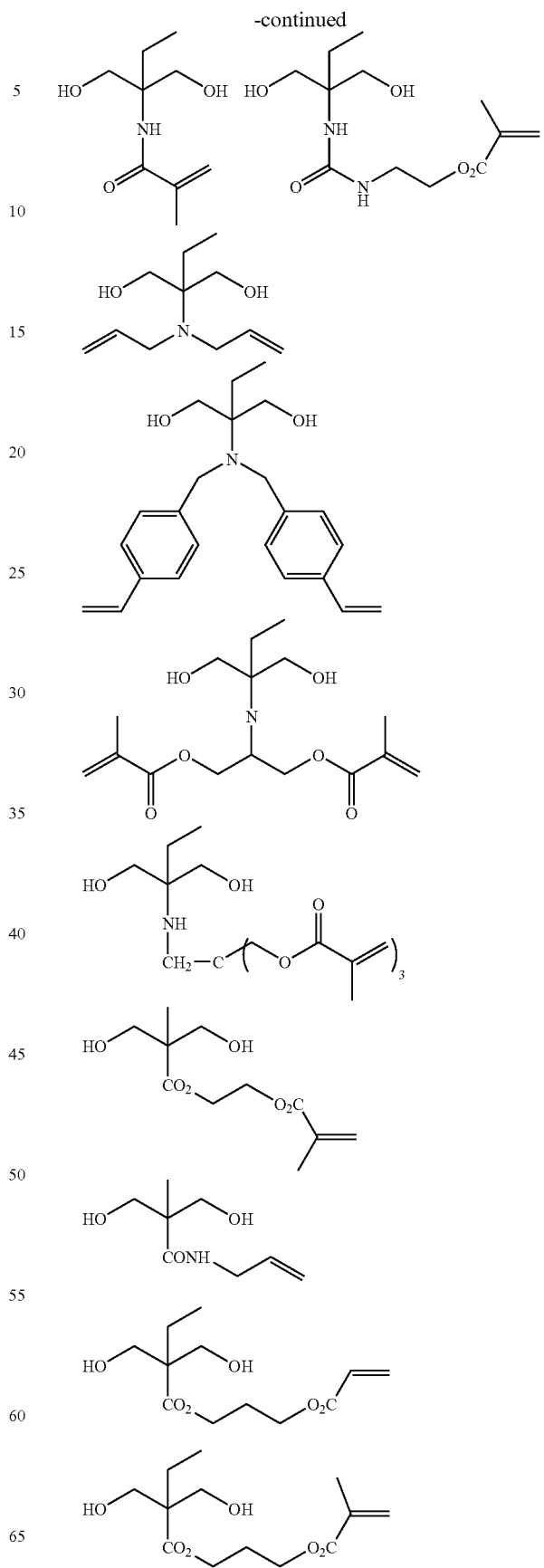

The binder resin preferred in the present invention includes a polyurethane resin obtained by using a diol compound represented by the following formula (G) as at least one diol compound having an ethylenically unsaturated bond group at the synthesis of polyurethane.

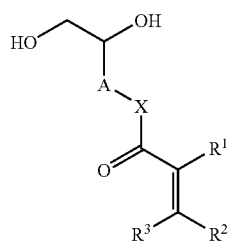

(G)

wherein $R^1$ to $R^3$ each independently represents a hydrogen atom or a monovalent organic group, A represents a divalent organic residue, X represents an oxygen atom, a sulfur atom or —N($R^{12}$)—, and $R^{12}$ represents a hydrogen atom or a monovalent organic group.

Incidentally, $R^1$ to $R^3$ and X in formula (G) have the same meanings as $R^1$ to $R^3$ and X in formula (1) and preferred embodiments thereof are also the same.

It is considered that by using a polyurethane resin derived from such a diol compound, an effect of preventing excessive molecular motion of the main polymer chain is obtained by virtue of the secondary alcohol having a larger steric hindrance and the film strength of the layer can be elevated.

Specific examples of the diol compound represented by formula (G), which is preferably used in the synthesis of the specific polyurethane resin, are set forth below.

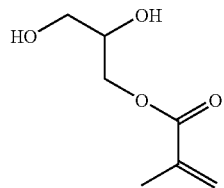

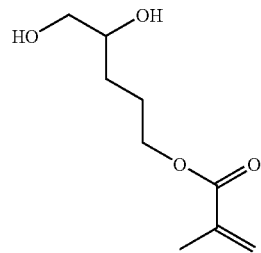

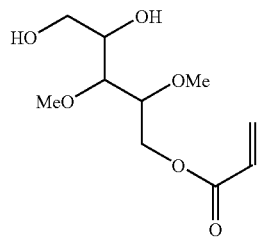

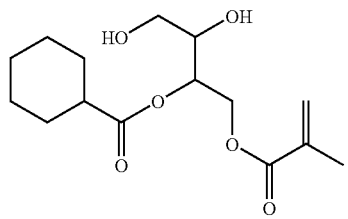

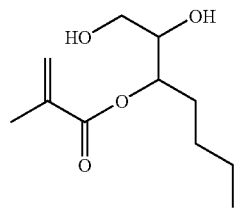

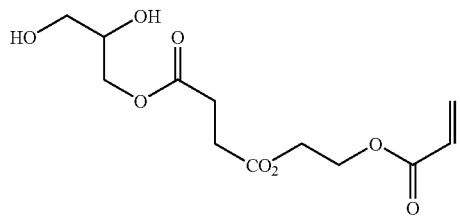

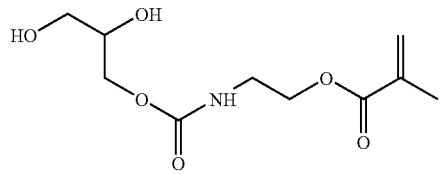

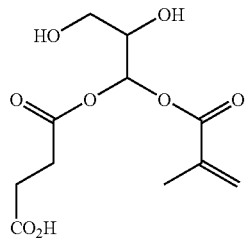

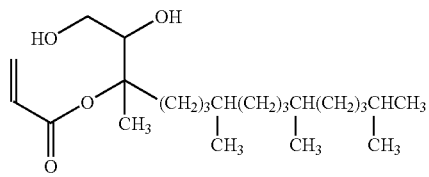

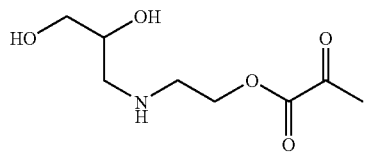

-continued
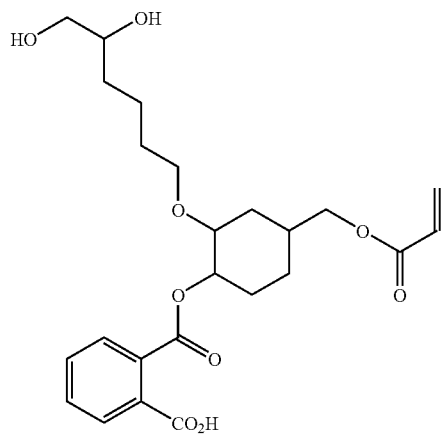
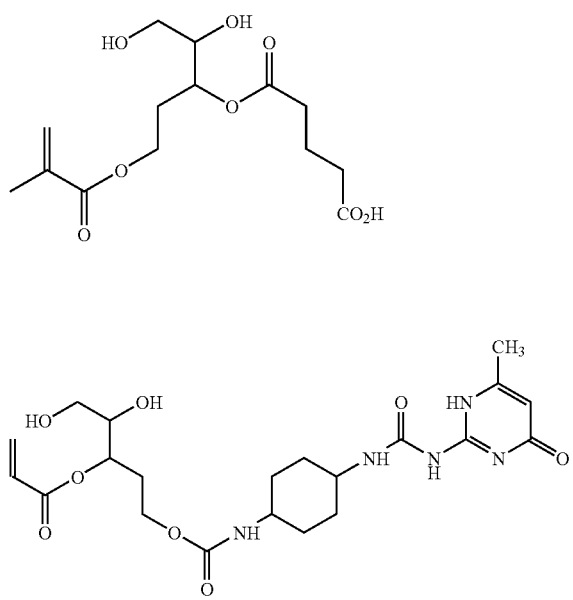
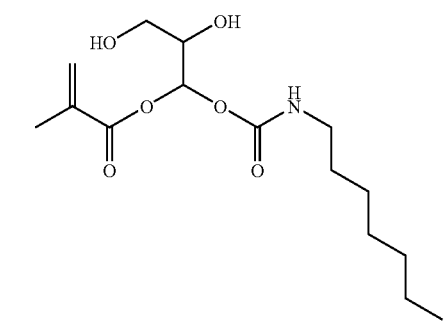
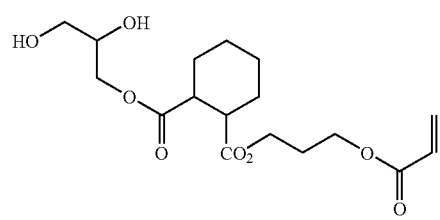
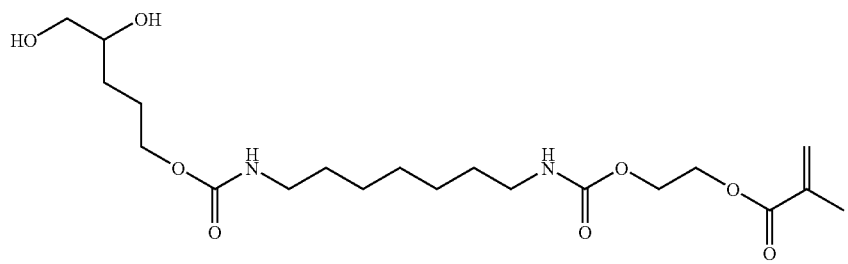
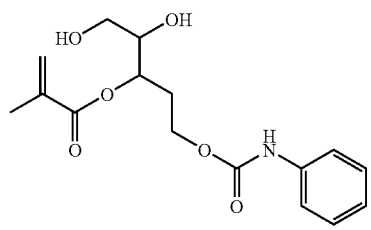

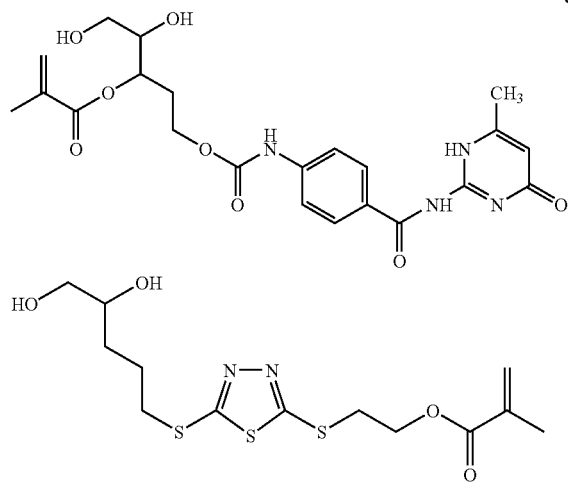
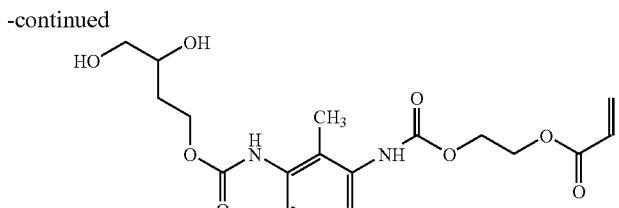
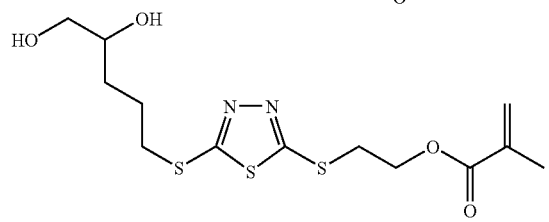

In the specific polyurethane resin for use in the present invention, a diol compound other than the above-described diol compound having an unsaturated group may be copolymerized from the standpoint of, for example, elevating the compatibility with other components in the polymerizable composition and enhancing the storage stability.

Examples of this diol compound include the above-described polyether diol compounds, polyester diol compounds and polycarbonate diol compounds.

The polyether diol compound includes compounds represented by the following formulae (7), (8), (9), (10) and (11), and hydroxyl-terminated ethylene oxide-propylene oxide random copolymers.

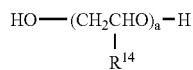   (7)

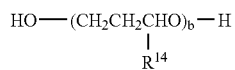   (8)

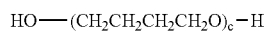   (9)

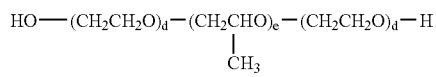   (10)

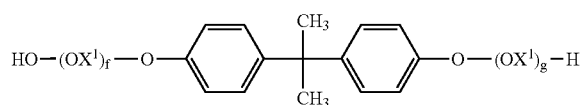   (11)

wherein $R^{14}$ represents a hydrogen atom or a methyl group, $X^1$ represents a group shown below, a, b, c, d, e, f and g each represents an integer of 2 or more, preferably an integer of 2 to 100:

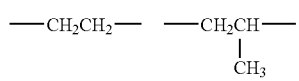

Specific examples of the polyether diol compounds represented by formulae (7) and (8) include the followings:

diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight average molecular weight of 1,000, polyethylene glycol having a weight average molecular weight of 1,500, polyethylene glycol having a weight average molecular weight of 2,000, polyethylene glycol having a weight average molecular weight of 3,000, polyethylene glycol having a weight average molecular weight of 7,500, polypropylene glycol having a weight average molecular weight of 400, polypropylene glycol having a weight average molecular weight of 700, polypropylene glycol having a weight average molecular weight of 1,000) polypropylene glycol having a weight average molecular weight of 2,000, polypropylene glycol having a weight average molecular weight of 3,000, and polypropylene glycol having a weight average molecular weight of 4,000.

Specific examples of the polyether diol compound represented by formula (9) include the followings:

PTMG650, PTMG1000, PTMG2000 and PTMG3000 (trade names) (all produced by Sanyo Chemical Industries, Ltd.).

Specific examples of the polyether diol compound represented by formula (10) include the followings:

Newpol PE-61, Newpol PE-62, Newpol PE-64, Newpol PE-68, Newpol PE-71, Newpol PE-74, Newpol PE-75, Newpol PE-78, Newpol PE-108, Newpol PE-128 and Newpol PE-61 (trade names) (all produced by Sanyo Chemical Ind., Ltd.).

Specific examples of the polyether diol compound represented by formula (11) include the followings:

Newpol BPE-20, Newpol BPE-20F, Newpol BPE-20NK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P and Newpol BPE-5P (trade names) (all produced by Sanyo Chemical Ind., Ltd.).

Specific examples of the hydroxyl-terminated ethylene oxide-propylene oxide random copolymer include the followings:

Newpol 50HB-100, Newpol 50HB-260, Newpol 50HB-400, Newpol 50HB-660, Newpol 50HB-2000 and Newpol 50HB-5100 (trade names) (all produced by Sanyo Chemical Ind., Ltd.).

The polyester diol compound includes compounds represented by formulae (12) and (13):

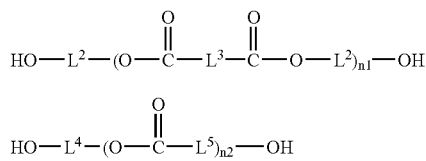

(12)

(13)

In formulae (12) and (13), $L^2$, $L^3$ and $L^4$, which may be the same or different, each represents a divalent aliphatic or aromatic hydrocarbon group, and $L^5$ represents a divalent aliphatic hydrocarbon group. $L^2$ to $L^4$ each preferably represents an alkylene group, an alkenylene group, an alkynylene group or an arylene group, and $L^5$ preferably represents an alkylene group. In $L^2$ to $L^5$, another functional group which does not react with the isocyanate group, such as ether group, carbonyl group, ester group, cyano group, olefin group, urethane group, amido group, ureido group and halogen atom, may be present. n1 and n2 each represents an integer of 2 or more, preferably an integer of 2 to 100.

The polycarbonate diol compound includes a compound represented by formula (14):

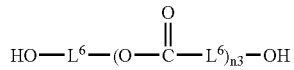

(14)

In formula (14), $L^6$'s, which may be the same or different, each represents a divalent aliphatic or aromatic hydrocarbon group. $L^6$ is preferably an alkylene group, an alkenylene group, an alkynylene group or an arylene group. In $L^6$, another functional group which does not react with the isocyanate group, such as ether group, carbonyl group, ester group, cyano group, olefin group, urethane group, amido group, ureido group and halogen atom, may be present. n3 represents an integer of 2 or more, preferably an integer of 2 to 100.

Specific examples of the diol compounds represented by formulae (12), (13) and (14) are set forth below (Compound Nos. 1 to 18). In these examples, n represents an integer of 2 or more.

(No. 1)

(No. 2)

(No. 3)

-continued (No. 4)

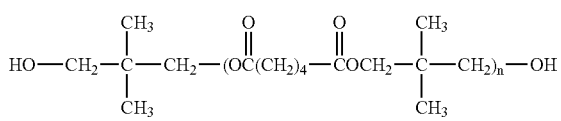

(No. 5)

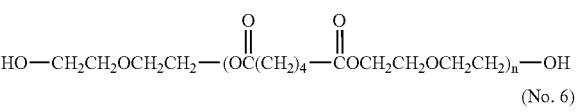

(No. 6)

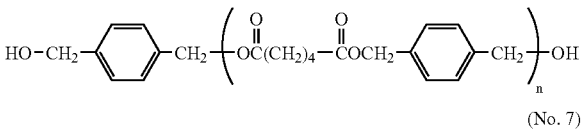

(No. 7)

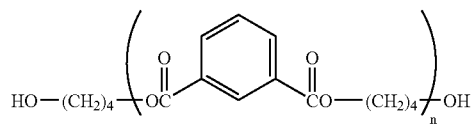

(No. 8)

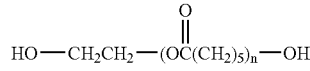

(No. 9)

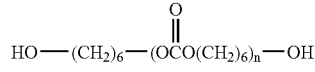

(No. 10)

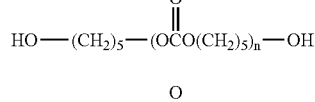

(No. 11)

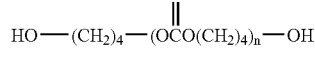

(No. 12)

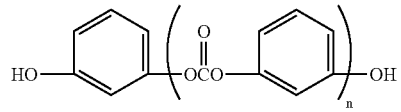

(No. 13)

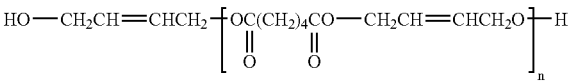

(No. 14)

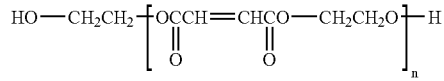

(No. 15)

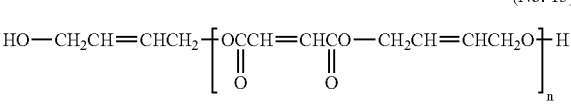

(No. 16)

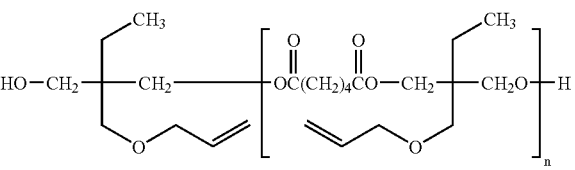

-continued

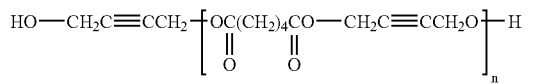
(No. 17)

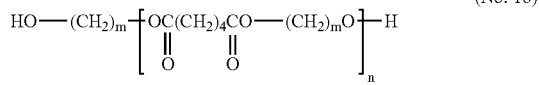
(No. 18)

m = 2, 4

Other than the above-described diol compounds, a diol compound having a substituent which does not react with the isocyanate group can be used in combination for the synthesis of the specific polyurethane. Examples of this diol compound include the followings:

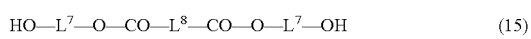  (15)

  (16)

wherein $L^7$ and $L^8$, which may be the same or different, each represents a divalent aliphatic or aromatic hydrocarbon group or a divalent heterocyclic group, which may have a substituent (examples of the substituent include an alkyl group, an aralkyl group, an aryl group, an alkoxy group, an aryloxy group and a halogen atom (e.g., —F, —Cl, —Br, —I)). In $L^7$ and $L^8$, another functional group which does not react with the isocyanate group, such as carbonyl group, ester group, urethane group, amido group and a ureido group, may be present, if desired. $L^7$ and $L^8$ may form a ring.

In addition to these diol compounds, a diol compound having a carboxyl group may also be used in combination for the synthesis of the specific resin.

Examples of this diol compound include compounds represented by the following formulae (17) to (19).

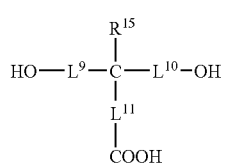  (17)

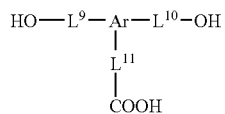  (18)

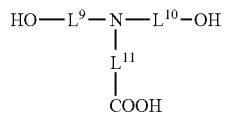  (19)

In formulae (17) to (19), $R^{15}$ represents a hydrogen atom or an alkyl, aralkyl, aryl, alkoxy or aryloxy group which may have a substituent (examples of the substituent include a cyano group, a nitro group, a halogen atom (e.g., —F, —Cl, —Br, —I), —CONH$_2$, —COOR$^{16}$, —OR$^{16}$, —NHCONHR$^{16}$, —NHCOOR$^{16}$, —NHCOR$^{16}$, —OCONHR$^{16}$ (wherein $R^{16}$ represents an alkyl group having from 1 to 10 carbon atoms or an aralkyl group having from 7 to 15 carbon atoms), preferably a hydrogen atom, an alkyl group having from 1 to 8 carbon atoms or an aryl group having from 6 to 15 carbon atoms. $L^9$, $L^{10}$ and $L^{11}$, which may be the same or different, each represents a single bond or a divalent aliphatic or aromatic hydrocarbon group which may have a substituent (preferred examples of the substituent include an alkyl group, an aralkyl group, an aryl group, an alkoxy group and a halogeno group), preferably an alkylene group having from 1 to 20 carbon atoms or an arylene group having from 6 to 15 carbon atoms, more preferably an alkylene group having from 1 to 8 carbon atoms. If desired, $L^9$ to $L^{11}$ each may contain another functional group which does not react with the isocyanate group, such as carbonyl group, ester group, urethane group, amido group, ureido group and ether group. Two or three of $R^{15}$, $L^7$, $L^8$, and $L^9$ may form a ring.

Ar represents a trivalent aromatic hydrocarbon group which may have a substituent, preferably an aromatic group having from 6 to 15 carbon atoms.

Specific examples of the carboxyl group-containing diol compounds represented by formulae (17) to (19) include the followings:

3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine and N,N-bis(2-hydroxyethyl)-3-carboxy-propionamide.

By virtue of the presence of a carboxyl group, properties such as hydrogen bonding property and alkali solubility can be imparted to the polyurethane resin and this is preferred. More specifically, the polyurethane resin having an ethylenically unsaturated bond group on the side chain is a resin further having a carboxyl group on the side chain. Still more specifically, a polyurethane resin having 0.3 meq/g or more of an ethylenically unsaturated bond group on the side chain and at the same time, having 0.4 meq/g or more of a carboxyl group on the side chain is preferably used as the binder polymer of the present invention.

Other than these diols, a compound obtained by ring-opening a tetracarboxylic acid dianhydride represented by any one of the following formulae (20) to (22) with a diol compound may be used in combination for the synthesis of the specific polyurethane resin.

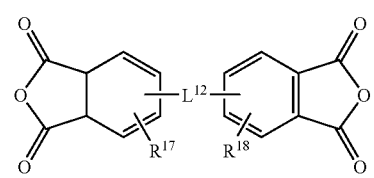  (20)

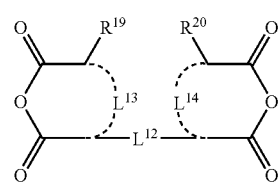  (21)

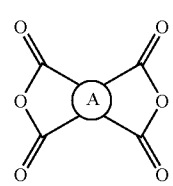  (22)

In formulae (20) to (22), $L^{12}$ represents a single bond, a divalent aliphatic or aromatic hydrocarbon group which may have a substituent (preferred examples of the substituent include an alkyl group, an aralkyl group, an aryl group, an alkoxy group, a halogeno group, an ester group and an amido group), —CO—, —SO—, —SO$_2$—, —O— or —S—, preferably a single bond, a divalent aliphatic hydrocarbon group having from 1 to 15 carbon atoms, —CO—, —SO$_2$—, —O— or —S—. $R^{17}$ and $R^{18}$, which may be the same or different, each represents a hydrogen atom, an alkyl group, an aralkyl group, an aryl group, an alkoxy group or a halogeno group, preferably a hydrogen atom, an alkyl group having from 1 to 8 carbon atoms, an aryl group having from 6 to 15 carbon atoms, an alkoxy group having from 1 to 8 carbon atoms or a halogeno group. Two of $L^{12}$, $R^{17}$ and $R^{18}$ may combine to form a ling.

$R^{19}$ and $R^{20}$, which may be the same or different, each represents a hydrogen atom, an alkyl group, an aralkyl group, an aryl group or a halogeno group, preferably a hydrogen atom, an alkyl group having from 1 to 8 carbon atoms or an aryl group having from 6 to 15 carbon atoms. Two of $L^{12}$, $R^{19}$ and $R^{20}$ may combine to form a ring. $L^{13}$ and $L^{14}$, which may be the same or different, each represents a single bond, a double bond or a divalent aliphatic hydrocarbon group, preferably a single bond, a double bond or a methylene group. A represents a mononuclear or polynuclear aromatic ring, preferably an aromatic ring having from 6 to 18 carbon atoms.

Specific examples of the compounds represented by formulae (20), (21) and (22) include the followings:

aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)bis(iminocarbonyl)] diphthalic dianhydride, an adduct of hydroquinone diacetate and trimellitic anhydride, and an adduct of diacetyldiamine and trimellitic anhydride; alicyclic tetracarboxylic dianhydrides such as 5-(2,5-dioxotetrahydrofuryl)-3-methyl-3-cyclohexene-1,2-dicarboxylic anhydride (Epiclon B-4400, produced by Dainippon Ink & Chemicals, Ind.), 1,2,3,4-cyclopentanetetracarboxylic dianhydride, 1,2,4,5-cyclohexanetetracarboxylic dianhydride and tetrahydrofurantetracarboxylic dianhydride; and aliphatic tetracarboxylic dianhydrides such as 1,2,3,4-butanetetracarboxylic dianhydride and 1,2,4,5-pentanetetracarboxylic dianhydride.

Examples of the method for introducing a compound ring-opened with such a tetracarboxylic dianhydride into the polyurethane resin include the following methods:

(a) a method of reacting a diisocyanate compound with an alcohol-terminated compound obtained by ring-opening the tetracarboxylic dianhydride by a diol compound, and (b) a method of reacting the tetracarboxylic dianhydride with an alcohol-terminated urethane compound obtained by reacting a diisocyanate compound and a diol compound under diol compound-excess conditions.

Specific examples of the diol compound used for the ring-opening reaction include the followings:

ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinonedihydroxyethyl ether, p-xylylene glycol, dihydroxyethylsulfone, bis(2-hydroxyethyl)-2,4-tolylene dicarbamate, 2,4-tolylenebis(2-hydroxyethylcarbamide), bis(2-hydroxyethyl)-m-xylylene dicarbamate and bis(2-hydroxyethyl)isophthalate.

The specific polyurethane resin for use in the present invention is synthesized by adding the above-described diisocyanate compounds and diol compounds and a known catalyst having an activity according to the reactivity of respective compounds in an aprotic solvent and heating the solution. The molar ratio ($M_a$:$M_b$) between diisocyanate compounds and diol compounds used for the synthesis is preferably from 1:1 to 1.2:1. The reaction product may be treated with alcohols or amines, whereby a polyurethane resin having desired physical properties such as molecular weight and viscosity and allowing for no remaining of an isocyanate group can be finally synthesized.

As for the amount of the ethylenically unsaturated bond introduced into the specific polyurethane resin for use in the present invention, the ethylenically unsaturated bond group is preferably contained in the side chain in an amount of, in terms of equivalent, 0.3 meq/g or more, more preferably from 0.35 to 1.50 meq/g. Particularly, the binder polymer of the present invention is preferably a polyurethane resin containing, together with the ethylenically unsaturated bond group, 0.4 meq/g or more, more preferably from 0.45 to 1.00 meq/g, of a carboxyl group in the side chain.

The molecular weight of the specific polyurethane resin for use in the present invention is, in terms of the weight average molecular weight, preferably 10,000 or more, more preferably from 40,000 to 200,000. Particularly, in the case of using the polymerizable composition of the present invention for the recording layer of a lithographic printing plate precursor, when the average molecular weight is in the above-described range, excellent strength of the image area and excellent developability of the non-image area with an alkaline developer can be obtained.

As for the specific polyurethane resin for use in the present invention, those having an unsaturated group at the polymer terminal and on the main chain are also preferably used. By having an unsaturated group at the polymer terminal and on the main chain, the crosslinking reactivity between the polymerizable compound and the specific polyurethane resin or between specific polyurethane resins is increased to enhance the strength of the photocured product. As a result, when the specific polyurethane resin is used for a lithographic printing plate, a printing plate having excellent impression capacity can be obtained. Here, the unsaturated group preferably contains a carbon-carbon double bond because the crosslinking reaction can readily occur.

The method of introducing an unsaturated group into the polymer terminal includes the following method. That is, the unsaturated group may be introduced by using alcohols or amines having an unsaturated group at the time when the isocyanate group remaining at the polymer terminal in the synthesis of the polyurethane resin is treated with alcohols or amines. Examples of the alcohols or amines having an unsaturated group include the same compounds as described above for the monofunctional alcohol or monofunctional amine compound having an unsaturated group.

The unsaturated group is preferably introduced into the polymer side chain than into the polymer terminal, because the amount of the unsaturated group introduced can be easily controlled and can be increased and also, the crosslinking reaction efficiency is enhanced.

In view of formability of a crosslinked and cured film, the ethylenically unsaturated bond group introduced is preferably a methacryloyl group, an acryloyl group or a styryl group, more preferably a methacryloyl group or an acryloyl group. Also, from the standpoint of satisfying both the formability of a crosslinked and cured film and the stock storability, the ethylenically unsaturated bond group is still more preferably a methacryloyl group.

As described above, the amount of the methacryloyl group introduced is preferably 0.30 meq/g or more, more preferably from 0.35 to 1.50 meq/g. That is, a most preferred embodiment of the binder polymer for use in the present invention is a polyurethane resin where a methacryloyl group is introduced into the side chain in the range from 0.35 to 1.50 meq/g.

The method of introducing an unsaturated group into the main chain includes a method of using a diol compound having an unsaturated group in the main chain direction for the synthesis of the polyurethane resin. Specific examples of the diol compound having an unsaturated group in the main chain direction include the following compounds:

cis-2-butene-1,4-diol, trans-2-butene-1,4-diol and polybutadiene diol.

In combination with the specific polyurethane resin according to the present invention, an alkali-soluble polymer containing a polyurethane resin differing in the structure from the specific polyurethane resin may also be used. For example, the specific polyurethane resin can be used in combination with a polyurethane resin having an aromatic group on the main chain and/or side chain.

The specific styrene-based resin which is another preferred embodiment of the present invention is described in detail below.

(Styrene-Based Resin Having Ethylenically Unsaturated Bond on Side Chain)

The specific styrene-based resin for use in the present invention includes those having on the side chain thereof at least either one of a styrenic double bond (styrene or α-methylstyrene-based double bond) represented by the following formula (23) and a vinylpyridinium group represented by the following formula (24).

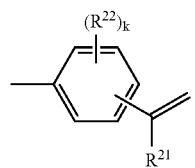

(23)

wherein $R^{21}$ represents a hydrogen atom or a methyl group, $R^{22}$ represents an arbitrary atom or atomic group which can be substituted, and k represents an integer of 0 to 4.

The styrenic double bond represented by formula (23) is linked with the polymer main chain through a single bond or a linking group comprising an arbitrary atom or atomic group, and the manner of bonding is not particularly limited.

Preferred examples of the repeating unit of the polymer compound having the functional group represented by formula (23) are set forth below, but the present invention is not limited thereto.

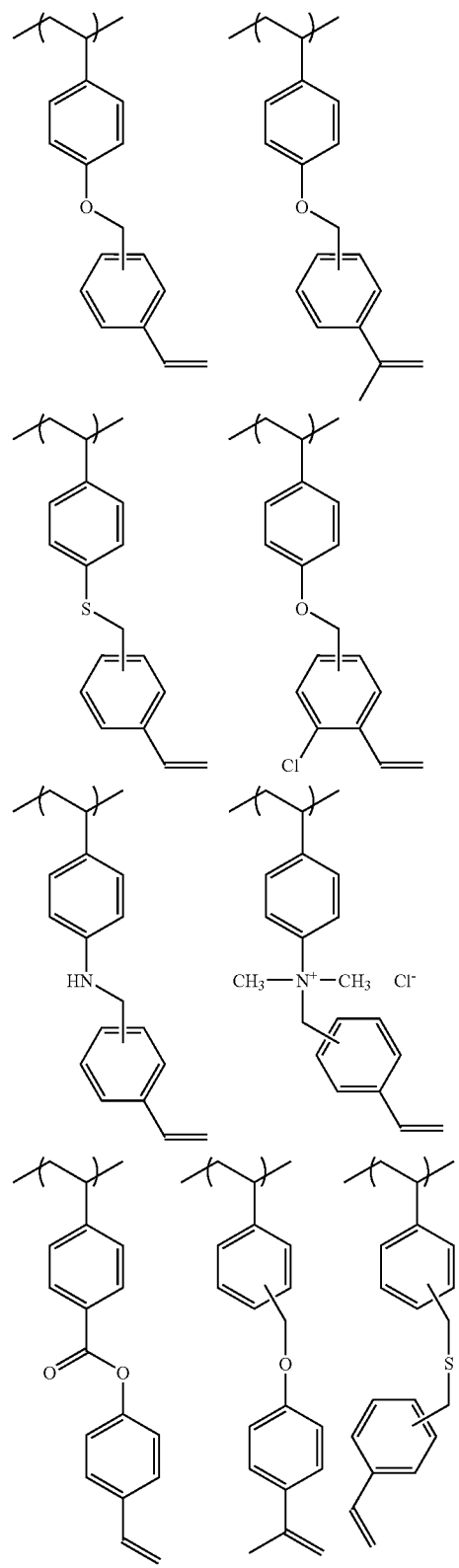

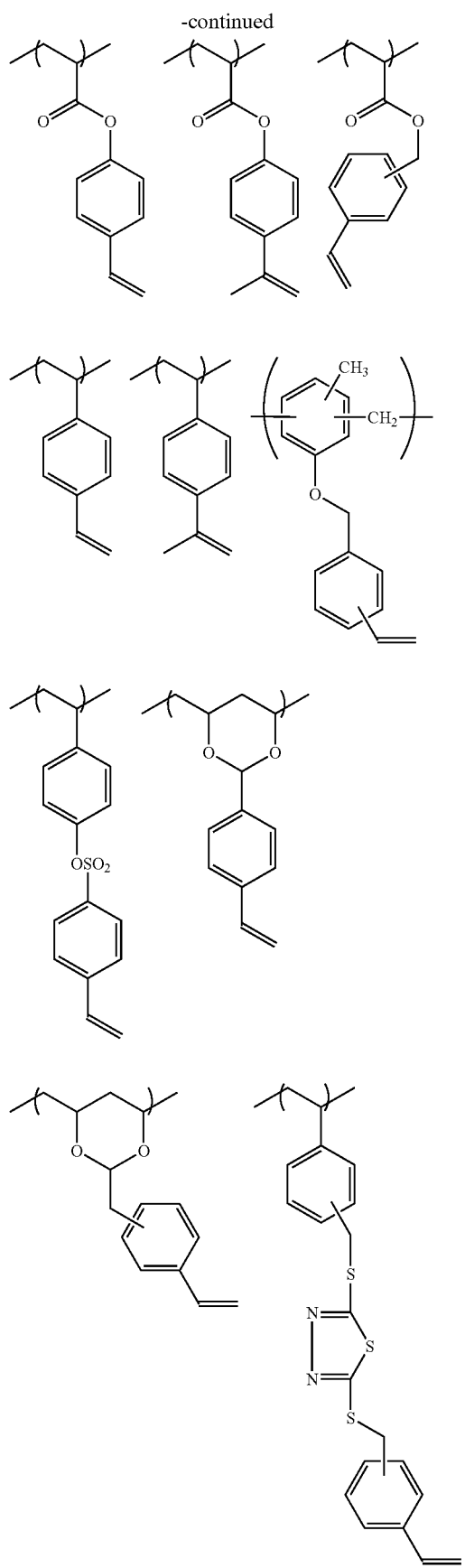
(24)
wherein $R^{23}$ represents a hydrogen atom or a methyl group, $R^{24}$ represents an arbitrary atom or atomic group which can be substituted, m represents an integer of 0 to 4, and $A^-$ represents an anion. The pyridinium ring may take the form of benzopyridinium where a benzene ring is condensed as a substituent. In this case, a quinolium group and an isoquinolium group are included.

The vinylpyridinium group represented by formula (24) is linked with the polymer main chain through a single bond or a linking group comprising an arbitrary atom or atomic group, and the manner of bonding is not particularly limited.

Preferred examples of the repeating unit of the polymer compound having the functional group represented by formula (24) are set forth below, but the present invention is not limited thereto.

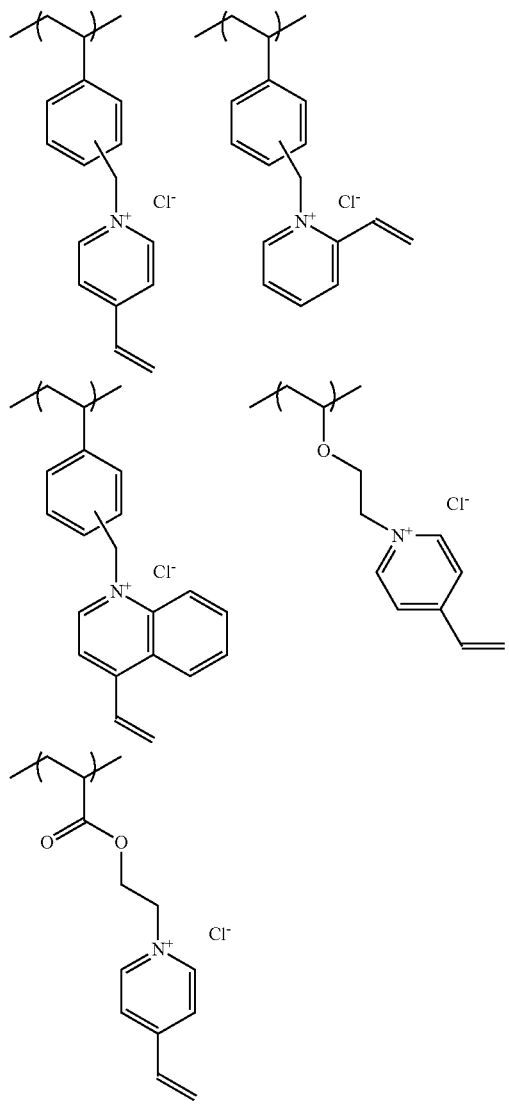

One of the methods for synthesizing the specific styrene-based resin for use in the present invention is a method of copolymerizing monomers having a functional group represented by formula (23) or (24) and at the same time, having a functional group copolymerizable with other copolymerization components, by using a known copolymerization method. The specific styrene-based resin may be a homopolymer having only one kind of a functional group belonging to either one of the functional groups represented by formulae (23) and (24), or a copolymer having two or more kinds of functional groups belonging to either one or both of these functional groups.

The specific styrene-based resin may also be a copolymer with another copolymerization monomer containing no functional group. In this case, a carboxy group-containing monomer is preferably selected as the another copolymerization monomer for the purpose of, for example, imparting solubility in an aqueous alkali solution to the polymer. Examples thereof include an acrylic acid, a methacrylic acid, 2-carboxyethyl acrylate, 2-carboxyethyl methacrylate, crotonic acid, maleic acid, fumaric acid, monoalkyl maleate, monoalkyl fumarate and 4-carboxystyrene.

A (multi-component) copolymer may also be synthesized by introducing another monomer component into the copolymer and such a copolymer is preferably used. As for the monomer which can be integrated into the copolymer here, various monomers such as styrene derivatives (e.g., styrene, 4-methylstyrene, 4-hydroxystyrene, 4-acetoxystyrene, 4-carboxystyrene, 4-aminostyrene, chloromethylstyrene, 4-methoxystyrene), vinylphosphonic acid, vinylsulfonic acid and a salt thereof, styrenesulfonic acid and a salt thereof, 4-vinylpyridine, 2-vinylpyridine, N-vinylimidazole, N-vinylcarbazole, 4-vinylbenzyltrimethylammonium chloride, a quaternized product of N-vinylimidazole by methyl chloride, 4-vinylbenzylpyridinium chloride, acrylonitrile, methacrylonitrile, phenylmaleimide, hydroxyphenylmaleimide, vinyl esters (e.g., vinyl acetate, vinyl chloroacetate, vinyl propionate, vinyl butyrate, vinyl stearate, vinyl benzoate), vinyl ethers (e.g., methyl vinyl ether, butyl vinyl ether), N-vinylpyrrolidone, acryloylmorpholine, vinyl chloride, vinylidene chloride, allyl alcohol and vinyltrimethoxysilane, are appropriately used as the copolymerization monomer.

In the case of using such a copolymer as the specific styrene-based resin according to the present invention, the ratio of the repeating unit having a functional group represented by formula (23) and/or formula (24) occupying in the entire copolymer composition is preferably 20 mass % (weight %) or more, more preferably 40 mass % or more. Within this range, the effect of the present invention is successfully brought out and a high-sensitive crosslinked system is obtained.

The specific styrene-based resin according to the present invention sometimes changes its property and becomes water-soluble when containing a quaternary salt structure in the repeating unit thereof. In the case where the polymerizable composition of the present invention containing such a resin is used as the recording layer of a lithographic printing plate precursor, the recording layer can also be developed with water after exposure.

Particularly, when having the functional group represented by formula (23) in the repeating unit and at the same time, having a quaternary salt structure in the linking group connecting the main chain and the functional group represented by formula (23) (for example, Compounds P-6, P-23 and P-24 above), the specific styrene-based resin may be a homopolymer having such a structure, but in other cases, the specific styrene-based resin is preferably a copolymer with another copolymerization monomer described below. For example, 4-vinylbenzyltrimethylammonium chloride, acryloyloxyethyltrimethylammonium chloride, methacryloyloxyethyltrimethylammonium chloride, a quaternized product of dimethylaminopropylacrylamide by methyl chloride, a quaternized product of N-vinylimidazole by methyl chloride, and 4-vinylbenzylpyridinium chloride are preferably used.

In the case of containing the functional group represented by formula (24) in the repeating unit, the specified styrene-based resin may be a homopolymer or a copolymer with the above-described another copolymerization monomer.

Also, in the case of a copolymer, when a carboxyl group is introduced, the recording layer can also be developed with an aqueous alkali solution. In any case, the ratio of the repeating unit having the functional group represented by formula (23) and/or formula (24) is preferably 20 mass %, and the introduction of a repeating unit other than these can be freely selected according to the purpose.

The molecular weight of the specific styrene-based resin for use in the present invention is, in terms of the weight average molecular weight, preferably from 10,000 to 300,000, more preferably from 15,000 to 200,000, and most preferably from 20,000 to 150,000. Particularly, in the case of using the polymerizable composition of the present invention for the recording layer of a lithographic printing plate precursor, when the average molecular weight is in the above-described range, excellent strength of the image area and excellent developability of the non-image area with an alkaline developer can be obtained.

The specific binder polymer (A) other than these specific polyurethane resin and specific styrene-based resin is described below.

Examples of the novolak resin having an ethylenically unsaturated group on the side chain include resins where an ethylenically unsaturated bond is introduced into the polymer described in JP-A-9-269596 by using the method described in JP-A-2002-62648.

Examples of the acetal resin having an ethylenically unsaturated group on the side chain include resins described in JP-A-2002-162741.

Examples of the polyamide-based resin having an ethylenically unsaturated group on the side chain include resins where an ethylenically unsaturated bond is introduced into the side chain of the resin described in Japanese Patent Application No. 2003-321022 or the polyamide resin cited therein by using the method described in JP-A-2002-62648.

Examples of the polyimide resin having an ethylenically unsaturated group on the side chain include resins where an ethylenically unsaturated bond is introduced into the side chain of the resin described in Japanese Patent Application No. 2003-339785 or the polyimide resin cited therein by using the method described in JP-A-2002-62648.

In the polymerizable composition of the present invention, the above-described binder polymers can be used individually or in appropriate combination of two or more thereof within the range of not impairing the effect of the present invention. Another alkali-soluble polymer may also be used in combination, if desired, and the amount of the polymer used in combination is preferably from 10 to 80 mass %, more preferably from 20 to 50 mass %, based on the entire polymer compound including specific binder polymers and the another alkali-soluble polymer. Here, the another alkali-soluble polymer used in combination is a non-(meth)acrylic polymer.

The content of the specific binder polymer in the polymerizable composition of the present invention is, in terms of the solid content, preferably from 10 to 90 mass %, more preferably from 20 to 80 mass %, and most preferably from 30 to 70 mass %, from the standpoint of compatibility with the radical initiator or the compound having an ethylenically unsaturated bond,

[(B) Neutrally Charged Compound Capable of Generating Radical Under Light or Heat]

The neutrally charged compound capable of generating a radical under light or heat (hereinafter sometimes referred to as a "specific radical initiator") indicates a compound capable of generating a radical under the action of light, heat or these both energies upon exposure to initiate or accelerate the polymerization of (C) a compound having an ethylenically unsaturated bond which is described later.

The specific radical initiator for use in the present invention is not particularly limited as long as it is neutrally charged and does not form a positive-negative ion pair between molecules or within the molecule, and a known photopolymerization or thermopolymerization initiator or the like may be selected and used. In particular, preferred examples of the specific radical initiator include (a) aromatic ketones, (b) organic peroxides, (c) thio compounds, (d) hexaarylbiimidazole compounds, (e) ketooxime ester compounds, (f) metallocene compounds, (g) active ester compounds, (h) compounds having a carbon-halogen bond and (i) azo-type compound. Among these, more preferred are compounds having a maximum absorption wavelength of 400 nm or less, still more preferably 360 nm or less. By having such an absorption wavelength in the ultraviolet region, the lithographic printing plate precursor can be handled under white light. Specific examples of (a) to (j) are described below, but the present invention is not limited thereto.

(a) Aromatic Ketones

Examples of (a) the aromatic ketones preferred as the specific radical initiator for use in the present invention include compounds having a benzophenone skeleton or a thioxanthone skeleton described in J. P. Fouassier and J. F. Rabek, *Radiation Curing in Polymer Science and Technology*, pp. 77-117 (1993). Specific examples thereof include the following compounds.

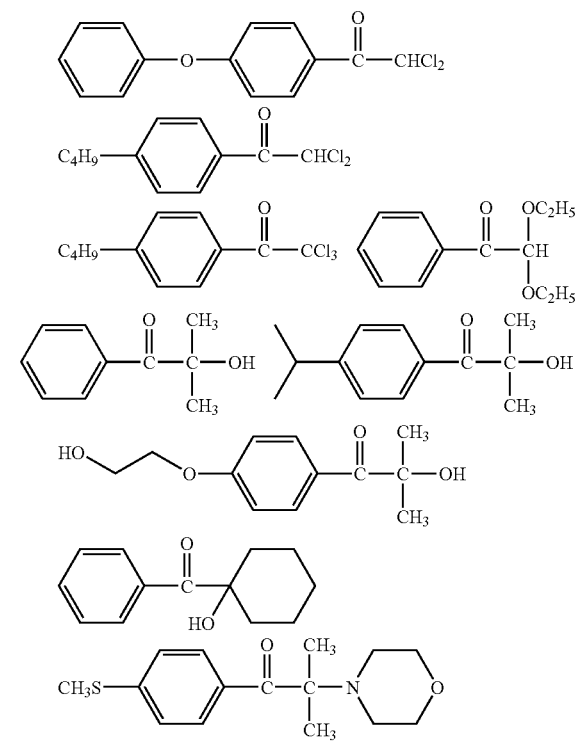

-continued

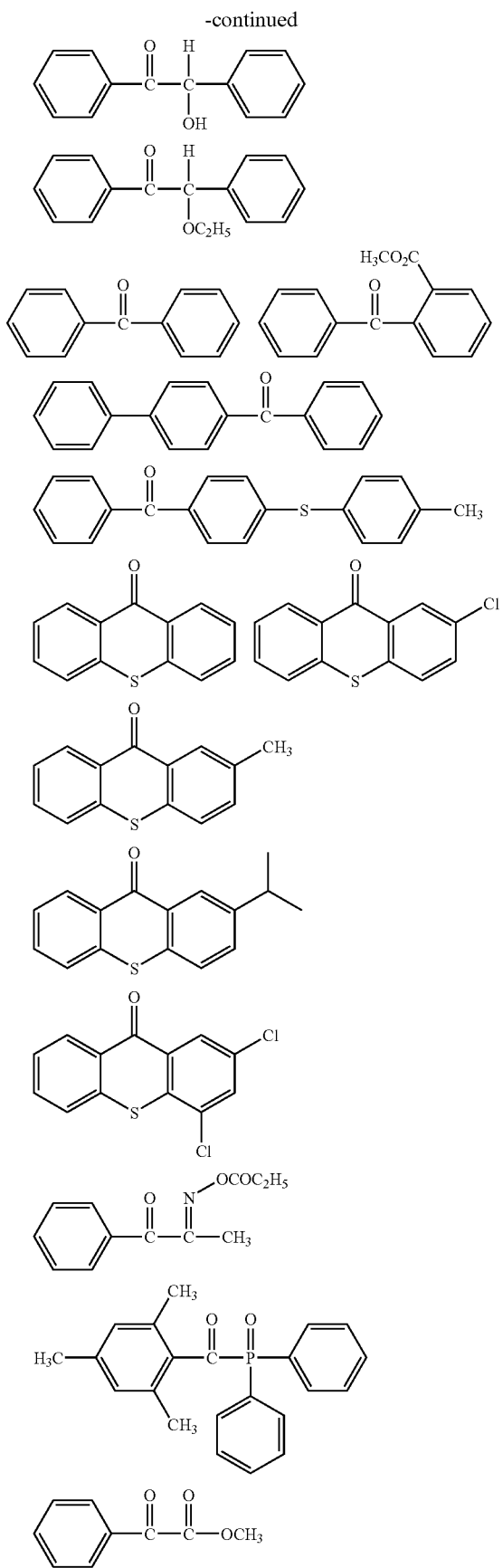
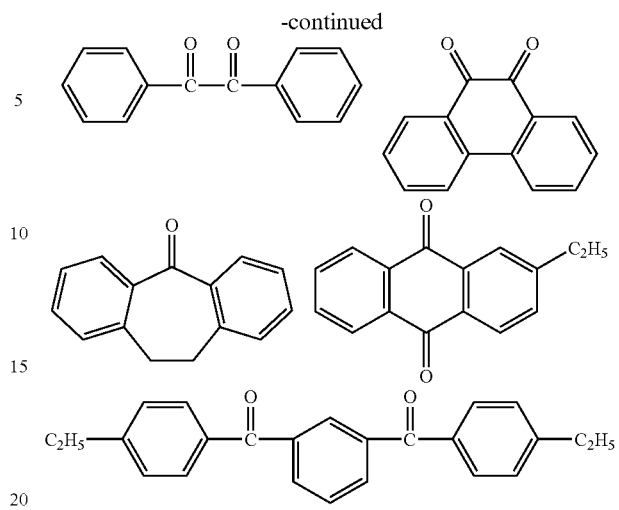

(b) Organic Peroxides

The organic peroxides (b) preferred as the specific radical initiator for use in the present invention include almost all organic compounds having one or more oxygen-oxygen bond within the molecule and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butyl-peroxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-oxanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertiary carbonate, 3,3',4,4'-tetra-(tert-butylperoxycarbonyl)benzophenone, 3,3',4,4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone, carbonyldi(tert-butylperoxy dihydrogen diphthalate) and carbonyldi(tert-hexylperoxy dihydrogen diphthalate).

Among these, preferred are ester peroxides such as 3,3',4,4'-tetra-(tert-butylperoxycarbonyl)benzophenone, 3,3',4,4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone and di-tert-butyl diperoxyisophthalate.

(c) Thio Compounds

Examples of (d) the thio compounds preferred as the specific radical initiator for use in the present invention include compounds having a structure represented by the following formula (I):

Formula (I):

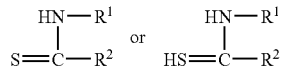

(wherein $R^1$ represents an alkyl group, an aryl group or a substituted aryl group, and $R^2$ represents a hydrogen atom or an alkyl group, or $R^1$ and $R^2$ each represents a nonmetallic atom group necessary for forming, when combined with each other, a 5-, 6- or 7-membered ring which may contain a heteroatom selected from oxygen atom, sulfur atom and nitrogen atom).

The alkyl group in formula (I) is preferably an alkyl group having from 1 to 4 carbon atoms. The aryl group is preferably an aryl group having from 6 to 10 carbon atoms such as phenyl and naphthyl, and the substituted aryl group includes these aryl groups which are substituted by a halogen atom such as chlorine atom, an alkyl group such as methyl group, or an alkoxy group such as methoxy group and ethoxy group. $R^2$ is preferably an alkyl group having from 1 to 4 carbon atoms. Specific examples of the thio compound represented by formula (I) include compounds having the following $R^1$ and $R^2$.

| No. | $R^1$ | $R^2$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_4$Cl | —C$_4$H$_9$ |
| 7 | —C$_6$H$_4$—OCH$_3$ | —C$_2$H$_5$ |
| 8 | —(CH$_2$)$_2$— | |
| 9 | —(CH$_2$)$_2$—S— | |
| 10 | —CH$_2$—CH(CH$_3$)—S— | |
| 11 | —(CH$_2$)$_2$—O— | |
| 12 | —C(CH$_3$)$_2$—CH$_2$—O— | |
| 13 | —H═CH—N(CH$_3$)— | |
| 14 | —(CH$_2$)$_3$—S— | |
| 15 | —C$_6$H$_4$—O— | |
| 16 | —N═C(SCH$_3$)—S— | |
| 17 | —C$_6$H$_4$—NH— | |

(d) Hexaarylbiimidazole Compounds

Examples of (e) the hexaarylbiimidazole compounds preferred as the specific radical initiator for use in the present invention include lophine dimers described in JP-B-45-37377 and JP-B-44-86516 such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

(e) Ketooxime Ester Compounds

Examples of (f) the ketooxime ester compounds preferred as the specific radical initiator for use in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

(f) Metallocene Compounds

Examples of (i) the metallocene compounds preferred as the specific radical initiator for use in the present invention include titanocene compounds described in JP-A-59-152396, JP-A-61-151197, JP-A-63-41484, JP-A-2-249 and JP-A-2-4705 and iron-allene complexes described in JP-A-1-304453 and JP-A-1-152109.

Specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis-(cyclopentadienyl)-bis(2,6-difluoro-3-(pyr-1-yl)phenyl) titanium, bis(cyclopentadienyl)bis[2,6-difluoro-3-(methylsulfonamido)phenyl]titanium, bis(cyclopentadienyl)bis[2,6-difluoro-3-(N-butylbialloylamino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(N-(2-ethylhexyl)-4-tolyl-sulfonyl)amino)phenyl]titanium, bis(cyclopentadienyl)bis[2,6-difluoro-3-(N-(3-oxaheptyl)-benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethyl-sulfonyl)amino)phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoyl)-amino)phenyl]titanium, bis(cyclopentadienyl)bis[2,6-difluoro-3-(4-chlorobenzoyl)amino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium and bis(cyclopentadienyl)bis[2,6-difluoro-3-(N-cyclohexylbenzoylamino)phenyl]titanium.

(g) Active Ester Compounds

Examples of (g) the active ester compounds preferred as the specific radical initiator for use in the present invention include imidosulfonate compounds described in JP-B-62-6223 and active sulfonates described in JP-B-63-14340 and JP-A-59-174831.

(h) Compounds Having Carbon-Halogen Bond

Examples of (g) the compounds having a carbon-halogen bond preferred as the specific radical initiator for use in the present invention include those represented by the following formulae (II) to (VIII):

Formula (II):

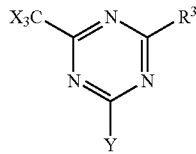

(wherein X represents a halogen atom, Y represents —CX$_3$, —NH$_2$, —NHR$^4$, —NR$^4$ or —OR$^4$ (wherein R$^4$ represents an alkyl group, a substituted alkyl group, an aryl group or a substituted aryl group) and R$^3$ represents —CX$_3$, an alkyl group, a substituted alkyl group, an aryl group, a substituted aryl group or a substituted alkenyl group);

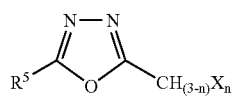

Formula (III)

(wherein R$^5$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, X represents a halogen atom, and n represents an integer of 1 to 3);

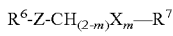

Formula (IV)

(wherein R$^6$ represents an aryl group or a substituted aryl group, R$^7$ represents a group shown below or a halogen, and Z represents —C(=O)—, —C(=S)— or —SO$_2$—):

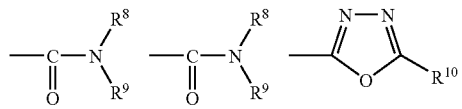

(wherein R$^8$ and R$^9$ each represents an alkyl group, a substituted alkyl group, an alkenyl group, a substituted alkenyl group, an aryl group or a substituted aryl group, R$^{10}$ has the same meaning as R$^3$ in formula (II), X represents a halogen atom, and m represents 1 or 2);

Formula (V):

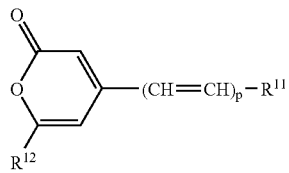

(wherein R$^{11}$ represents an aryl group which may be substituted or a heterocyclic group which may be substituted, R$^{12}$ represents a trihaloalkyl or trihaloalkenyl group having from 1 to 3 carbon atoms, and p represents 1, 2 or 3); a carbonylmethylene heterocyclic compound having a trihalogenomethyl group represented by:

Formula (VI):

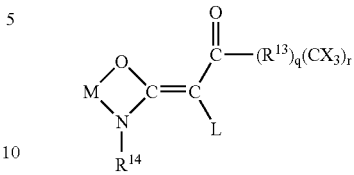

(wherein L represents a hydrogen atom or a substituent represented by the formula: CO—(R$^{13}$)$_q$(CX$_3$)$_r$, Q represents a sulfur atom, a selenium atom, an oxygen atom, a dialkylmethylene group, an alken-1,2-ylene group, 1,2-phenylene group or an N—R group, M represents a substituted or unsubstituted alkylene or alkenylene group or a 1,2-arylene group, R$^{14}$ represents an alkyl group, an aralkyl group or an alkoxyalkyl group, R$^{13}$ represents a carbocyclic or heterocyclic divalent aromatic group, X represents a chlorine atom, a bromine atom or an iodine atom, and q=0 and r=1, or q=1 and r=1 or 2); a 4-halogeno-5-(halogenomethylphenyl)-oxazole derivative represented by:

Formula (VII):

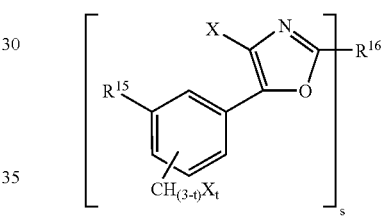

(wherein X represents a halogen atom, t represents an integer of 1 to 3, s represents an integer of 1 to 4, R$^{15}$ represents a hydrogen atom or a CH$_{(3-t)}$X$_t$ group, and R$^{16}$ represents an s-valent unsaturated organic group which may be substituted); and a 2-(halogenomethylphenyl)-4-halogenooxazole derivative represented by:

Formula (VIII):

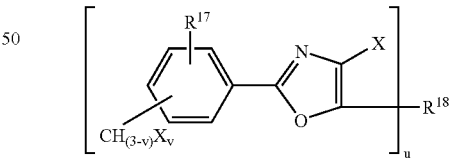

(wherein X represents a halogen atom, v represents an integer of 1 to 3, u represents an integer of 1 to 4, R$^{17}$ represents a hydrogen atom or a CH$_{(3-v)}$X$_v$ group, and R$^{18}$ represents a u-valent unsaturated organic group which may be substituted).

Specific examples of the compounds having a carbon-halogen bond include: compounds described in Wakabayashi et al., *Bull. Chem. Soc. Japan,* 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4, 6-bis(trichloromethyl)-S-triazine, 2-(p-methoxyphenyl)-4, 6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine; compounds described in British Patent 1,388,492, such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine; compounds described in JP-A-53-133428, such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)naphtho-1-yl]4,6-bis-trichloromethyl-S-triazine, 2-(4,7-dimethoxynaphtho-1-yl)-4,6-bis-trichloromethyl-S-triazine and 2-(acenaphtho-5-yl)-4,6-bis-trichloromethyl-S-triazine; compounds described in German Patent No. 3,337,024, such as compounds shown below:

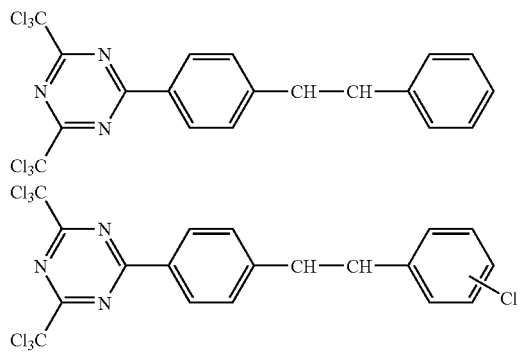

compounds described in F. C. Schaefer et al., *J. Org. Chem.*, 29, 1527 (1964), such as 2-methyl-4,6-bis(tribromomethyl)-S-triazine, 2,4,6-tris(tribromomethyl)-S-triazine, 2,4,6-tris(tribromomethyl)-S-triazine, 2-amino-4-methyl-6-tribromomethyl-S-triazine and 2-methoxy-4-methyl-6-trichloromethyl-S-triazine; compounds described in JP-A-62-58241, such as compounds shown below:

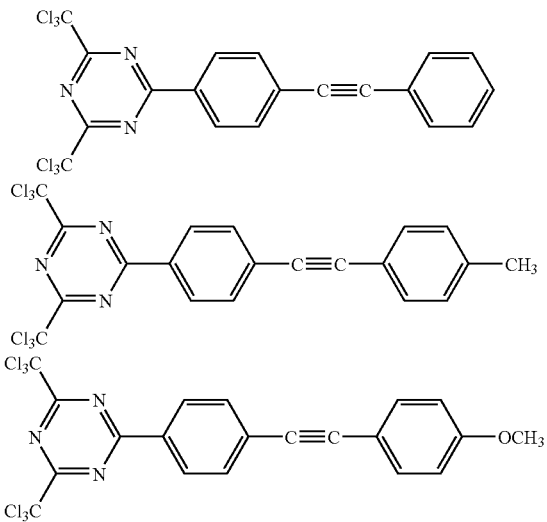

compounds described in JP-A-5-281728, such as compounds shown below:

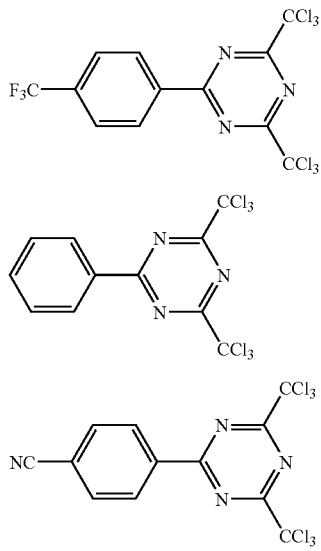

and compounds which can be easily synthesized by a person skilled in the art according to the synthesis method described in M. P. Hutt, E. F. Elslager and L. M. Herbel, *Journal of Heterocyclic Chemistry*, Vol. 7 (No. 3), page 511 et seq. (1970), such as compounds shown below:

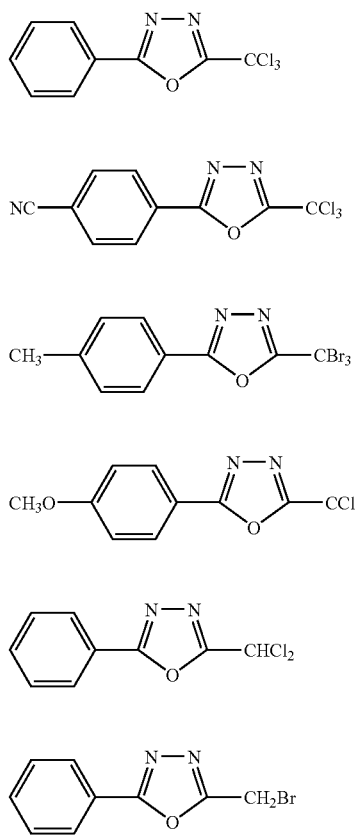

(i) Azo-Type Compounds

Examples of (i) the azo-type compounds preferred as the specific radical initiator for use in the present invention include 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2-methylpropionamidoxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide] and 2,2'-azobis(2,4,4-trimethylpentane).

Among these (B) specific radical initiators, (f) metallocene compounds are particularly preferred in view of the effects.

The specific radical initiator can be added to the coating solution for the recording layer in an amount of 0.1 to 50 mass %, preferably from 0.5 to 30 mass %, more preferably from 1 to 20 mass %, based on the entire solid content in the polymerizable composition. With the amount added in this range, sufficiently high sensitivity can be obtained and when the polymerizable composition of the present invention is applied as a recording layer of a lithographic printing plate precursor, the non-image area can be prevented from staining at the printing. These specific radical initiators may be used individually or in combination of two or more thereof. Also, the specific radical initiator may be added together with other components in the same layer or may be added to a layer provided separately.

[(C) Compound Having Ethylenically Unsaturated Bond]

The compound (C) having an ethylenically unsaturated bond (polymerizable compound) for use in the present invention is an addition-polymerizable compound having at least one ethylenically unsaturated double bond, and this is selected from compounds having at least one, preferably two or more, ethylenically unsaturated bond(s). Such compounds are widely known in this industrial field and these known compounds can be used in the present invention without any particular limitation. These compounds have a chemical mode such as monomer, prepolymer (that is, dimer, trimer or oligomer) or a mixture or copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydrating condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and displacement reaction products of an unsaturated carboxylic acid ester or amide having a disorptive substituent such as halogen group or tosyloxy group with a monofunctional or polyfunctional alcohol, amine or thiol may also be suitably used. Other than these, compounds where the unsaturated carboxylic acid of the above-described compounds is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane and bis[p-(methacryloxyethoxy)phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Other examples of the ester include aliphatic alcohol-based esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Other preferred examples of the amide-type monomer include those having a cyclohexylene structure described in JP-B-54-21726.

A urethane-based addition-polymerizable compound produced by using an addition reaction of isocyanate with a hydroxyl group is also preferred and specific examples thereof include vinyl urethane compounds having two or more polymerizable vinyl groups within one molecule described in JP-B-48-41708, which are obtained by adding a vinyl monomer having a hydroxyl group represented by the following formula (1) to a polyisocyanate compound having two or more isocyanate groups within one molecule:

$$CH_2=C(R^4)COOCH_2CH(R^5)OH \quad (1)$$

(wherein $R^4$ and $R^5$ each represents H or $CH_3$).

In addition, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, when addition-polymerizable compounds having an amino or sulfide structure within the molecule described in JP-A-63-277653, JP-A-63-260909 and JP-A-1-105238 are used, an image recording material having very excellent photosensitization speed can be obtained.

Other examples include polyfunctional acrylates and methacrylates such as polyester acrylates described in JP-A-48-64183, JP-B4943191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-based compounds described in JP-A-2-25493 may also be used. In some cases, structures containing a perfluoroalkyl group described in JP-A-61-22048 are suitably used. Furthermore, those described as a photocurable monomer or oligomer in *Adhesion*, Vol. 20, No. 7, pp. 300-308 (1984) may also be used.

Details of the use method of (C) the polymerizable compound, such as structure, sole or combination use and amount added, can be freely selected in accordance with the designed performance of the final polymerizable composition. For example, these are selected from the following standpoints. In view of sensitivity, a structure having a large unsaturated group content per one molecule is preferred and in many cases, a bifunctional or greater functional compound is preferred. For increasing the strength of image area, namely, cured layer, a trifunctional or greater functional compound is preferred. Also, a method of controlling both sensitivity and strength by using a combination of compounds differing in the functional number and in the polymerizable group (for example, an acrylic acid ester, a methacrylic acid ester, a styrene-based compound or a vinyl ether-based compound) is effective. A compound having a large molecular weight or a compound having high hydrophobicity ensures excellent photosensitization speed and film strength but is sometimes not preferred in view of development speed or precipitation in the developer. The selection and use method of the polymerizable compound as the component (C) are important factors also in the light of compatibility and dispersibility with other components (for example, component (A) and component (B), and also (E) a polymerization initiator and (E) a sensitizing dye, coloring agent, which are described later) in the image recording layer formed of the polymerizable composition. For example, the compatibility may be sometimes enhanced by using a low purity compound or using two or more compounds in combination.

Also, when the polymerizable composition of the present invention is applied as the recording layer of a lithographic printing plate precursor, a specific structure may be selected for the purpose of improving the adhesion to the support, overcoat layer which is described later, or the like of the lithographic printing plate precursor. As for the blending ratio of the polymerizable compound in the recording layer, a large ratio is advantageous in view of sensitivity, but if too large, undesired phase separation may occur or problems in the production process due to adhesive property of the recording layer (for example, production failure due to transfer or adhesion of recording layer components) or problems such as precipitation from the developer may occur. From these standpoints, (C) the polymerizable compound is preferably used in a range from 5 to 80 mass %, more preferably from 25 to 75 mass %, based on the nonvolatile components in the recording layer. Also, these polymerizable compounds may be used individually or in combination of two or more thereof.

Other than these, when the polymerizable composition is applied to a lithographic printing plate precursor, as for the use method of (C) the polymerizable compound, appropriate structure, formulation and amount added can be freely selected by taking account of the degree of polymerization inhibition due to oxygen, resolution, fogging, change in refractive index, surface tackiness and the like. Depending on the case, layer structure coating method such as undercoat and overcoat can also be employed.

[(D) Polymerization Inhibitor]

In the polymerizable composition of the present invention, (D) a thermopolymerization inhibitor is preferably added so as to prevent the polymerizable compound having an ethylenically unsaturated bond from undergoing unnecessary thermopolymerization during the preparation or storage of the polymerizable composition or an image recording material where the polymerizable composition is applied.

The thermopolymerization inhibitor suitable for the present invention is preferably a compound selected from the group consisting of phenol-based hydroxyl group-containing compounds, N-oxide compounds, piperidine-1-oxyl free radical compounds, pyrrolidine-1-oxyl free radial compounds, N-nitrosophenylhydroxylamines, diazonium compounds and cationic dyes.

Among these, preferred are phenol-based hydroxyl group-containing compounds selected from the group consisting of hydroquinone, p-methoxyphenol, di-tert-butyl-p-cresol, pyrogallol, tert-butyl catechol, benzoquinone, 4,4-thiobis(3-methyl-6-tert-butylphenol), 2,2'-methylenebis(4-methyl-6-tert-butylphenol), phenol resins and cresol resins; N-oxide compounds selected from 5,5-dimethyl-1-pyrroline-N-oxide, 4-methylmorpholine-N-oxide, pyridine-N-oxide, 4-nitropyridine-N-oxide, 3-hydroxypyridine-N-oxide, picolinic acid N-oxide, nicotinic acid N-oxide and isonicotinic acid N-oxide; piperidine-1-oxyl free radical compounds selected from piperidine-1-oxyl free radical, 2,2,6,6-tetramethylpiperidine-1-oxyl free radical, 4-oxo-2,2,6,6-tetramethylpiperidine-1-oxyl free radical, 4-hydroxy-2,2,6,6-tetramethylpiperidine-1-oxyl free radical, 4-acetamide-2,2,6,6-tetramethylpiperidine-1-oxy free radical, 4-maleimide-2,2,6,6-tetramethylpiperidine-1-oxyl free radical and 4-phosphonoxy-2,2,6,6-tetramethylpiperidine-1-oxyl free radical; pyrrolidine-1-oxyl free radical compounds selected from 3-carboxyproxyl free radical (3-carboxy-2,2,5,5-tetramethylpyrroldine-1-oxy free radical); N-nitrosophenylhydroxylamines selected from the compound group consisting of N-nitrosophenylhydroxylamine cerous salts and N-nitrosophenylhydroxylamine aluminum salts; diazonium compounds selected from the compound group consisting of a hydrogen sulfate of 4-diazophenyldimethylamine, tetrafluoroborate of 4-diazodiphenylamine, and hexafluorophosphate of 4-methoxy-4-diazodiphenylamine; and cationic dyes selected from the compound group consisting of crystal violet, methyl violet, ethyl violet and Victoria pure blue BOH.

Also, from the standpoint of not causing a side reaction ascribable to the polymerization inhibitor during the synthesis, benzoquinone and derivatives thereof, more specifically, 1,4-benzoquinone derivatives, are most preferred.

The amount added of (D) the polymerization inhibitor contained in the polymerizable composition of the present invention is preferably from 0.01 to 10,000 ppm, more preferably from 0.1 to 5,000 ppm, and most preferably from 0.5 to 3,000 ppm, based on the mass of the entire polymerizable composition after drying.

[(E) Sensitizing Dye]

In the present invention, a sensitizing dye which absorbs light at a predetermined wavelength is preferably added. By the exposure with light at a wavelength where this sensitizing dye has absorption, the radical generation reaction of the component (B) and in turn the polymerization reaction of the component (C) are accelerated. The sensitizing dye (E) includes known spectral sensitizing dyes and dyestuffs, and dyes and pigments which absorb light and interact with the photopolymerization initiator. Depending on the wavelength of light which this sensitizing dye absorbs, the polymerizable composition of the present invention can respond to various wavelengths from ultraviolet light to visible light and infrared light. For example, in the case of using an infrared absorbent as (E) the sensitizing dye, the polymerizable composition responds to infrared light at a wavelength from 760 to 1,200 nm. Also, when a dye having a maximum absorption wavelength in the region from 350 to 450 nm is used, the polymerizable composition responds to visible light from blue to violet.

(Spectral Sensitizing Dye and Dyestuff)

Examples of the spectral sensitizing dye and dyestuff preferred as (E) the sensitizing dye for use in the present invention include polynuclear aromatics (e.g., pyrene, perylene, triphenylene), xanthenes (e.g., fluorescein, eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, methylene blue, toluidine blue), acridines (e.g., acridine orange, chloroflavin, acriflavine), phthalocyanines (e.g., phthalocyanine, metal phthalocyanine), porphyrins (e.g., tetraphenyl porphyrin, center metal-substituted porphyrin), chlorophylls (e.g., chlorophyll, chlorophyllin, center metal-substituted chlorophyll), metal complexes (e.g., compound shown below), anthraquinones (e.g., anthraquinone) and squaliums (e.g., squalium).

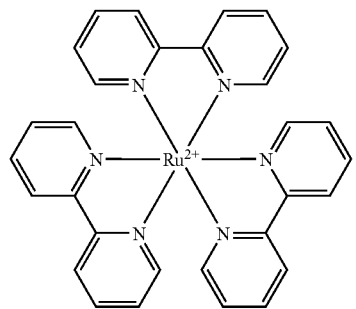

More preferred examples of the spectral sensitizing dye and dyestuff are the followings:

styryl-based dyes described in JP-B-37-13034: Cationic dyes described in JP-A-62-143044: quinoxalinium salts described in JP-B-59-24147: new methylene blue compounds described in JP-A-64-33104: anthraquinones described in JP-A-64-56767: benzoxanthene dyes described in JP-A-2-1714; acridines described in JP-A-2-226148 and JP-A-2-226149: pyrylium salts described in JP-B-40-28499: cyanines described in JP-B-46-42363: benzofuran dyes described in JP-A-2-63053: conjugate ketone dyes described in JP-A-2-85858 and JP-A-2-216154: dyes described in JP-A-57-10605; azocinnamylidene derivatives described in JP-B-2-30321: cyanine-based dyes described in JP-A-1-287105: xanthene-based dyes described in JP-A-62-31844, JP-A-62-31848 and JP-A-62-143043: aminostyryl ketones described in JP-B-59-28325: dyes described in JP-A-2-179643: merocyanine dyes described in JP-A-2-244050: merocyanine dyes described in JP-B-59-28326: merocyanine dyes described in JP-A-59-89303: merocyanine dyes described in Japanese Patent Application No. 6-269047: and benzopyran-based dyes described in Japanese Patent Application No. 7-164583.

(Infrared Absorbent)

Other than these, the following infrared absorbents (dyes or pigments) are in particular suitably used as (E) the sensitizing dye.

As for the dye, commercially available dyes and known dyes described, for example, in *Senryo Binran* (*Handbook of Dyes*), compiled by The Society of Synthetic Organic Chemistry, Japan (1970) can be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium dye and metal thiolate complex.

Preferred examples of the dye include cyanine dyes described in JP-A-58-125246, JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, near infrared absorbing sensitizers described in U.S. Pat. No. 5,156,938 may be suitably used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 may also be preferably used. Other preferred examples of the dye include near infrared absorbing dyes represented by formulae (I) and (II) of U.S. Pat. No. 4,756,993.

Other preferred examples of the infrared absorbing dye for use in the present invention include specific indolenine cyanine dyes described in JP-A-2001-6326 and Japanese Patent Application No. 2001-237840, such as those set forth below.

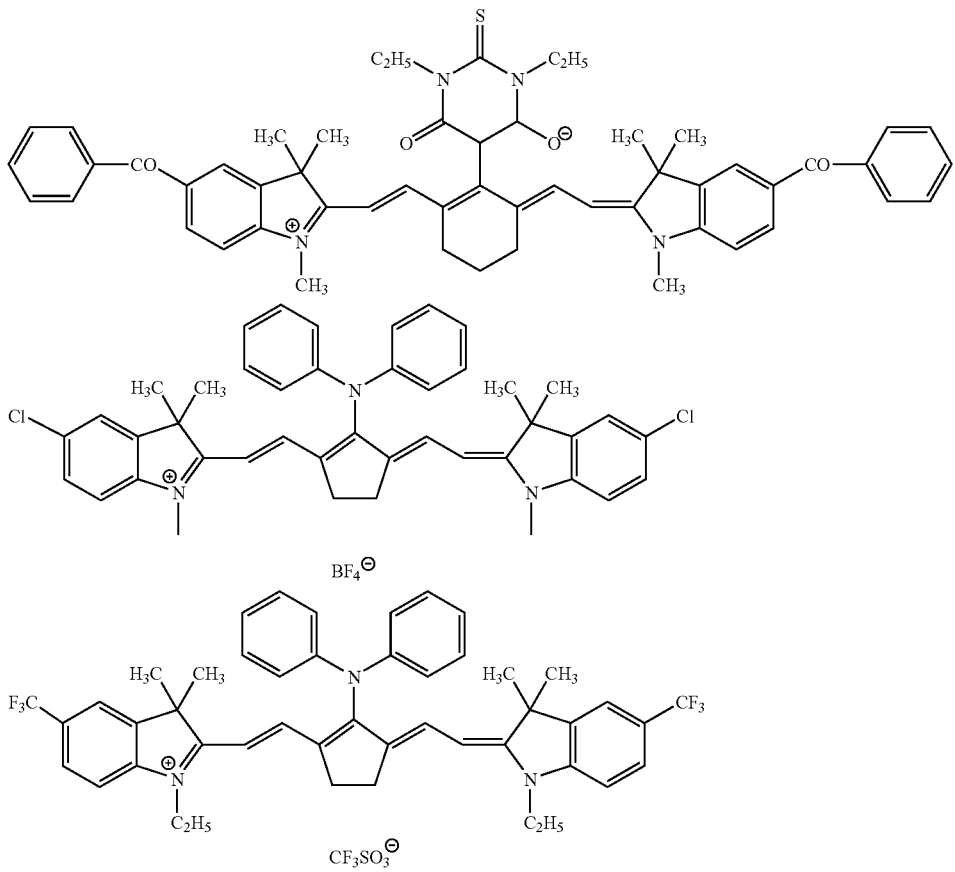

Among these dyes, particularly preferred are cyanine dyes, squarylium dyes, pyrylium salts, nickel thiolate complexes and indolenine cyanine dyes, more preferred are cyanine dyes and indolenine cyanine dyes, still more preferred are cyanine dyes represented by the following formula (a):

Formula (a):

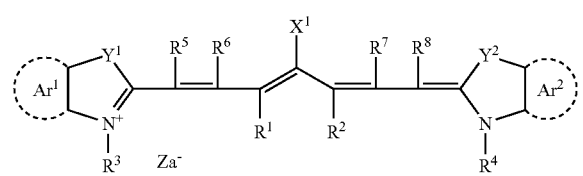

In formula (a), $X^1$ represents a hydrogen atom, a halogen atom, $-NPh_2$, $X^2-L^1$ or a group shown below. Here, $X^2$ represents an oxygen atom, a nitrogen atom or a sulfur atom, and $L^1$ represents a hydrocarbon group having from 1 to 12 carbon atoms, an aromatic ring having a heteroatom, or a hydrocarbon group containing a heteroatom and having from 1 to 12 carbon atoms. The heteroatom as used herein indicates N, S, O, a halogen atom or Se; $Xa^-$ has the same definition as $Za^-$ which is described later. $R^a$ represents a substituent selected from a hydrogen atom, an alkyl group, an aryl group, a substituted or unsubstituted amino group and a halogen atom.

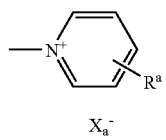

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms, and in view of availability of the raw material, preferably a hydrogen atom. Za⁻ represents a counter anion, but when the cyanine dye represented by formula (a) has an anionic substituent in its structure and neutralization of electric charge is not necessary, Za⁻ is not present. In view of storage stability of the coating solution for the recording layer, Za⁻ is preferably halide ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (a), which can be suitably used in the present invention, include those described in JP-A-2001-133969 (paragraphs [0017] to [0019]), JP-A-2002-40638 (paragraphs [0012] to [0038]) and JP-A-2002-23360 (paragraphs [0012] to [0023]).

(Dye Having Maximum Absorption Wavelength in the Region of 350 to 450 nm)

Another preferred embodiment of the sensitizing dye is a dye belonging to the following compound group and having a maximum absorption wavelength in the region of 350 to 450 nm.

Examples thereof include polynuclear aromatics (e.g., pyrene, perylene, triphenylene), xanthenes (e.g., fluorescein, eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, methylene blue, toluidine blue), acridines (e.g., acridine orange, chloroflavin, acriflavine), anthraquinones (e.g., anthraquinone) and squaliums (e.g., squalium).

Preferred examples of the sensitizing include the compounds represented by the following formula (LXV) to (XVIII).

Examples thereof include polynuclear aromatics (e.g., pyrene, perylene, triphenylene), xanthenes (e.g., fluorescein, eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, methylene blue, toluidine blue), acridines (e.g., acridine orange, chloroflavin, acriflavine), anthraquinones (e.g., anthraquinone) and squaliums (e.g., squalium).

Preferred examples of the sensitizing dye include the compounds represented by the following formulae (XIV) to (XVIII).

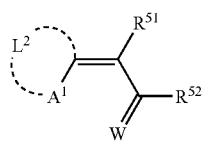
(XIV)

(wherein $A^1$ represents a sulfur atom or $NR^{50}$, $R^{50}$ represents an alkyl group or an aryl group, $L^2$ represents a nonmetallic atom group necessary for forming a basic nucleus of the dye in cooperation with the adjacent $A^1$ and the adjacent carbon atom, $R^{51}$ and $R^{52}$ each independently represents a hydrogen atom or a monovalent nonmetallic atom group, $R^{51}$ and $R^{52}$ may combine with each other to form an acidic nucleus of the dye, and W represents an oxygen atom or a sulfur atom).

Specific preferred examples [(A-1) to (A-5)] of the compound represented by formula (XIV) are set forth below.

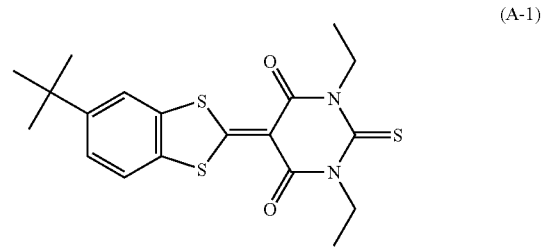
(A-1)

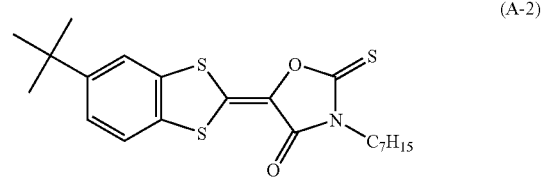
(A-2)

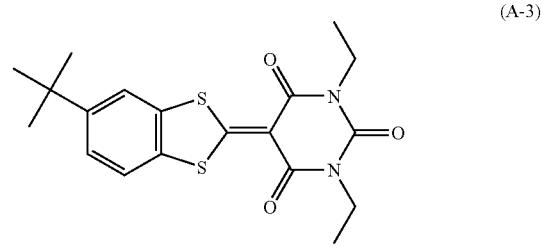
(A-3)

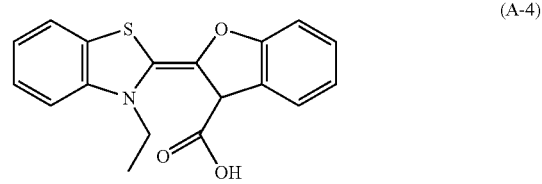
(A-4)

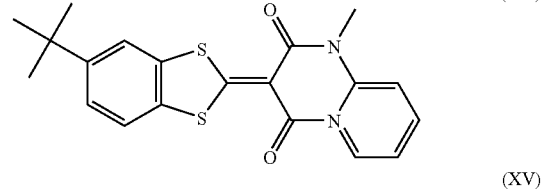
(A-5)

(XV)

(wherein $Ar^1$ and $Ar^2$ each independently represents an aryl group and are linked through a bond of —$L^3$—, $L^3$ represents —O— or —S—, and W has the same definition as in formula (XIV)).

Preferred examples of the compound represented by formula (XV) include the followings [(A-6) to (A-8)].

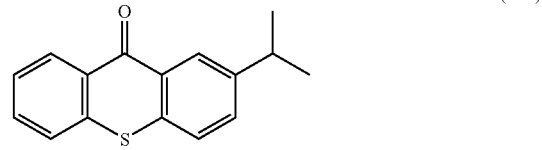
(A-6)

-continued (A-7)

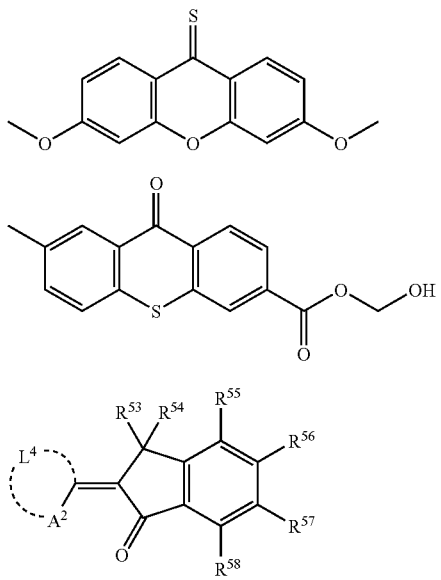

(A-8)

(XVI)

(wherein A² represents a sulfur atom or NR⁵⁹, L⁴ represents a nonmetallic atom group necessary for forming a basic nucleus of the dye in cooperation with the adjacent A² and the adjacent carbon atom, $R^{53}$, $R^{54}$, $R^{55}$, $R^{56}$, $R^{57}$ and $R^{58}$ each independently represents a monovalent nonmetallic atom group, and $R^{59}$ represents an alkyl group or an aryl group).

Preferred examples of the compound represented by formula (XVI) include the followings [(A-9) to (A-11)].

(A-9)

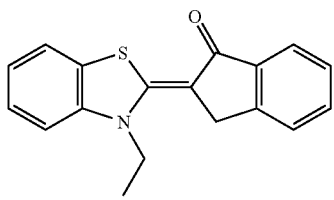

(A-10)

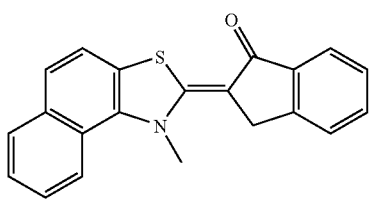

(A-11)

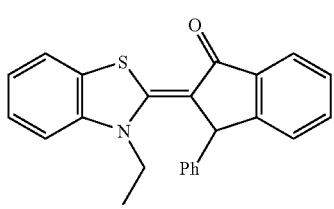

(XVII)

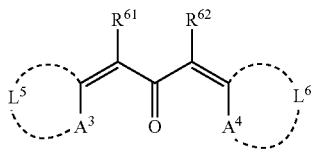

(wherein A³ and A⁴ each independently represents —S—, —NR⁶³— or —NR⁶⁴—, $R^{63}$ and $R^{64}$ each independently represents a substituted or unsubstituted alkyl group or a substituted or unsubstituted aryl group, L⁵ and L⁶ each independently represents a nonmetallic atom group necessary for forming a basic nucleus of the dye in cooperation with the adjacent A³ or A⁴ and the adjacent carbon atom, and $R^{61}$ and $R^{62}$ each independently represents a monovalent nonmetallic atom group or may combine with each other to form an aliphatic or aromatic ring).

Preferred examples of the compound represented by formula (XVII) include the followings [(A-12) to (A-15)].

(A-12)

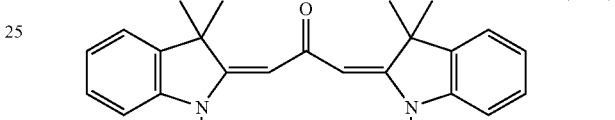

(A-13)

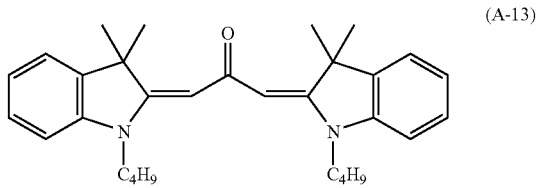

(A-14)

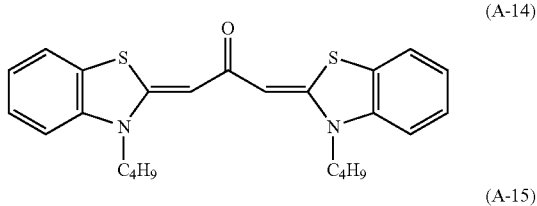

(A-15)

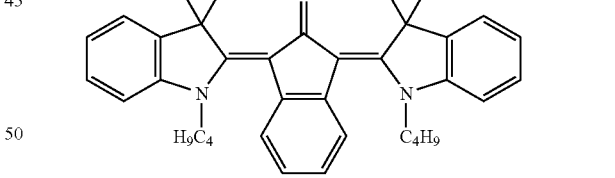

Other preferred examples of the sensitizing dye for use in the present invention include the dye represented by the following formula (XVIII):

(XVIII)

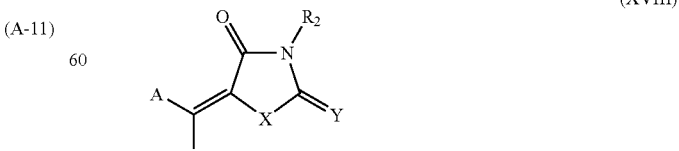

wherein A represents an aromatic or heterocyclic ring which may have a substituent, X represents an oxygen atom, a sulfur atom or —N(R$^1$)—, Y represents an oxygen atom or —N(R$^1$)—, R$^1$, R$^2$ and R$^3$ each independently represents a hydrogen atom or a monovalent nonmetallic atom group, and A and R$^1$, R$^2$ or R$^3$ may combine with each other to form an aliphatic or aromatic ring.

Here, when R$^1$, R$^2$ and R$^3$ each represents a monovalent nonmetallic atom group, R$^1$, R$^2$ and R$^3$ each preferably represents a substituted or unsubstituted alkyl or aryl group.

Preferred examples of R$^1$, R$^2$ and R$^3$ are specifically described below. Preferred examples of the alkyl group include a linear, branched or cyclic alkyl group having from 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, more preferred a linear alkyl group having from 1 to 12 carbon atoms, a branched alkyl group having from 3 to 12 carbon atoms and a cyclic alkyl group having from 5 to 10 carbon atoms.

As for the substituent of the substituted alkyl group, a monovalent nonmetallic atom group excluding hydrogen is used and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo (—SO$_3$H) group and a conjugate base group thereof (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and a conjugate base group thereof (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugate base group thereof (hereinafter referred to as an "alkylphosphonato group"), a monoarylphosphono group (—PO$_3$H(aryl)) and a conjugate base group thereof (hereinafter referred to as an "arylphosphonato group"), a phosphonoxy group (—OPO$_3$H$_2$) and a conjugate base group thereof (hereinafter referred to as a "phosphonatoxy group"), a dialkylphosphonoxy group (—OPO$_3$(alkyl)$_2$), a diarylphosphonoxy group (—OPO$_3$(aryl)$_2$), an alkylarylphosphonoxy group (—OPO$_3$(alkyl)(aryl)), a monoalkylphosphonoxy group (—OPO$_3$H(alkyl)) and a conjugate base group thereof (hereinafter referred to as an "alkylphosphonatoxy group"), a monoarylphosphonoxy group (—OPO$_3$H(aryl)) and a conjugate base group thereof (hereinafter referred to as an "arylphosphonatoxy group"), a cyano group, a nitro group, an aryl group, a heteroaryl group, an alkenyl group, an alkynyl group and a silyl group.

Specific examples of the alkyl group in these substituents include the above-described alkyl groups. These groups each may further have a substituent.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group.

As for the heteroaryl group, a group derived from a monocyclic or polycyclic aromatic ring containing at least one of a nitrogen atom, an oxygen atom and a sulfur atom is used, and examples of the heteroaryl ring in the preferred heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthyridine, quinazoline, cinnoline, pteridine, carbazole, carboline, phenanthrine, acridine, perimidine, phenanthroline, phthalazine, phenarsazine, phenoxazine, furazan and phenoxazine. These rings each may be further benzo-condensed or may have a substituent.

Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group and a trimethylsilylethynyl group. Examples of G$^1$ in the acyl group (G$^1$CO—) include hydrogen and the above-described alkyl and aryl groups. Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, an alkenyl group and an alkylidene group (e.g., methylene group).

Examples of the alkylene group in the substituted alkyl group include a divalent organic residue resulting from the elimination of any one hydrogen atom on the above-described alkyl group having from 1 to 20 carbon atoms, and preferred are a linear alkylene group having from 1 to 12 carbon atoms, a branched alkylene group having from 3 to 12 carbon atoms and a cyclic alkylene group having from 5 to 10 carbon atoms.

Specific examples of the substituted alkyl group preferred as $R^1$, $R^2$ and $R^3$, obtained by combining the above-described substituent and alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatopropyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Examples of the aryl group preferred as $R^1$, $R^2$ and $R^3$ include a condensed ring formed from 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group and a fluorenyl group. Among these, a phenyl group and a naphthyl group are preferred.

Specific examples of the substituted aryl group preferred as $R^1$, $R^2$ and $R^3$ include those having a monovalent nonmetallic atom group (excluding hydrogen atom) as a substituent on the ring-forming carbon atom of the above-described aryl groups. Preferred examples of the substituent include the above-described alkyl groups, substituted alkyl groups and substituents for the substituted alkyl group. Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbanoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)-carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propenylphenyl group, a 2-butynylphenyl group and a 3-butynylphenyl group.

$R^2$ and $R^3$ each is more preferably a substituted or unsubstituted alkyl group, and $R^2$ is more preferably a substituted or unsubstituted aryl group. The reason therefor is not clear but is presumed because by having such a substituent, the interaction between the electron excited state resulting from light absorption and the initiator compound is particularly intensified, and the initiator compound generates a radical, an acid or a base with higher efficiency.

A in formula (XVIII) is described below. A represents an atomic or heterocyclic ring which may have a substituent, and specific examples of the aromatic or heterocyclic ring which may have a substituent include those described above for $R^1$, $R^2$ and $R^3$ in formula (XVIII). Among these, A is preferably an aryl group having an alkoxy group, a thioalkyl group or an amino group, more preferably an aryl group having an amino group.

Y in formula (XVIII) is described below. Y represents a nonmetallic atom group necessary for forming a heterocyclic ring in cooperation with the above-described A and the adjacent carbon atom. Examples of such a heterocyclic ring include a 5-, 6- or 7-membered nitrogen-containing or sulfur-containing heterocyclic ring which may have a condensed ring. Y is preferably a 5- or 6-membered heterocyclic ring.

Examples of the nitrogen-containing heterocyclic ring include those known to constitute a basic nucleus in merocyanine dyes described in L. G. Brooker et al., *J. Am. Chem. Soc.*, Vol. 73, pp. 5326-5358 (1951) and references cited therein, and these all can be suitably used.

Specific examples thereof include thiazoles (e.g., thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, 4,5-di(2-furyl)thiazole), benzothiazoles (e.g., benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, 5-ethoxycarbonylbenzothiazole), naphthothiazoles (e.g., naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, 7-methoxynaphtho[1,2]thiazole), thianaphtheno-7',6', 4,5-thiazoles (e.g., 4'-methoxythianaphtheno-7',6',4,5-thiazole), oxazoles (e.g., 4-methyloxazole, 5-methyloxazole, 4-phenyloxazole, 4,5-diphenyloxazole, 4-ethyloxazole, 4,5-dimethyloxazole, 5-phenyloxazole), benzoxazoles (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, 6-hydroxybenzoxazole), naphthoxazoles (e.g., naphth[1,2]oxazole, naphth[2,1]oxazole), selenazoles (e.g., 4-methylselenazole, 4-phenylselenazole), benzoselenazoles (e.g., benzoselenazole, 5-chlorobenzoselenazole, 5-methoxybenzoselenazole, 5-hydroxybenzoselenazole, tetrahydrobenzoselenazole), naphthoselenazoles (e.g., naphthol[1,2]selenazole, naphtho[2,1]selenazole), thiazolines (e.g., thiazoline, 4-methylthiazoline, 4,5-dimethylthiazoline, 4-phenylthiazoline, 4,5-di(2-furyl)thiazoline, 4,5-diphenylthiazoline, 4,5-di(p-methoxyphenyl)thiazoline), 2-quinolines (e.g., quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline), 4-quinolines (e.g., quinoline, 6-methoxyquinoline, 7-methylquinoline, 8-methylquinoline), 1-isoquinolines (e.g., isoquinoline, 3,4-dihydroisoquinoline), 3-isoquinolines (e.g., isoquinoline), benzimidazoles (e.g., 1,3-dimethylbenzimidazole, 1,3-diethylbenzimidazole, 1-ethyl-3-phenylbenzimidazole), 3,3-dialkylindolenines (e.g., 3,3-dimethylindolenine, 3,3,5-trimethylindolenine, 3,3,7-trimethylindolenine), 2-pyridines (e.g., pyridine, 5-methylpyridine) and 4-pyridines (e.g., pyridine). Also, substituents in such a ring may combine with each other to form a ring.

Examples of the sulfur-containing heterocyclic ring include dithiol partial structures in the dyes described in JP-A-3-296759.

Specific examples thereof include benzodithiols (e.g., benzodithiol, 5-tert-butylbenzodithiol, 5-methylbenzodithiol), naphthodithiols (e.g., naphtho[1,2]dithiol, naphtho[2,1]dithiol) and dithiols (e.g., 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiol, 4,5-dicyanodithiol, 4-methoxycarbonylmethyldithiol, 4-carboxymethyldithiol).

Out of these nitrogen-containing or sulfur-containing heterocyclic rings which are formed by Y in cooperation with A and the adjacent carbon atom in formula (XVIII), dyes having a partial structure represented by the following formula (XVIII-2) are preferred because a photosensitive composition having high sensitization ability and very excellent storage stability can be obtained. The dye having a structure represented by formula (XVIII-2) is a compound described in detail as a novel compound in Japanese Patent Application No. 2003-311253 previously filed by the present inventors.

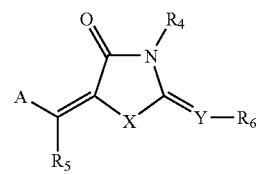

(XVIII-2)

(wherein A represents an aromatic or heterocyclic ring which may have a substituent, X represents an oxygen atom, a sulfur atom or —N(R$^1$)—, R$^1$, R$^4$, R$^5$ and R$^6$ each independently represents a hydrogen atom or a monovalent nonmetallic atom group, and A and R$^1$, R$^4$, R$^5$ or R$^6$ may combine with each other to form an aliphatic or aromatic ring).

In formula (XVIII-2), A and R$^1$ have the same meanings as in formula (XVIII), R$^4$ has the same meaning as R$^2$ in formula (XVIII), R$^5$ has the same meaning as R$^3$ in formula (XVIII), and R$^6$ has the same meaning as R$^1$ in formula (XVIII).

A compound represented by formula (XVIII-3) which is a preferred embodiment of the compound represented by formula (XVIII) for use in the present invention is described below.

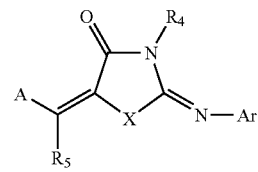

(XVIII-3)

wherein A represents an aromatic or heterocyclic ring which may have a substituent, X represents an oxygen atom, a sulfur atom or —N(R$^1$)—, R$^1$, R$^4$ and R$^5$ each independently represents a hydrogen atom or a monovalent nonmetallic atom group, A and R$^1$, R$^4$ or R$^5$ may combine with each other to form an aliphatic or aromatic ring, and Ar represents an aromatic or heterocyclic ring having a substituent, provided that the sum total of Hammett's values of the substituents on the Ar skeleton is larger than 0. The "sum total of Hammett's values is larger than 0" as used herein may be that one substituent is present and the Hammett's value of the substituent is larger than 0 or that a plurality of substituents are present and the sum total of the Hammett's values of these substituents is larger than 0.

In formula (XVIII-3), A and R$^1$ have the same meanings as in formula (XVIII), R$^4$ has the same meaning as R$^2$ in formula (XVIII) and R$^5$ has the same meaning as R$^3$ in formula (XVIII). Ar represents an aromatic or heterocyclic ring having a substituent, and specific examples thereof include the aromatic or heterocyclic rings having a substituent out of those described above as specific examples of A in formula (XVIII). However, as for the substituent which can be introduced into Ar in formula (XVIII-3), the sum total of the Hammett's values thereof must be larger than 0. Examples of such a substituent include a trifluoromethyl group, a carbonyl group, an ester group, a halogen atom, a nitro group, a cyano group, a sulfoxide group, an amido group and a carboxyl group. The Hammett's values of these substituents are as follows: trifluoromethyl group (—CF$_3$, m: 0.43, p: 0.54), a carbonyl group (for example, —COH, m: 0.36, p: 0.43), an ester group (—COOCH$_3$, m: 0.37, p: 0.45), a halogen atom (for example, Cl, m: 0.37, p: 0.23), a cyano group (—CN, m: 0.56, p: 0.66), a sulfoxide group (for example, —SOCH$_3$, m: 0.52, p: 0.45), an amido group (for example, —NHCOCH$_3$, m: 0.21, p: 0.00) and a carboxyl group (—COOH, m: 0.37, p: 0.45). In the parenthesis, the introduction site of the substituent in the aryl skeleton and the Hammett's values thereof are shown. For example, (m: 0.50) indicates that when the substituent is introduced into the meta-position, the Hammett's value is 0.50. Among these, Ar is preferably a phenyl group having a substituent and the substituent on the Ar skeleton is preferably an ester group or a cyano group. In particular, the substituent is preferably substituted at the ortho-position on the Ar skeleton.

Specific preferred examples (Compounds D1 to D61) of the sensitizing dye represented by formula (XVIII) for use in the present invention are set forth below, but the present invention is not limited thereto.

(D1)
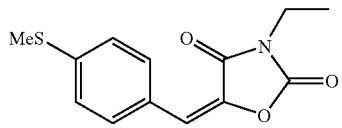

(D2)
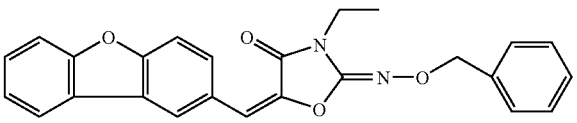

(D3)
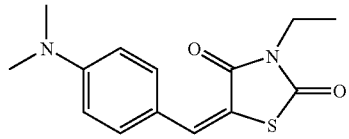

(D4)
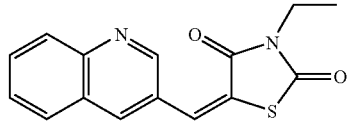

-continued (D5)
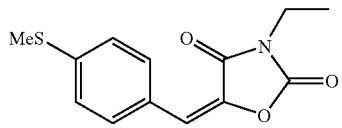

(D6)
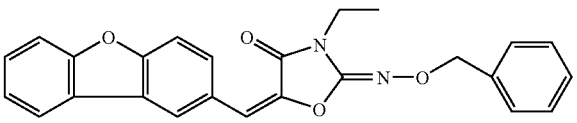

(D7)
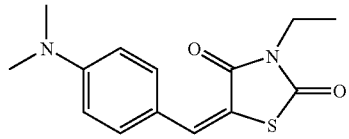

(D8)
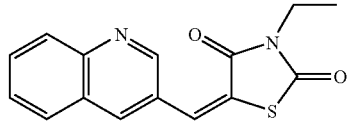

(D9)
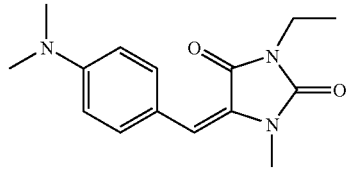

(D10)
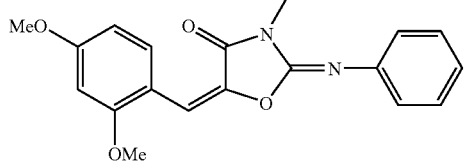

(D11)
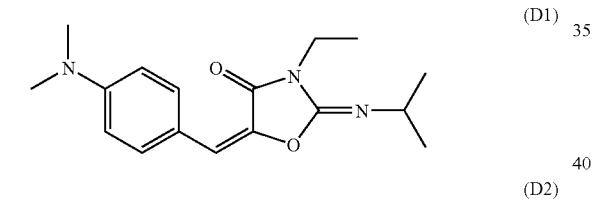

(D12)
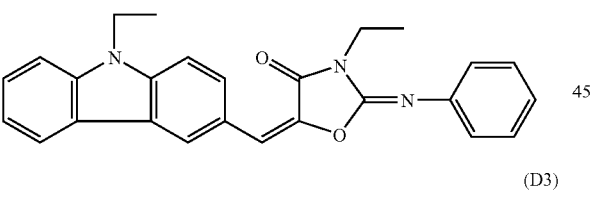

(D13)
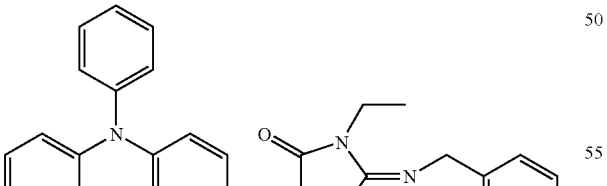

-continued
(D14)
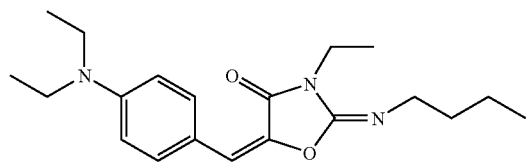
(D15)
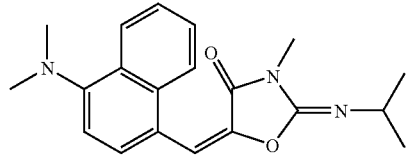
(D16)
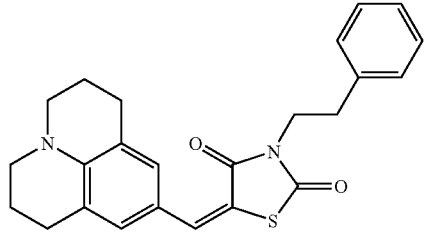
(D17)
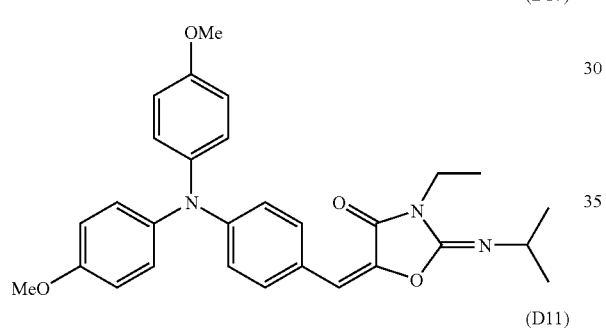
(D11)
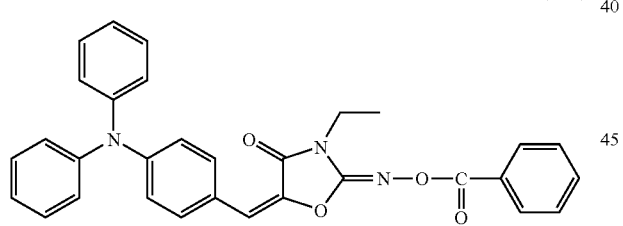
(D19)
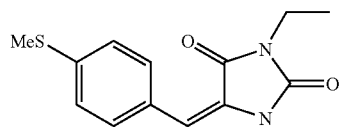
(D20)
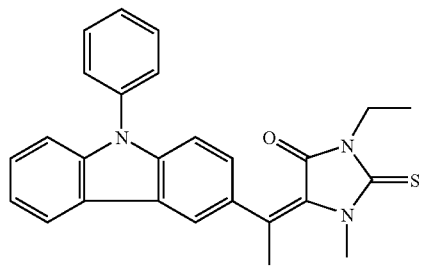
-continued
(D21)
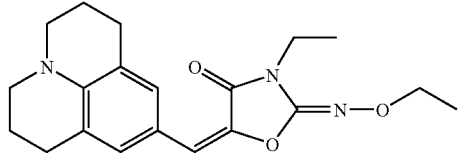
(D22)
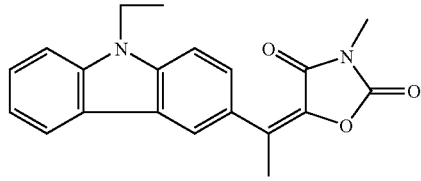
(D23)
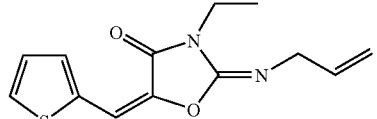
(D24)
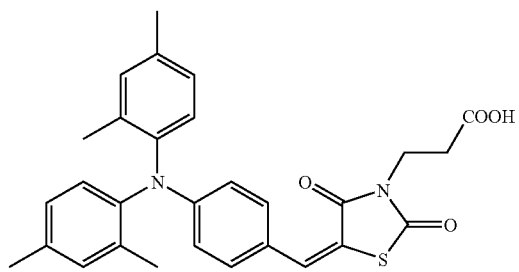
(D25)
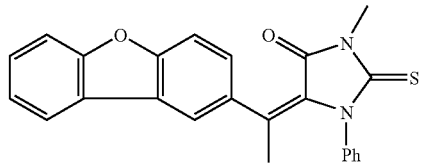
(D26)
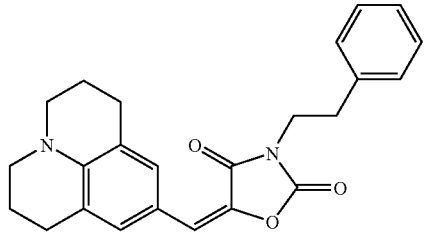
(D27)
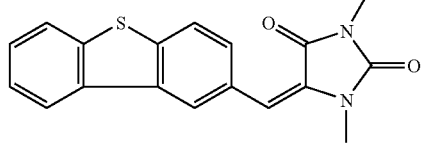

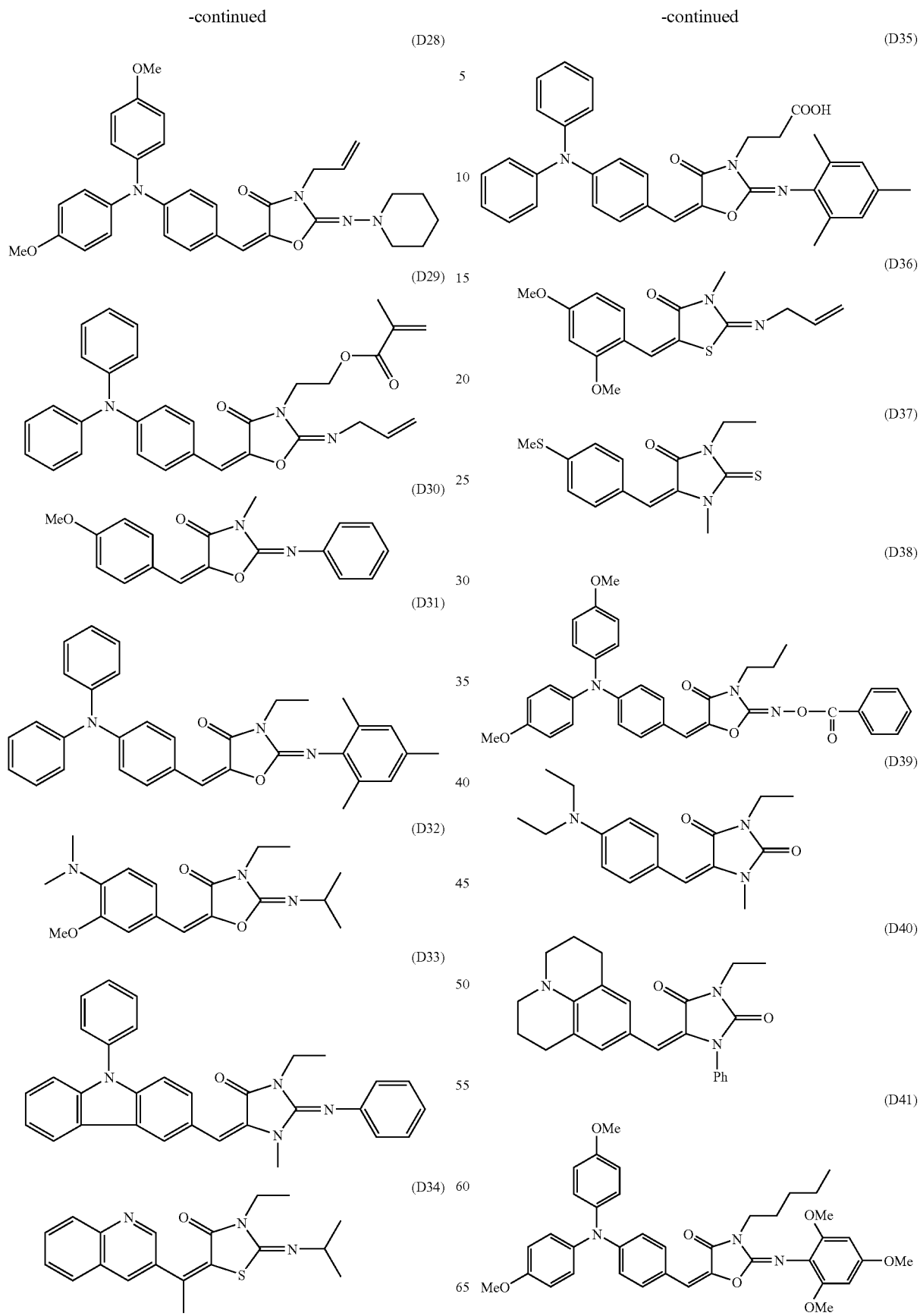

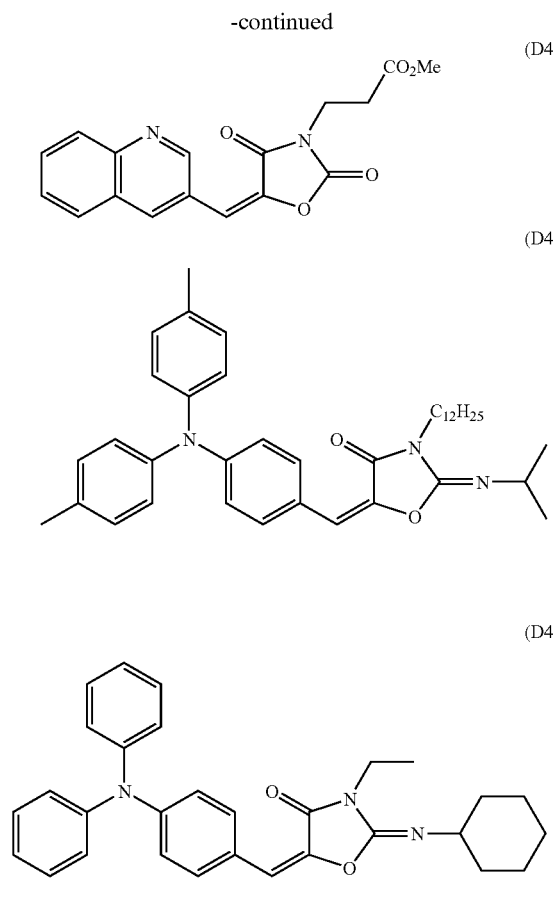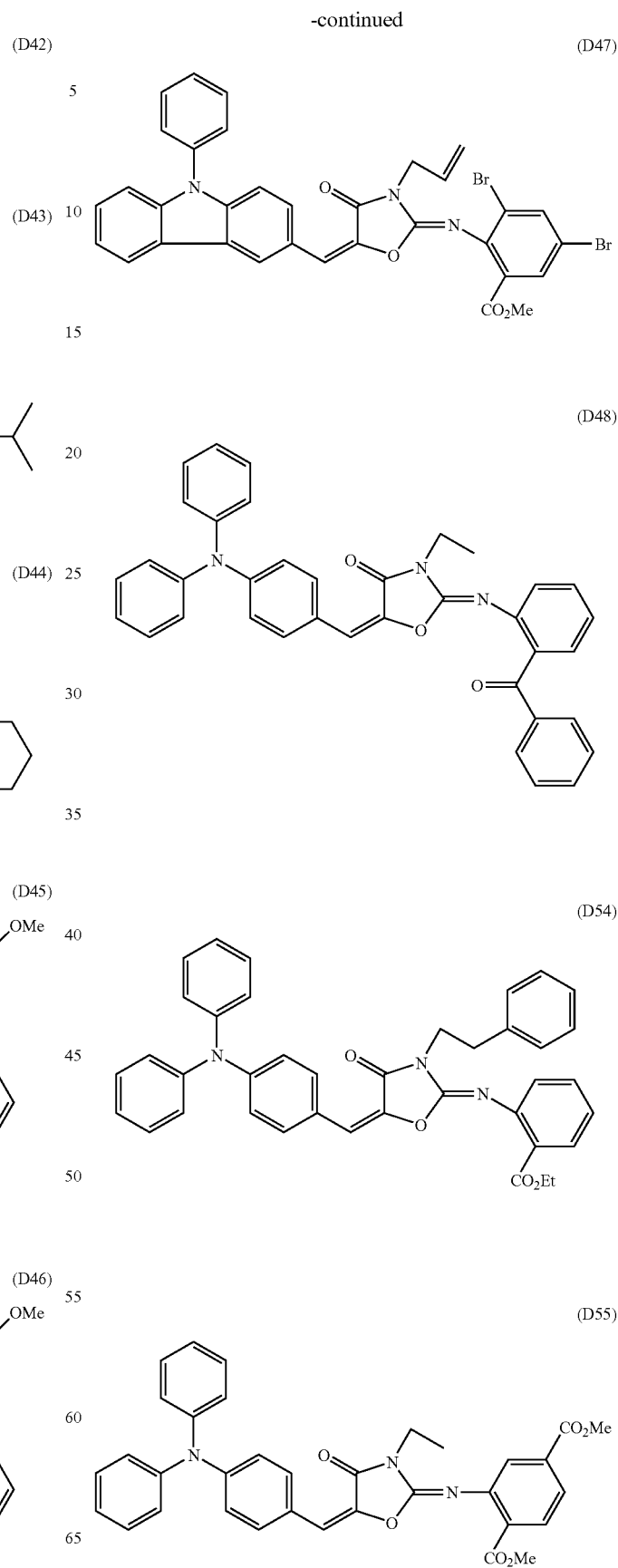

-continued (D56)
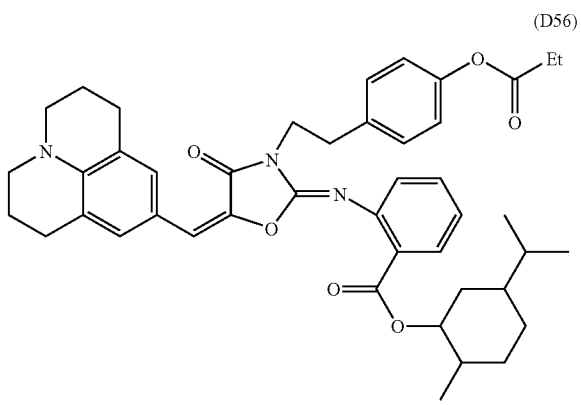

(D57)
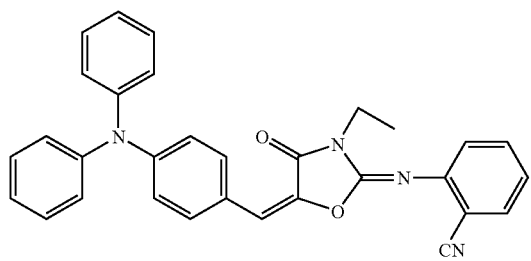

(D58)
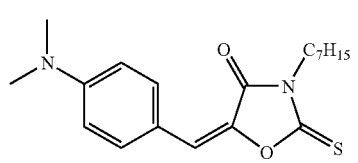

(D59)
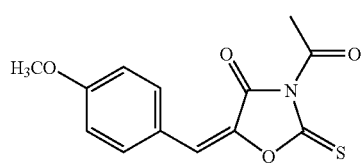

(D60)
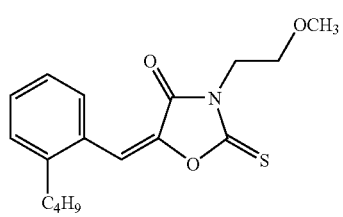

-continued (D61)
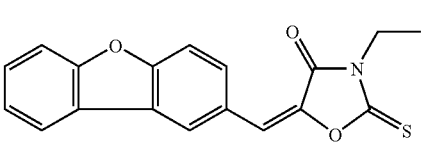

Among these sensitizing dyes which can be used in the present invention, the compound represented by formula (XVIII) is preferred in view of sensitivity.

The above-described sensitizing dye can be subjected to various chemical modifications described below for the purpose of improving the properties of the polymerizable composition of the present invention. For example, when the sensitizing dye is bonded to an addition-polymerizable compound structure (e.g., acryloyl group, methacryloyl group) by a method such as covalent bonding, ion bonding and hydrogen bonding, the strength of the crosslinked and cured film can be increased or the effect of preventing unnecessary precipitation of the dye from the crosslinked and cured film can be enhanced.

With respect to the pigment which is used as the sensitizing dye in the present invention, commercially available pigments and pigments described in *Color Index (C.I.) Binran* (*C.I. Handbook*), *Saishin Ganryo Binran* (*Handbook of Latest Pigments*), compiled by Nippon Ganryo Gijutsu Kyokai (1977), *Saishin Ganryo Ovo Gijutsu* (*Latest Pigment Application Technology*), CMC (1986), and *Insatsu Ink Gijutsu* (*Printing Ink Technology*), CMC (1984) may be used.

The kind of the pigment includes black pigment, yellow pigment, orange pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black. Among these pigments, carbon black is preferred.

These pigments each may or may not be surface-treated before use. The surface treatment may be performed by a method of coating resin or wax on the surface, a method of attaching a surface active agent, or a method of bonding a reactive substance (for example, silane coupling agent, an epoxy compound or polyisocyanate) to the pigment surface. These surface treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC (1984), and *Saishin Ganryo Oyo Gijutsu* (*Latest Pigment Application Technology*), CMC (1986).

The particle size of the pigment is, in view of dispersibility in the coating solution or uniformity of the recording layer, preferably from 0.01 to 10 μm, more preferably from 0.05 to 1 μm, still more preferably from 0.1 to 1 μm.

For dispersing the pigment, known dispersion techniques employed in the production of ink or toner may be used. Examples of the dispersing machine include ultrasonic disperser, sand mill, attritor, pearl mill, super-mill, ball mill, impeller, disperser, KD mill, colloid mill, dynatron, three-roll mill and pressure kneader. These are described in detail in *Saishin Ganryo Oyo Gijutsu* (*Latest Pigment Application Technology*), CMC (1986).

In the case of applying the polymerizable composition of the present invention to a lithographic printing plate precursor, (E) the sensitizing dye may be added together with other components of the recording layer to the same layer or even when a separate layer is provided and the sensitizing dye is added thereto, the same effect can be obtained. However, when a negative lithographic printing plate precursor is produced, the optical density of the recording layer at the absorption maximum in the wavelength range of 300 to 1,200 nm is preferably from 0.1 to 3.0. If the optical density is out of this range, the sensitivity tends to decrease. The optical density is determined by the amount of the sensitizing dye added and the thickness of the recording layer, and a predetermined optical density is obtained by controlling the conditions of these two factors.

The optical density of the recording layer can be measured by a normal method. Examples of the measuring method therefor include a method where a recording layer having a dry thickness resulting from appropriately determining the coated amount within the range necessary as a lithographic printing plate is formed on a transparent or white support and the optical density is measured by a transmission-type optical densitometer, and a method where a recording layer is formed on a reflective support such as an aluminum and the reflection density is measured.

The content of (E) the sensitizing dye contained in the polymerizable composition of the present invention is, in view of uniformity of the sensitizing dye dispersed in the composition and durability of the film formed, preferably from 0.01 to 50 mass %, more preferably from 0.1 to 30 mass %, and most preferably from 0.5 to 10 mass %, based on the entire solid content of the polymerizable composition.

The preferred components of the polymerizable composition of the present invention are as described above, but as for the preferred combination of these components, a composition where a compound represented by formula (G) is used as (A) the binder polymer and a compound represented by formula (XVIII) is contained as (E) the sensitizing dye is preferred, a composition where in addition, a lophine dimer compound or titanocene compound is used as (B) the radical generator is more preferred, and a compound where a lophine dimer compound is used as (B) the radical generator is most preferred.

[Other Components]

In addition to the above-described components, the polymerizable composition of the present invention may further appropriately contain other components suitable for usage, production method and the like of the polymerizable composition. Preferred additives are described below.

(Coloring Agent)

In the case of applying the polymerizable composition of the present invention to a lithographic printing plate precursor, a dye or a pigment may be added for the purpose of coloring the lithographic printing plate precursor. By this addition, so-called suitability for plate inspection of the printing plate, such as visibility after plate making or aptitude for image densitometer, can be enhanced. The coloring agent used here is preferably a pigment, because many dyes cause reduction in the sensitivity of the photopolymerization-system recording layer. Specific examples of the coloring agent include pigments such as phthalocyanine-based pigment, azo-based pigment, carbon black and titanium oxide, and dyes such as ethyl violet, crystal violet, azo-based dye, anthraquinone-based dye and cyanine-based dye. The amount of the dye or pigment added is preferably from about 0.5 to about 5 mass % based on the nonvolatile components in the entire composition.

(Other Additives)

Furthermore, known additives such as inorganic filler or plasticizer for improving the physical properties of the cured film, and in the case of applying the polymerizable composition to a lithographic printing plate precursor, ink receptivity agent capable of enhancing the inking property on the recording layer surface, may also be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin. The plasticizer may be added generally in an amount of 10 mass % or less based on the total mass of the polymer binder and the addition-polymerizable compound. In addition, UV initiator, heat crosslinking agent and the like may be added so as to strengthen the effect of heating/exposure performed after development for the purpose of enhancing the film strength (press life) which is described later.

[Production of Image Recording Material]

Various image recording materials where the polymerizable composition of the present invention is applied can be produced by dissolving the above-described constituent components in an appropriate organic solvent and coating the resulting solution on a support.

Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 mass %.

The coverage of the image recording layer has an effect mainly on sensitivity and developability of the image recording layer and strength and press life of the exposed film and therefore, an appropriate coverage is preferably selected according to use. If the coverage is too small, the press life is insufficient, whereas if it is excessively large, the sensitivity decreases, the exposure takes much time and the development also requires a longer time. For example, in the case of a lithographic printing plate precursor, the coverage of the recording layer is, in terms of the mass after drying, suitably from about 0.1 to about 10 g/m$^2$, more preferably from 0.5 to 5 g/m$^2$.

(Support)

As for the support of the image recording material to which the polymerizable composition of the present invention is applied, various supports can be used according to use without limitation, but a conventionally known hydrophilic support for use in lithographic printing plate precursors is preferred.

This support is preferably a dimensionally stable plate-like material and examples thereof include paper, paper laminated with plastic (e.g., polyethylene, polypropylene, polystyrene), metal sheet (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with such a metal. If desired, the surface of this support may be subjected to a known appropriate physical or chemical treatment so as to, for example, impart hydrophilicity or enhance the strength.

Among those supports, preferred are paper, polyester film and aluminum plate, and more preferred is aluminum plate because this is dimensionally stable and relatively inexpensive and can provide a surface excellent in the hydrophilicity and strength through a surface treatment as needed. Also, a composite sheet obtained by bonding an aluminum sheet on a polyethylene terephthalate film described in JP-B-48-18327 may be preferably used.

The aluminum plate is a metal sheet mainly comprising a dimensionally stable aluminum and is selected from a pure aluminum plate, an alloy plate mainly comprising aluminum and containing a trace of foreign elements, and a plastic film or paper laminated or deposited with aluminum (or alloy). In the following, these supports comprising aluminum or an aluminum support are collectively called an aluminum support. Examples of the foreign element contained in the aluminum alloy include silicon, iron, manganese, copper, magnesium, chromium, zinc, bismuth, nickel and titanium. The content of the foreign elements in the aluminum alloy is 10 mass % or less. In the present invention, a pure aluminum plate is suitable, but since completely pure aluminum is difficult to produce in view of refining technique, aluminum containing trace foreign elements may be used. In this way, the aluminum plate used in the present invention is not particularly limited in its composition, and an aluminum plate formed of conventionally known and employed materials, such as JIS A 1050, JIS A 1100, JIS A 3103 and JIS A 3005, can be appropriately used.

The thickness of the aluminum support for use in the present invention is approximately from 0.1 to 0.6 mm. This thickness can be appropriately adjusted according to use of the polymerizable composition of the present invention. For example, in the case of applying the polymerizable composition of the present invention to a lithographic printing plate precursor, the thickness can be appropriately changed according to size of the printing press, size of the printing plate and request of the user. If desired, the aluminum support may be subjected to an appropriate surface treatment which is described later, or, of course, may not be subjected to such a surface treatment.

<Surface-Roughening Treatment>

The surface-roughening treatment method includes mechanical surface-roughening, chemical surface-roughening, electrolytic surface-roughening and the like as disclosed in JP-A-56-28893. Furthermore, an electrochemical surface-roughening method of electrochemically roughening the surface in a hydrochloric acid or nitric acid electrolytic solution, or a mechanical surface-roughening method such as ball graining method of graining the aluminum surface with polishing balls and an abrasive, and brush graining method of roughening the surface with a nylon brush and an abrasive, may be used. These surface-roughening methods may be used individually or in combination. Among these, the method useful for the surface roughening is an electrochemical method of chemically roughening the surface in a hydrochloric acid or nitric acid electrolytic solution, where the quantity of electricity at the anode time is suitably from 50 to 400 $C/dm^2$. More specifically, AC and/or DC electrolysis is preferably performed in an electrolytic solution containing from 0.1 to 50% of hydrochloric acid or nitric acid under the conditions such that the temperature is from 20 to 80° C., the treating time is from 1 second to 30 minutes and the current density is from 100 to 400 $C/dm^2$.

The surface-roughened aluminum plate may be chemically etched with an acid or an alkali. The etching agent which is suitably used is sodium hydroxide, sodium carbonate, sodium aluminate, sodium metasilicate, sodium phosphate, potassium hydroxide, lithium hydroxide or the like. The concentration and the temperature are preferably from 1 to 50% and from 20 to 100° C., respectively. After the etching, pickling is performed so as to remove smut remaining on the surface. Examples of the acid used therefor include nitric acid, sulfuric acid, phosphoric acid, chromic acid, hydrofluoric acid and borofluoric acid. In particular, as for the method of removing smut after the electrochemical surface-roughening treatment, a method of contacting the support surface with 15 to 65 mass % of sulfuric acid at a temperature of 50 to 90° C. described in JP-A-53-12739, and a method of alkali-etching the support surface described in JP-B-48-28123 are preferred. As long as the center line average roughness Ra on the treated surface after such treatments is preferably from 0.2 to 0.5 μm, the method and the conditions are not particularly limited.

<Anodization Treatment>

The thus-treated aluminum support is then preferably subjected to an anodization treatment.

In the anodization treatment, a sole aqueous solution of sulfuric acid, phosphoric acid, oxalic acid, or boric acid/sodium borate, or a combination of multiple kinds of such aqueous solutions is used as the main component of the electrolytic bath. At this time, the electrolytic solution may, of course, contain the components usually contained at least in aluminum alloy plate, electrode, tap water, underground water and the like. In the electrolytic solution, second and third components may be further added. Examples of the second and third components as used herein include cations such as metal (e.g., Na, K, Mg, Li, Ca, Ti, Al, V, Cr, Mn, Fe, Co, Ni, Cu, Zn) ion and ammonium ion, and anions such as nitrate ion, carbonate ion, chloride ion, phosphate ion, fluoride ion, sulfite ion, titanate ion, silicate ion and borate ion. The concentration of such ion is approximately from 0 to 10,000 ppm. The conditions for the anodization treatment are not particularly limited, but the treatment is preferably performed by DC or AC electrolysis at a concentration of 30 to 500 g/liter, a treating solution temperature of 10 to 70° C. and a current density of 0.1 to 40 $A/m^2$. The thickness of the anodic oxide film formed is from 0.5 to 1.5 μm, preferably from 0.5 to 1.0 μm. The treating conditions are preferably selected such that the micropores present in the anodic oxide film on the thus-treated support have a pore diameter of 5 to 10 nm and a pore density of $8 \times 10^{15}$ to $2 \times 10^{16}$ $pores/m^2$.

As for the hydrophilization treatment of the support surface, various known methods can be used. In particular, a hydrophilization treatment with silicate, polyvinylphosphonic acid or the like is preferred. The film is formed, in terms of the amount of Si or P element, in an amount of 2 to 40 mg/m$^2$, more preferably from 4 to 30 mg/m$^2$. The amount coated can be measured by a fluorescent X-ray analysis method.

The hydrophilization treatment is performed by dipping the aluminum support having formed thereon an anodic oxide film in an aqueous alkali metal silicate or polyvinylphosphonic acid solution having a concentration of 1 to 30 mass %, preferably from 2 to 15 mass %, and having a pH at 25° C. of 10 to 13, for example, at a temperature of 15 to 80° C. for 0.5 to 120 seconds.

As for the alkali metal silicate used in the hydrophilization treatment, sodium silicate, potassium silicate, lithium silicate or the like is used. Examples of the hydroxide which is used for elevating the pH of the aqueous alkali metal silicate solution include sodium hydroxide, potassium hydroxide, and lithium hydroxide. In the treating solution, an alkaline earth metal salt or a Group IVB metal salt may be blended. Examples of the alkaline earth metal salt include water-soluble salts such as nitrate (e.g., calcium nitrate, strontium nitrate, magnesium nitrate, barium nitrate), sulfate, hydrochloride, phosphate, acetate, oxalate and borate. Examples of the Group IVB metal salt include titanium tetrachloride, titanium trichloride, titanium potassium fluoride, titanium potassium oxalate, titanium sulfate, titanium tetraiodide, zirconium chloride oxide, zirconium dioxide, zirconium oxychloride and zirconium tetrachloride.

The alkaline earth metal salts and Group IVB metal salts can be used individually or in combination of two or more thereof. The amount of the metal salt added is preferably from 0.01 to 10 mass %, more preferably from 0.05 to 5.0 mass %. Furthermore, silicate electrodeposition described in U.S. Pat. No. 3,658,662 is also effective. In addition, a surface treatment combining a support subjected to electrolytic graining disclosed in JP-B-46-27481, JP-A-52-58602 and JP-A-52-30503 with the above-described anodization treatment and hydrophilization treatment is also useful.

(Interlayer)

In the image recording material to which the polymerizable composition of the present invention is applied, an interlayer (also called an undercoat layer) may be provided for the purpose of improving adhesion between the image recording layer and the support or improving smutting resistance. Specific examples of the interlayer include those described in JP-B-50-7481, JP-A-54-72104, JP-A-59-101651, JP-A-60-149491, JP-A-60-232998, JP-A-3-56177, JP-A-4-282637, JP-A-5-16558, JP-A-5-246171, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282682, JP-A-11-84674, and Japanese Patent Application Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091 and 2000-14697.

(Protective Layer)

In the image recording material to which the polymerizable composition of the present invention is applied, a protective layer (also called an overcoat layer) is preferably further provided on the image recording layer, because the exposure for recording an image is usually performed in air. In particular, when the polymerizable composition of the present invention is applied to a lithographic printing plate precursor, a preferred embodiment is to provide such a protective layer on the recording layer. The protective layer prevents low molecular compounds such as oxygen and basic substance present in air, which inhibit the image-formation reaction caused in the recording layer upon exposure, from mixing into the recording layer and thereby enables exposure in air. Accordingly, the properties required of this protective layer are to have low permeability to low molecular compounds such as oxygen, substantially not inhibit transmission of light used for exposure, exhibit excellent adhesion to the recording layer and be easily removable in the development step after exposure.

Various designs have been conventionally made on such a protective layer and this is described in detail in U.S. Pat. No. 3,458,311 and JP-B-55-49729. The material which can be used for the protective layer is, for example, preferably a water-soluble polymer compound having relatively excellent crystallinity. Specifically, water-soluble polymers such as polyvinyl alcohol, polyvinylpyrrolidone, acidic celluloses, gelatin, gum arabic and polyacrylic acid are known. Among these, polyvinyl alcohol is preferably used as the main component, because most advantageous results can be given to the fundamental properties such as oxygen blocking property and development removability. The polyvinyl alcohol for use in the protective layer may be partially displaced by an ester, an ether or an acetal as long as it contains an unsubstituted vinyl alcohol unit necessary for ensuring oxygen blocking property and water solubility. Similarly, the polyvinyl alcohol may have another copolymerization component in a partial portion. Particularly, a mixture where polyvinylpyrrolidone is displacing from 15 to 50 mass % of the polyvinyl alcohol is preferred in view of storage stability.

Examples of the polyvinyl alcohol include those having a hydrolysis degree of 71 to 100% and a molecular weight of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components (e.g., selection of PVA, use of additives), coated amount and the like of the protective layer are selected by taking account of fogging, adhesion and scratch resistance in addition to oxygen blocking property and development removability. In general, as PVA has a higher hydrolysis ratio (namely, the protective layer has a higher content of unsubstituted vinyl alcohol unit) and the layer thickness is larger, the oxygen blocking property is more intensified and this is more advantageous in view of sensitivity. However, if the oxygen blocking property is extremely intensified, an unnecessary polymerization reaction may occur during production or stock storage, or problems such as unnecessary fogging or thickening of image line may be caused at the image exposure. The adhesion to the image area and the scratch resistance are also very important in view of handling of the printing plate. That is, when a hydrophilic layer comprising a water-soluble polymer is stacked on a lipophilic recording layer, layer separation readily occurs due to insufficient adhesion and the separated portion causes defects such as film curing failure due to polymerization inhibition by oxygen. To overcome this problem, various proposals have been made to improve the adhesive property between those two layers. For example, U.S. Pat. Nos. 292,501 and 44,563 describe a technique of mixing from 20 to 60 mass % of an acrylic emulsion or water-insoluble vinylpyrrolidone-vinyl acetate copolymer in a hydrophilic polymer mainly comprising polyvinyl alcohol and stacking it on the recording layer, thereby obtaining a sufficiently high adhesive property.

These known techniques all can be applied to the protective layer for use in the present invention. The method for coating such a protective layer is described in detail, for example, in U.S. Pat. No. 3,458,311 and JP-B-55-49729.

In the image recording material to which the polymerizable composition of the present invention, an image can be recorded through at least exposure and development processes. Particularly, when the polymerizable composition of the present invention is applied to a lithographic printing plate precursor, the following exposure and development processes and, if desired, other processes are performed, whereby a printing plate is produced.

The production of a printing plate when the polymerizable composition of the present invention is applied to a lithographic printing plate precursor is described in detail below.

As for the light source used for exposure of a lithographic printing plate precursor in the present invention, known light sources can be used without limitation. The light source preferably has a wavelength of 300 nm to 1,200 nm. Specifically, various lasers are suitably used as the light source. In particular, an infrared laser at a wavelength of 780 to 1,200 nm is preferred.

The exposure mechanism may be any one of an internal drum system, an external drum system, a flat bed system and the like.

Other examples of the exposure light which can be used for the lithographic printing plate precursor in the present invention include ultrahigh-pressure, high-pressure, medium-pressure and low-pressure mercury lamps, a chemical lamp, a carbon arc lamp, a xenon lamp, a metal halide lamp, various laser lamps of emitting visible or ultraviolet light, a fluorescent lamp, a tungsten lamp and sunlight.

In the present invention, the lithographic printing plate precursor is developed after exposure. The developer used for such development is preferably an aqueous alkali solution having a pH of 14 or less, more preferably an aqueous alkali solution having a pH of 8 to 12 and containing an anionic surfactant. Examples of the alkali include inorganic alkali agents such as sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogen-carbonate, sodium borate, potassium borate, ammonium borate, sodium hydroxide, ammonium hydroxide, potassium hydroxide and lithium hydroxide. In addition, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine may also be used. These alkali agents are used individually or in combination of two or more thereof.

In the present invention, an anionic surfactant is added to the developing solution for use in the development of the lithographic printing plate precursor, in an amount of from 1 to 20 mass %, preferably from 3 to 10 mass %. If the amount added is too small, developability is impaired, whereas if too large, adverse effects result, for example, the image strength such as abrasion resistance deteriorates. Examples of the anionic surfactant include higher alcohol sulfates having from 8 to 22 carbon atoms, such as sodium salt of lauryl sulfate, ammonium salt of lauryl alcohol sulfate, sodium salt of octyl alcohol sulfate, alkylaryl sulfonates (e.g., sodium salt of isopropylnaphthalenesulfonic acid, sodium salt of isobutylnaphthalenesulfonic acid, sodium salt of polyoxyethylene glycol mononaphthylether sulfate, sodium salt of dodecylbenzenesulfonic acid, sodium salt of metanitrobenzenesulfonic acid) and secondary sodium alkyl sulfate; aliphatic alcohol phosphate salts such as sodium salt of cetyl alcohol phosphate; sulfonic acid salts of alkylamide, such as $C_{17}H_{33}CON(CH_3)CH_2CH_2SO_3Na$; and sulfonic acid salts of dibasic aliphatic ester, such as sodium dioctyl sulfosuccinate and sodium dihexyl sulfosuccinate.

If desired, an organic solvent capable of mixing with water, such as benzyl alcohol, may be added to the developer. The organic developer suitably has a water solubility of about 10 mass % or less, preferably 5 mass % or less. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. The organic solvent content is preferably from 1 to 5 mass % based on the total mass of the developer on use. The amount of the organic solvent used has close relationship with the amount of the surfactant used and as the amount of the organic solvent increases, the amount of the anionic surfactant is preferably increased, because if the organic solvent is used in a large amount in the state of the anionic surfactant being in a small amount, the organic solvent does not dissolve and good developability cannot be ensured.

Furthermore, if desired, additives such as defoaming agent and softening agent for hard water may be contained. Examples of the softening agent for hard water include polyphosphates such as $Na_2P_2O_7$, $Na_5P_3O_3$, $Na_3P_3O_9$, $Na_2O_4P(NaO_3P)PO_3Na_2$ and Calgon (sodium polymetaphosphate); aminopolycarboxylic acids (e.g., ethylenediaminetetraacetic acid, and potassium and sodium salts thereof; diethylenetriaminepentaacetic acid, and potassium and sodium salts thereof; triethylenetetraminehexaacetic acid, and potassium and sodium salts thereof; hydroxyethylethylenediaminetriacetic acid, and potassium and sodium salts thereof; nitrilotriacetic acid, and potassium and sodium salts thereof; 1,2-diaminocyclohexanetetraacetic acid, and potassium and sodium salts thereof; and 1,3-diamino-2-propanoltetraacetic acid, and potassium and sodium salts thereof), other polycarboxylic acids (e.g., 2-phosphonobutanetricarboxylic acid-1,2,4, and potassium and sodium salts thereof; 2-phosphonobutanonetricarboxylic acid-2,3,4, and potassium and sodium salts thereof), and organic phosphonic acids (e.g., 1-phosphonoethanetricarboxylic acid-1,2,2, and potassium and sodium salts thereof; 1-hydroxyethane-1,1-diphosphonic acid, and potassium and sodium salts thereof; aminotri(methylenephosphonic acid), and potassium and sodium salts thereof). The optimal amount of the softening agent for hard water varies depending on the hardness and amount of the hard water used, but the softening agent is generally contained in an amount of 0.01 to 5 mass %, preferably from 0.01 to 0.5 mass %, based on the developer on use.

In the case of developing the lithographic printing plate precursor by using an automatic developing machine, the developer becomes exhausted according to the amount processed and therefore, its processing ability may be recovered by using a replenisher or a fresh developer. In this case, the replenisher or fresh developer is preferably supplied by the method described in U.S. Pat. No. 4,882,246. The developers described in JP-A-50-26601, JP-A-58-54341, JP-B-56-39464, JP-B-5642860 and JP-B-57-7427 are also preferred.

The thus-developed lithographic printing plate precursor may be after-treated with washing water, a rinsing solution containing surfactant or the like, or a desensitizing solution containing gum arabic, starch derivative or the like as described in JP-A-54-8002, JP-A-55-115045 and JP-A-59-58431. In the present invention, the after-treatment of the lithographic printing plate precursor may be performed by variously combining these treatments.

In the process of producing a printing plate from the lithographic printing plate precursor according to the present invention, the entire surface may be heated, if desired, before or during the exposure or between the exposure and the development. This heating is advantageous in that the image formation reaction in the recording layer is accelerated, the sensitivity and press life are enhanced, and the sensitivity is stabilized. Furthermore, for the purpose of improving the image strength and press life, it is also effective to subject the entire surface of the developed image to post-heating or exposure.

Usually, the heating before the development is preferably performed under a mild condition of 150° C. or less. If the temperature is excessively high, problems such as occurrence of an undesired curing reaction in the non-image area are caused. The heating after the development uses a very severe condition of usually from 200 to 500° C. If the temperature of heating after development is low, a sufficiently high effect of strengthening the image cannot be obtained, whereas if it is excessively high, there may arise problems such as deterioration of the support or thermal decomposition of the image area.

The lithographic printing plate obtained through such treatments is mounted on an off-set printer and used for printing a large number of sheets.

As for the plate cleaner used for removing scum on the plate at the printing, a conventionally known plate cleaner for PS plates is used and examples thereof include CL-1, CL-2, CP, CN-4, CN, CG-1, PC-1, SR and IC (all produced by Fuji Photo Film Co., Ltd.).

EXAMPLES

The present invention is described below by referring to Examples, but the present invention should not be construed as being limited thereto.

Synthesis Example of (A) Specific Binder Polymer

Synthesis Example 1

Specific Polyurethane Resin P-1

In a 500 ml-volume three-neck round-bottomed flask equipped with a condenser and a stirrer, 8.2 g (0.05 mol) of 2,2-bis(hydroxymethyl)butanoic acid and 13.0 g (0.05 mol) of Diol Compound (1) shown below were dissolved in 100 ml of N,N-dimethylacetamide. To this solution, 25.5 g (0.102 mol) of 4,4-diphenylmethane diisocyanate and 0.1 g of dibutyltin dilaurate were added. The resultant mixture was stirred under heat at 100° C. for 8 hours. Thereafter, the reaction solution was diluted with 100 ml of N,N-dimethylformamide and 200 ml of methyl alcohol and then stirred for 30 minutes. This reaction solution was charged into 3 liter of water with stirring to precipitate a white polymer. This polymer was separated by filtration, washed with water and then dried in vacuum to obtain 37 g of the polymer. The specific polyurethane resin synthesized is shown as (P-1) in the Table below.

The molecular weight thereof was measured by gel permeation chromatography (GPC) and found to be 95,000 in terms of the weight average molecular weight (polystyrene standard).

Synthesis Example 2

Specific Polyurethane Resin P-5

In a 500 ml-volume three-neck round-bottomed flask equipped with a condenser and a stirrer, 5.9 g (0.04 mol) of 2,2-bis(hydroxymethyl)butanoic acid and 15.9 g (0.06 mol) of Diol Compound (2) shown below were dissolved in 100 ml of N,N-dimethylacetamide. To this solution, 20.4 g (0.082 mol) of 4,4-diphenylmethane diisocyanate, 3.4 g (0.02 mol) of 1,6-hexamethylene diisocyanate and 0.1 g of dibutyltin dilaurate were added. The resultant mixture was stirred under heat at 100° C. for 8 hours. Thereafter, the reaction solution was diluted with 100 ml of N,N-dimethylformamide and 200 ml of methyl alcohol and then stirred for 30 minutes. This reaction solution was charged into 3 liter of water with stirring to precipitate a white polymer. This polymer was separated by filtration, washed with water and then dried in vacuum to obtain 34 g of the polymer. The specific polyurethane resin synthesized is shown as (P-5) in the Table below.

The molecular weight thereof was measured by gel permeation chromatography (GPC) and found to be 99,000 in terms of the weight average molecular weight (polystyrene standard).

Synthesis Example 3

Specific Polyurethane Resin P-6

In a 500 ml-volume three-neck round-bottomed flask equipped with a condenser and a stirrer, 5.4 g (0.04 mol) of 2,2-bis(hydroxymethyl)propionic acid and 15.6 g (0.06 mol) of Diol Compound (3) shown below were dissolved in 100 ml of N,N-dimethylacetamide. To this solution, 21.4 g (0.102 mol) of naphthalene diisocyanate and 0.1 g of dibutyltin dilaurate were added. The resultant mixture was stirred under heat at 100° C. for 8 hours. Thereafter, the reaction solution was diluted with 100 ml of N,N-dimethylformamide and 200 ml of methyl alcohol and then stirred for 30 minutes. This reaction solution was charged into 3 liter of water with stirring to precipitate a white polymer. This polymer was separated by filtration, washed with water and then dried in vacuum to obtain 34 g of the polymer. The specific polyurethane resin synthesized is shown as (P-6) in the Table below.

The molecular weight thereof was measured by gel permeation chromatography (GPC) and found to be 96,000 in terms of the weight average molecular weight (polystyrene standard).

Diol compound (1):

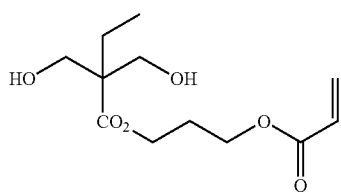

Diol compound (2):

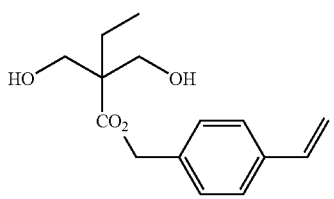

Diol compound (3):

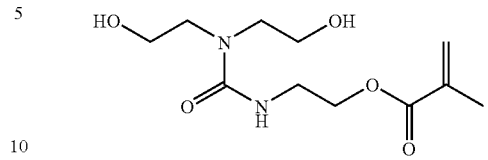

Specific Polyurethane Resins (P-2) to (P-4) and (P-7) to (P-20) were synthesized in the same manner as in Synthesis Examples 1 to 3 by using a diisocyanate compound and a diol compound shown in Tables 1 to 5 below. In Tables 1 to 5, the measurement results of the molecular weight by GPC are also shown.

Other polyurethane resins can be synthesized by almost the same scheme.

TABLE 1

| Polymer No. | Diisocyanate Compound Used (mol %) | Diol Compound Used (mol %) | Weight Average Molecular Weight |
|---|---|---|---|
| P-1 | OCN—C₆H₄—CH₂—C₆H₄—NCO  100 | HOCH₂-C(Et)(CH₂OH)-CO₂-(CH₂)₃-O₂C-CH=CH₂  50  <br> HOCH₂-C(Et)(CH₂OH)-CO₂H  50 | 95,000 |
| P-2 | OCN—C₆H₄—CH₂—C₆H₄—NCO  80 <br> OCN-(CH₂)₆-NCO  20 | HOCH₂-C(Et)(CH₂OH)-CO₂-(CH₂)₃-O₂C-CH=CH₂  50 <br> HOCH₂-C(Et)(CH₂OH)-CO₂H  50 | 98,000 |

TABLE 1-continued
| Polymer No. | Diisocyanate Compound Used (mol %) | Diol Compound Used (mol %) | Weight Average Molecular Weight |
|---|---|---|---|
| P-3 | 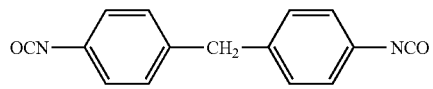 80 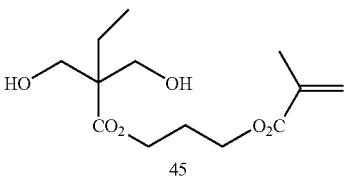 20 | 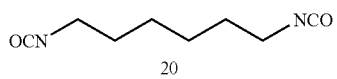 45 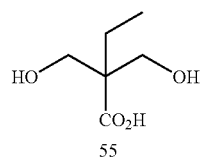 55 | 103,000 |
| P-4 | 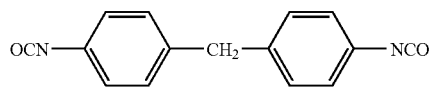 100 | 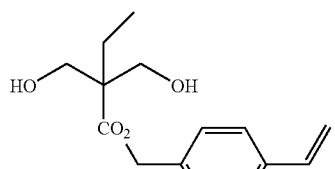 50 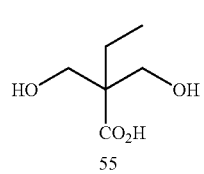 55 | 108,000 |
| P-5 | 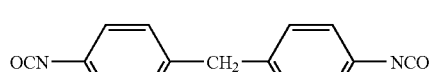 80 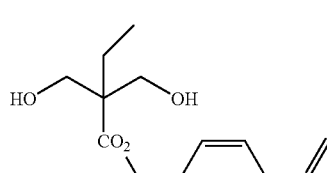 20 | 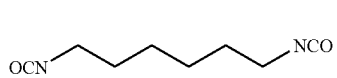 60 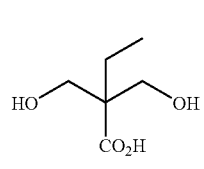 40 | 99,000 |

TABLE 2

| Polymer No. | Diisocyanate Compound Used (mol %) | Diol Compound Used (mol %) | Weight Average Molecular Weight |
|---|---|---|---|
| P-6 | 1,5-naphthalene diisocyanate (100) | HOCH$_2$CH$_2$-N(CH$_2$CH$_2$OH)-C(=O)-NH-CH$_2$CH$_2$-O-C(=O)-C(CH$_3$)=CH$_2$ (60) / 2,2-bis(hydroxymethyl)propionic acid (40) | 79,000 |
| P-7 | 1,5-naphthalene diisocyanate (80) / 1,6-hexamethylene diisocyanate (20) | 1,2,4,5-benzenetetracarboxylic acid tetraester with 4-hydroxybutyl vinyl ether and 2-hydroxyethyl (50) / 2,2-bis(hydroxymethyl)propionic acid (50) | 68,000 |
| P-8 | 4,4'-methylenebis(phenyl isocyanate) (80) / 1,6-hexamethylene diisocyanate (20) | bis(hydroxymethyl)-substituted diester with 4-vinylbenzyl and 4-hydroxybutyl vinyl ether (50) / 2,2-bis(hydroxymethyl)butyric acid (50) | 96,000 |
| P-9 | 2,4-tolylene diisocyanate (100) | HOCH$_2$CH$_2$-N(CH$_2$CH$_2$OH)-C(=O)-NH-CH$_2$CH$_2$-O-C(=O)-C(CH$_3$)=CH$_2$ (65) / 2,2-bis(hydroxymethyl)propionic acid (35) | 100,000 |

TABLE 3

| Polymer No. | Diisocyanate Compound Used (mol %) | Diol Compound Used (mol %) | Weight Average Molecular Weight |
|---|---|---|---|
| P-10 | OCN—C6H4—CH2—C6H4—NCO (80); OCN—(CH2)6—NCO (20) | HOCH2—C(Et)(CH2OH)—CH2—O—CH2CH=CH2 (30); HOCH2—C(Et)(CH2OH)—CO2—(CH2)4—O2C—CH=CH2 (20); HOCH2—C(Et)(CH2OH)—CO2H (50) | 69,000 |
| P-11 | OCN—C6H4—CH2—C6H4—NCO (80); OCN—(CH2)6—NCO (20) | HOCH2—C(Et)(CH2OH)—CO2—(CH2)4—O2C—CH=CH2 (70); benzene-1,2,4,5-tetracarboxylic acid bis(2-hydroxyethyl) diester (30) | 120,000 |

TABLE 3-continued
| Polymer No. | Diisocyanate Compound Used (mol %) | Diol Compound Used (mol %) | Weight Average Molecular Weight |
|---|---|---|---|
| P-12 | 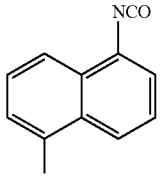 80<br><br>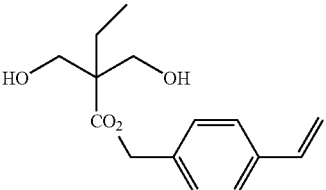 20 | 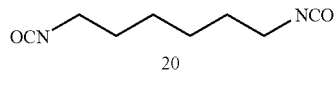<br><br>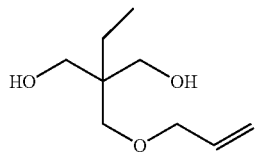<br><br>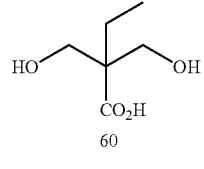 60 | 78,000 |
| P-13 | 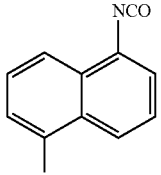 80<br><br>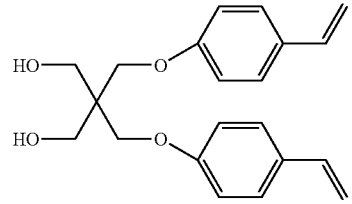 20 | 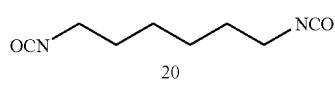<br><br>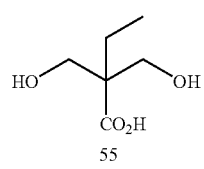 55 | 103,000 |

TABLE 4

| Polymer No. | Diisocyanate Compound Used (mol %) | Diol Compound Used (mol %) | Weight Average Molecular Weight |
|---|---|---|---|
| P-14 | OCN-C6H4-CH2-C6H4-NCO (70) / 3,5-bis(OCNH2C)-C6H3-CH2-NH-C(=O)-O-CH2CH2-O2C-CH=CH2 (30) | HO-(CH2)4-OH (60) / HOCH2-C(Et)(CO2H)-CH2OH (40) | 65,000 |
| P-15 | OCN-C6H4-CH2-C6H4-NCO (65) / OCN-(CH2)6-N(NHCO-)-(CH2)6-NCO with -C(=O)-O-CH2CH2-O2C-CH=CH2 (35) | HO-(CH2)4-OH (65) / HOCH2-C(Et)(CO2H)-CH2OH (35) | 78,000 |
| P-16 | OCN-C6H4-CH2-C6H4-NCO (70) / 3,5-bis(OCNH2C)-C6H3-CH2-NH-C(=O)-NH-C6H4-CH=CH2 (30) | HOCH2-C(Et)(CO2-(CH2)4-O2C-CH=CH2)-CH2OH (40) / HOCH2-C(Et)(CO2H)-CH2OH (60) | 69,000 |

TABLE 5
| Polymer No. | Diisocyanate Compound Used (mol %) | Diol Compound Used (mol %) | Weight Average Molecular Weight |
|---|---|---|---|
| P-17 | 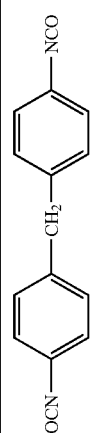 | 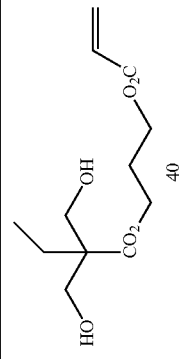 | 99,000 |
| P-18 | 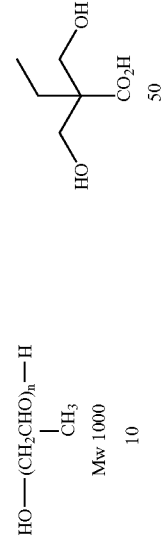 | 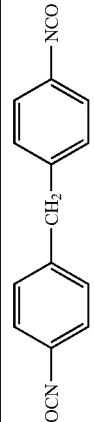 | 87,000 |

TABLE 5-continued
| Polymer No. | Diisocyanate Compound Used (mol %) | Diol Compound Used (mol %) | Weight Average Molecular Weight |
|---|---|---|---|
| P-19 | 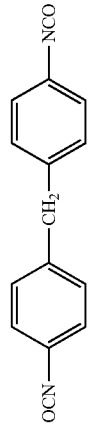 100 |  40    HO—(CH₂CH₂CH₂CH₂O)ₙ—H Mw 2000    10    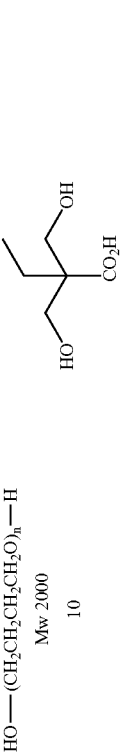 50 | 97,000 |
| P-20 | 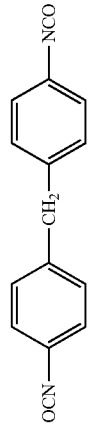 80     20 | 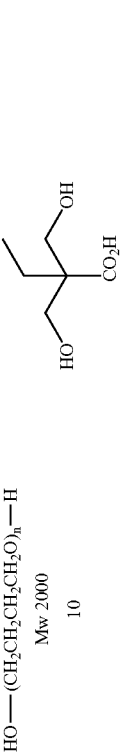 35    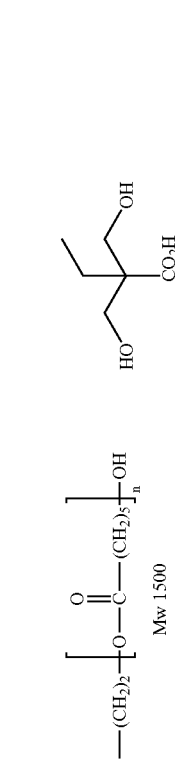 10    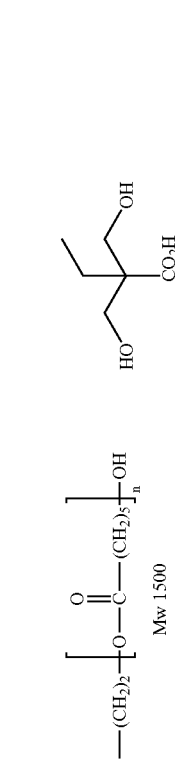 55 | 103,000 |

Synthesis Example 4

Specific Styrene-Based Resin P-21

120 g of commercially available poly(p-hydroxystyrene (Malkalinker S-1P, produced by Maruzen Petrochemical Co., Ltd., weight average molecular weight: 2,100) was weighed and dissolved in 400 ml of dimethylformamide (DMF). To this solution, 650 g of a 40% methanol solution of tetrabutylammonium hydroxide was added and 160 g of chloromethylstyrene was further added. The resultant mixture was stirred under heat at 70° C. for 2 hours in a nitrogen atmosphere. After cooling the reaction system to room temperature, the resultant uniform solution was poured in 3 liter of methanol, and the precipitated polymer was separated by decantation, thoroughly washed with methanol and then dried for one day and one night at room temperature in a vacuum dryer. To this polymer, 0.2 g of N-nitrosophenyl-hydroxylamine aluminum salt (Q-1301, produced by Wako Pure Chemical Industries, Ltd.) was added and dioxane was further added to give a solution having a solid content concentration of 20%. The structure of the obtained polymer was confirmed from proton NMR and FT-IR and this polymer was identified as Specific Styrene-Based Resin (P-21) having a structure shown below, where the phenolic hydroxyl group was almost completely bonded by chloromethylstyrene. The molecular weight thereof was measured by gel permeation chromatography (GPC) and found to be 50,000 in terms of the weight average molecular weight (polystyrene standard).

Specific Styrene-Based Resins (P-22) to (P-26) each having a structure shown below were synthesized in the same manner as in Synthesis Example 4 except for changing the starting material.

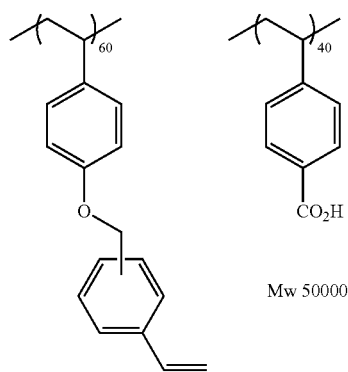

(P-21)

Mw 50000

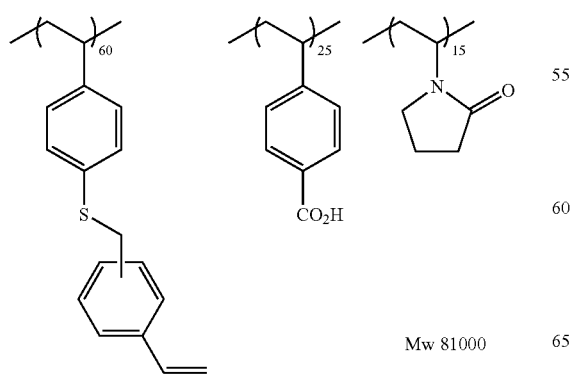

(P-22)

Mw 81000

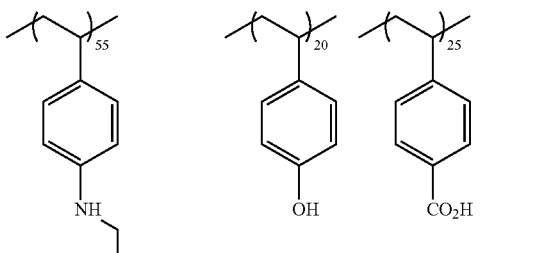

(P-23)

Mw 70000

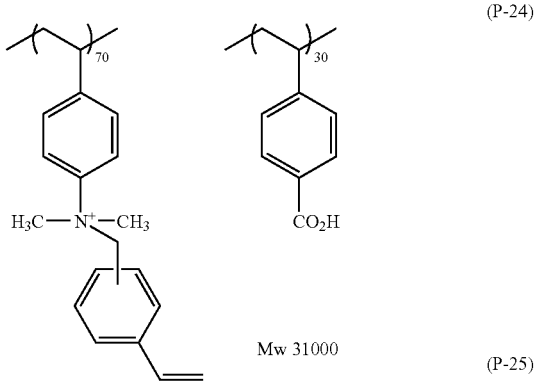

(P-24)

Mw 31000

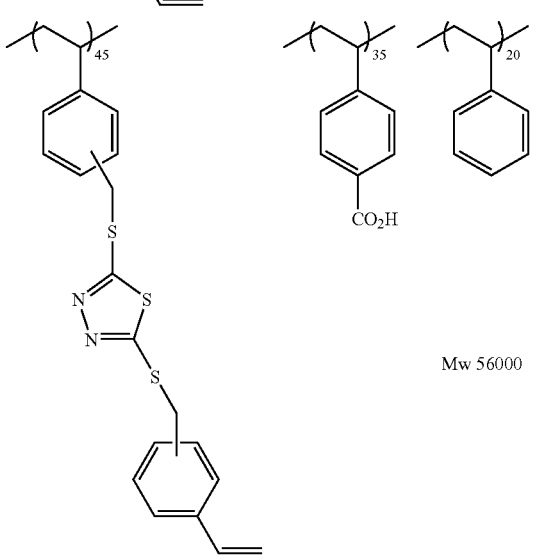

(P-25)

Mw 56000

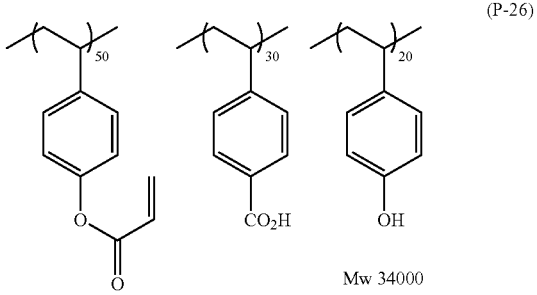

(P-26)

Mw 34000

Specific examples of the polyurethane resin using a diol compound containing the compound represented by formula (G) are set forth below.

TABLE 6
| Polymer No. | Diisocyanate Compound Used (mol %) | Diol Compound Used (mol %) | Weight Average Molecular Weight |
|---|---|---|---|
| P-27 | 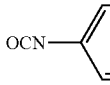 80<br>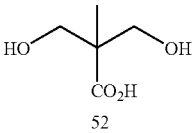 20 | 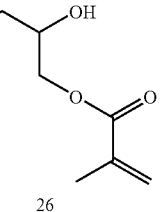 26<br>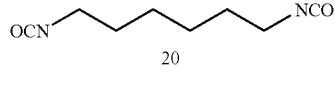 52<br>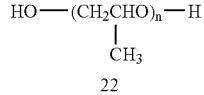 22 Mw 1000 | 60,000 |
TABLE 7
| Polymer No. | Diisocyanate Compound Used (mol %) | Diol Compound Used (mol %) | Weight Average Molecular Weight |
|---|---|---|---|
| P-28 | 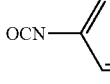 100 | 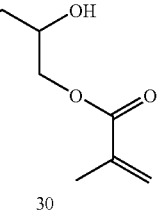 30<br>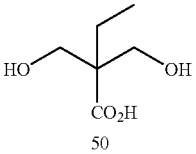 50<br>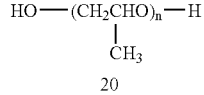 20 Mw 1500 | 70,000 |
| P-29 | 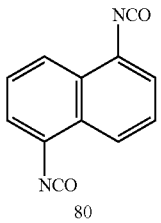 80<br>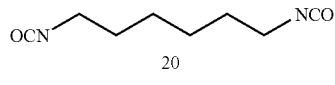 20 | 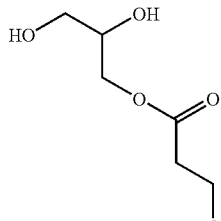 40<br>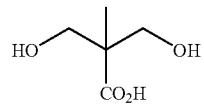 60 | 50,000 |

TABLE 8

| Polymer No. | Diisocyanate Compound Used (mol %) | Diol Compound Used (mol %) | Weight Average Molecular Weight |
|---|---|---|---|
| P-30 | OCN—C6H4—CH2—C6H4—NCO  80<br><br>OCN—(CH2)6—NCO  20 | HO-CH2-CH(OH)-CH2-O-C(=O)-C(CH3)=CH2 / HO-CH2-C(Et)(CH2OH)-CH2-O-CH2-CH=CH2  20<br>40<br><br>HO-CH2-C(Et)(CO2H)-CH2-OH  40 | 75,000 |
| P-31 | 1,5-naphthalene diisocyanate  100 | HO-CH2-CH(OH)-CH2-O-C(=O)-NH-CH2CH2-O-C(=O)-C(CH3)=CH2  35<br><br>HO—(CH2CHO)n—H with CH3 side chain  20  Mw 2000<br><br>HO-CH2-C(CH3)(CO2H)-CH2-OH  55 | 80,000 |

Synthesis Example 5

Comparative Binder Polymer (PC-1)

A propylene glycol monomethyl ether acetate (130 g) solution containing Light Ester HO-HS (produced by Kyoeisha Chemical Co., Ltd.) (92 g), methyl methacrylate (23 g) and dimethyl-2-2'-azobis(2-methylpropionate) (produced by Wako Pure Chemical Industries, Ltd.) (1.8 g) was added dropwise to propylene glycol monomethyl acetate (130 g) at 75° C. over 2.5 hours in a nitrogen stream. After the completion of dropwise addition, the resultant solution was further stirred at 75° C. for 2 hours. This solution was allowed to cool, then charged into water (4 liter) under vigorous stirring and stirred for 1 hour. The precipitated white solid was separated by filtration and dried to obtain Comparative Binder Polymer (PC-1) having a structure shown below.

Comparative Binder Polymer (PC-1) obtained was measured by a gel permeation chromatography method, as a result, the polystyrene-reduced weight average molecular weight was 45,000. Also, identification of Comparative Binder Polymer (PC-1) was performed by NMR and IR spectrum.

Comparative Binder Polymer (PC-2) having a structure shown below was synthesized in the same manner as in Synthesis Example 5 except for changing the starting material.

(PC-1):

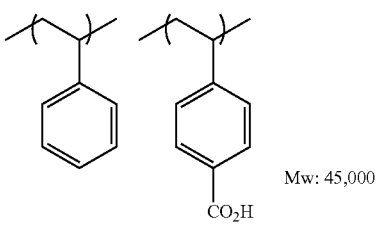

Mw: 45,000

(PC-2):

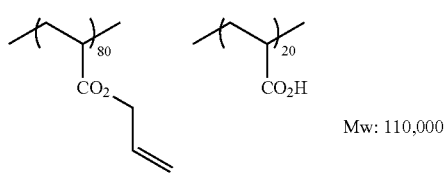

Mw: 110,000

Examples 1 to 40 and Comparative Examples 1 to 6

(Support 1: Preparation of Anodized Aluminum Support)

The surface of a 0.30 mm-thick aluminum plate made of material 1S was grained by using a No. 8 nylon brush and a water suspension of 800-mesh pumice stone, and then thoroughly washed with water. This aluminum plate was etched by dipping it in 10% sodium hydroxide at 70° C. for 60 seconds, then washed with running water, further washed with 20% $HNO_3$ for neutralization, and again washed with water. The resultant aluminum plate was subjected to an electrolytic surface-roughening treatment in an aqueous 1% nitric acid solution by using a sinusoidal alternating waveform current under the condition of $V'_A$=12.7 V with an anode time electricity quantity of 300 Coulomb/dm$^2$. The surface roughness thereof was measured and found to be 0.45 μm (Ra indication). Subsequently, the aluminum plate was dipped in an aqueous 30% $H_2SO_4$ solution, desmutted at 55° C. for 2 minutes, and then anodized in an aqueous 20% $H_2SO_4$ solution at 33° C. for 50 seconds with a current density of 5 A/dm$^2$ by disposing a cathode on the grained surface. The thickness of the anodic oxide film formed was 2.7 g/m$^2$.

(Support 2)

The following Undercoat Liquid Composition 1 for surface treatment was coated on Support 1 to have an Si coverage of about 0.001 g/m$^2$ and dried at 100° C. for 1 minute. The thus-treated support was designated as Support 2.

Then, the following undercoat liquid composition for surface treatment was coated on Support 1 to have an Si coverage of about 0.001 g/m$^2$ and dried at 100° C. for 1 minute.

(Undercoat Liquid Composition)

The following components were mixed and stirred and after about 5 minutes, heat was generated. The reaction was continued as-is for 60 minutes. Thereafter, the contents were transferred to another vessel and thereto 30,000 parts by mass of methanol was added to obtain an undercoat liquid composition.

<Formulation of Undercoat Liquid Composition>

| | |
|---|---|
| Phosmer PE produced by Uni-Chemical Co., Ltd. | 20 parts by mass |
| Methanol | 130 parts by mass |
| Water | 20 parts by mass |
| p-Toluenesulfonic acid | 5 parts by mass |
| Tetraethoxysilane | 50 parts by mass |
| 3-Methacryloxypropyltriethoxysilane | 50 parts by mass |

(Support 3)

An undercoat solution prepared by the following procedure was coated on Support 1.

The following composition was weighed into a beaker and stirred at 25° C. for 20 minutes.

<Formulation of Undercoat Liquid Composition 2>

| | |
|---|---|
| $Si(OC_2H_5)_4$ | 38 g |
| 3-Methacryloxypropyltrimethoxysilane | 13 g |
| Aqueous 85% phosphoric acid solution | 12 g |
| Ion exchanged water | 15 g |
| Methanol | 100 g |

The solution of Undercoat Liquid Composition 2 was transferred to a three-neck flask, a reflux condenser was fixed thereto, and the three-neck flask was dipped in an oil bath at room temperature. Thereafter, the bath temperature was elevated to 50° C. over 30 minutes while stirring the contents of the three-neck flask with a magnetic stirrer. The reaction was allowed to proceed for further 1 hour while keeping the bath temperature at 50° C. to obtain a liquid composition. The resultant solution was diluted with methanol/ethylene glycol (=20/1 by weight) to a concentration of 0.5 wt %, coated on the aluminum substrate by a whirler and dried at 100° C. for 1 minute to obtain Support 3. At this time, the coated amount was 3.0 mg/m$^2$. This coated amount was the amount of Si element determined by the fluorescent X-ray analysis method.

On the back surface (surface where Undercoat Liquid Composition 2 was not coated) of the thus-treated substrate, the following backcoat coating solution was coated by a bar coater and dried at 100° C. for 1 minute to provide a backcoat layer in a dry coated amount of 70 mg/m$^2$.

(Backcoat Coating Solution)

The following components (sol-gel reaction solution) were mixed and stirred and after about 5 minutes, heat was generated. The reaction was continued as-is for 60 minutes and thereto, Solution A containing the following components was added to prepare a backcoat coating solution.

<Sol-Gel Reaction Solution>

| | |
|---|---|
| Tetraethyl silicate | 50 parts by mass |
| Water | 20 parts by mass |
| Methanol | 15 parts by mass |
| Phosphoric acid | 0.05 parts by mass |

<Composition of Solution A>

| | |
|---|---|
| Pyrogallol-formaldehyde condensed resin (molecular weight: 2,000) | 4 parts by mass |
| Dimethyl phthalate | 5 parts by mass |
| Fluorine-containing surfactant (N-butylperfluorooctanesulfonamidoethyl acrylate/polyoxyethylene acrylate copolymer, molecular weight: 20,000) | 0.7 parts by mass |
| Methanol silica sol (produced by Nissan Chemical Industry, Ltd., methanol: 30 mass %) | 50 parts by mass |
| Methanol | 800 parts by mass |

(Formation of Recording Layer)

On the thus-treated aluminum support surface (surface where Undercoat Liquid Composition was coated), a coating solution for recording layer having the following composition was coated to have a dry coated amount of 1.5 g/m$^2$ and then dried at 100° C. for 1 minute to form a recording layer. The support used is shown in Tables 9 to 14 below.

<Coating Solution for Recording Layer>

| | |
|---|---|
| (A) Binder Polymer (compound shown in Tables 9 to 14) | 1.00 g |
| (B) Radical initiator (compound shown in Tables 9 to 14) | 0.05 g |
| (C) Compound having an ethylenically unsaturated bond (compound shown in Tables 9 to 14) | 1.00 g |

| -continued | |
|---|---|
| (D) Thermopolymerization inhibitor (compound shown in Tables 9 to 14) | 0.0005 g |
| (E) Sensitizing dye (compound shown in Tables 9 to 14) | 0.10 g |
| Additive [H-1] | 0.25 g |
| Fluorine-containing surfactant (Megafac F-177, produced by Dai-Nippon Ink & Chemicals, Inc.) | 0.02 g |
| ε-Type copper phthalocyanine dispersion | 0.20 g |
| Methyl ethyl ketone | 16.00 g |
| Propylene glycol monomethyl ether | 16.00 g |

The binder polymers used in Examples of Tables 9 to 14 below are (A) a specific binder polymer obtained by any one of the above-described Synthesis Examples, and the radical initiators used in Examples of Tables 9 to 14 are (B) a specific radical initiator according to the present invention.

TABLE 9

| | (A) Binder Polymer | (B) Radical Initiator | (C) Polymerizable Compound | (D) Polymerization Inhibitor | (E) Sensitizing Dye | Additive | Support/ Protective Layer |
|---|---|---|---|---|---|---|---|
| Example 1 | P-1 | B-1 | U-1 | none | E-2 | H-1 | 1/1 |
| Example 2 | P-2 | B-2 | U-1 | none | E-2 | H-1 | 1/1 |
| Example 3 | P-3 | B-5 | U-1 | none | E-2 | H-1 | 1/1 |
| Example 4 | P-3 | B-1 | U-1 | none | E-2 | H-1 | 1/1 |
| Example 5 | P-4 | B-3 | U-1 | none | E-2 | H-1 | 1/1 |
| Example 6 | P-5 | B-1 | U-1 | none | E-2 | H-1 | 1/1 |
| Example 7 | P-6 | B-2 | U-1 | none | E-2 | H-1 | 1/1 |
| Example 8 | P-7 | B-1 | U-1 | none | E-2 | H-1 | 1/1 |
| Example 9 | P-8 | B-4 | U-1 | none | E-2 | H-1 | 1/1 |
| Example 10 | P-9 | B-1 | U-1 | none | E-2 | H-1 | 1/1 |
| Example 11 | P-27 | B-1 | U-1 | none | E-2 | H-1 | 1/1 |
| Example 12 | P-27 | B-5 | U-1 | none | E-2 | H-1 | 1/1 |
| Example 13 | P-28 | B-1 | U-1 | none | E-2 | H-1 | 1/1 |
| Example 14 | P-27 | B-5 | U-1 | none | E-5 | H-1 | 1/1 |
| Example 15 | P-27 | B-6 | U-1 | none | E-5 | H-1 | 1/1 |
| Comparative Example 1 | (CP-1) | B-1 | U-1 | none | E-2 | H-1 | 1/1 |
| Comparative Example 2 | P-1 | (CB-2) | U-1 | none | E-2 | H-1 | 1/1 |
| Comparative Example 3 | (CP-2) | (CB-2) | U-1 | none | E-2 | H-1 | 1/1 |

| | | | Press Life/Scumming of Non-Image Area | | |
|---|---|---|---|---|---|
| | Exposure Wavelength | Developer | No Enforced Aging | 60° C., 3 Days | 45° C., Humidity: 75%, 3 Days |
| Example 1 | 400 | 2 | 80,000 sheets/no scum | 80,000 sheets/no scum | 80,000 sheets/no scum |
| Example 2 | 400 | 2 | 80,000 sheets/no scum | 80,000 sheets/no scum | 80,000 sheets/no scum |
| Example 3 | 400 | 2 | 105,000 sheets/no scum | 105,000 sheets/no scum | 105,000 sheets/no scum |
| Example 4 | 400 | 2 | 90,000 sheets/no scum | 90,000 sheets/no scum | 90,000 sheets/no scum |
| Example 5 | 400 | 2 | 70,000 sheets/no scum | 70,000 sheets/no scum | 70,000 sheets/no scum |
| Example 6 | 400 | 2 | 70,000 sheets/no scum | 70,000 sheets/no scum | 70,000 sheets/no scum |
| Example 7 | 400 | 2 | 90,000 sheets/no scum | 90,000 sheets/no scum | 90,000 sheets/no scum |
| Example 8 | 400 | 2 | 85,000 sheets/no scum | 85,000 sheets/no scum | 85,000 sheets/no scum |
| Example 9 | 400 | 2 | 79,000 sheets/no scum | 79,000 sheets/no scum | 79,000 sheets/no scum |
| Example 10 | 400 | 2 | 90,000 sheets/no scum | 90,000 sheets/no scum | 90,000 sheets/no scum |
| Example 11 | 400 | 2 | 106,000 sheets/no scum | 106,000 sheets/no scum | 106,000 sheets/no scum |
| Example 12 | 400 | 2 | 108,000 sheets/no scum | 108,000 sheets/no scum | 108,000 sheets/no scum |
| Example 13 | 400 | 2 | 106,000 sheets/no scum | 106,000 sheets/no scum | 106,000 sheets/no scum |
| Example 14 | 400 | 2 | 110,000 sheets/no scum | 110,000 sheets/no scum | 110,000 sheets/no scum |
| Example 15 | 400 | 2 | 115,000 sheets/no scum | 115,000 sheets/no scum | 115,000 sheets/no scum |
| Comparative Example 1 | 400 | 2 | 55,000 sheets/no scum | 55,000 sheets/scummed | 55,000 sheets/scummed |
| Comparative Example 2 | 400 | 2 | 50,000 sheets/no scum | 50,000 sheets/scummed | 50,000 sheets/no scum |
| Comparative Example 3 | 400 | 2 | 51,000 sheets/no scum | 51,000 sheets/no scum | 51,000 sheets/scummed |

TABLE 10

| | (A) Binder Polymer | (B) Radical Initiator | (C) Polymerizable Compound | (D) Polymerization Inhibitor | (E) Sensitizing Dye | Additive | Support/ Protective Layer |
|---|---|---|---|---|---|---|---|
| Example 16 | P-3 | B-1 | U-2 | D-1 | E-2 | H-1 | 2/1 |
| Example 17 | P-3 | B-1 | U-2 | D-2 | E-2 | H-1 | 2/1 |
| Example 18 | P-3 | B-1 | U-2 | D-3 | E-2 | H-1 | 2/1 |
| Example 19 | P-3 | B-1 | U-2 | D-4 | E-2 | H-1 | 2/1 |
| Example 20 | P-3 | B-1 | U-2 | D-5 | E-2 | H-1 | 2/1 |
| Example 21 | P-3 | B-1 | U-2 | D-6 | E-2 | H-1 | 2/1 |
| Example 22 | P-3 | B-1 | U-2 | none | E-2 | H-1 | 2/1 |
| Example 23 | P-27 | B-1 | U-2 | D-7 | E-2 | H-1 | 2/1 |
| Example 24 | P-27 | B-1 | U-2 | D-8 | E-2 | H-1 | 2/1 |
| Example 25 | P-27 | B-1 | U-2 | D-9 | E-2 | H-1 | 2/1 |
| Example 26 | P-27 | B-1 | U-2 | D-10 | E-2 | H-1 | 2/1 |
| Example 27 | P-27 | B-1 | U-2 | D-3 | E-2 | H-1 | 2/1 |
| Example 28 | P-27 | B-5 | U-2 | D-3 | E-2 | H-1 | 2/1 |
| Example 29 | P-27 | B-1 | U-2 | D-1 | E-2 | H-1 | 2/1 |
| Example 30 | P-27 | B-5 | U-2 | D-3 | E-5 | H-1 | 2/1 |
| Example 31 | P-27 | B-6 | U-2 | D-3 | E-5 | H-1 | 2/1 |
| Comparative Example 4 | (CP-1) | B-1 | U-2 | D-1 | E-2 | H-1 | 2/1 |
| Comparative Example 5 | P-1 | (CB-2) | U-2 | D-2 | E-2 | H-1 | 2/1 |
| Comparative Example 6 | (CP-2) | (CB-2) | U-2 | D-3 | E-2 | H-1 | 2/1 |

| | Exposure Wavelength | Developer | Press Life/Scumming of Non-Image Area | | |
|---|---|---|---|---|---|
| | | | No Enforced Aging | 60° C., 3 Days | 45° C., Humidity: 75%, 3 Days |
| Example 16 | 400 | 2 | 80,000 sheets/no scum | 80,000 sheets/no scum | 80,000 sheets/no scum |
| Example 17 | 400 | 2 | 80,000 sheets/no scum | 80,000 sheets/no scum | 80,000 sheets/no scum |
| Example 18 | 400 | 2 | 91,000 sheets/no scum | 91,000 sheets/no scum | 91,000 sheets/no scum |
| Example 19 | 400 | 2 | 80,000 sheets/no scum | 80,000 sheets/no scum | 80,000 sheets/no scum |
| Example 20 | 400 | 2 | 80,000 sheets/no scum | 80,000 sheets/no scum | 80,000 sheets/no scum |
| Example 21 | 400 | 2 | 85,000 sheets/no scum | 85,000 sheets/no scum | 85,000 sheets/no scum |
| Example 22 | 400 | 2 | 79,000 sheets/no scum | 79,000 sheets/no scum | 79,000 sheets/no scum |
| Example 23 | 400 | 2 | 100,000 sheets/no scum | 100,000 sheets/no scum | 100,000 sheets/no scum |
| Example 24 | 400 | 2 | 100,000 sheets/no scum | 100,000 sheets/no scum | 100,000 sheets/no scum |
| Example 25 | 400 | 2 | 102,000 sheets/no scum | 102,000 sheets/no scum | 102,000 sheets/no scum |
| Example 26 | 400 | 2 | 100,000 sheets/no scum | 100,000 sheets/no scum | 100,000 sheets/no scum |
| Example 27 | 400 | 2 | 106,000 sheets/no scum | 106,000 sheets/no scum | 106,000 sheets/no scum |
| Example 28 | 400 | 2 | 108,000 sheets/no scum | 108,000 sheets/no scum | 108,000 sheets/no scum |
| Example 29 | 400 | 2 | 104,000 sheets/no scum | 104,000 sheets/no scum | 104,000 sheets/no scum |
| Example 30 | 400 | 2 | 112,000 sheets/no scum | 112,000 sheets/no scum | 112,000 sheets/no scum |
| Example 31 | 400 | 2 | 118,000 sheets/no scum | 118,000 sheets/no scum | 118,000 sheets/no scum |
| Comparative Example 4 | 400 | 2 | 55,000 sheets/no scum | 55,000 sheets/scummed | 55,000 sheets/scummed |
| Comparative Example 5 | 400 | 2 | 50,000 sheets/no scum | 50,000 sheets/scummed | 50,000 sheets/no scum |
| Comparative Example 6 | 400 | 2 | 51,000 sheets/no scum | 51,000 sheets/no scum | 51,000 sheets/scummed |

TABLE 11

| | (A) Binder Polymer | (B) Radical Initiator | (C) Polymerizable Compound | (D) Polymerization Inhibitor | (E) Sensitizing Dye | Additive | Support/ Protective Layer |
|---|---|---|---|---|---|---|---|
| Example 32 | P-10 | B-1 | U-2 | none | E-1 | H-1 | 2/2 |
| Example 33 | P-11 | B-2 | U-2 | none | E-1 | H-1 | 2/2 |
| Example 34 | P-12 | B-2 | U-2 | none | E-1 | H-1 | 2/2 |
| Example 35 | P-13 | B-1 | U-2 | none | E-1 | H-1 | 2/2 |
| Example 36 | P-14 | B-3 | U-2 | none | E-1 | H-1 | 2/2 |
| Example 37 | P-15 | B-1 | U-2 | none | E-1 | H-1 | 2/2 |
| Example 38 | P-16 | B-2 | U-2 | none | E-1 | H-1 | 2/2 |
| Example 39 | P-17 | B-1 | U-2 | none | E-1 | H-1 | 2/2 |
| Example 40 | P-18 | B-5 | U-2 | none | E-1 | H-1 | 2/2 |
| Example 41 | P-18 | B-1 | U-2 | none | E-1 | H-1 | 2/2 |
| Example 42 | P-19 | B-1 | U-2 | none | E-1 | H-1 | 2/2 |
| Example 43 | P-20 | B-4 | U-2 | none | E-1 | H-1 | 2/2 |
| Example 44 | P-29 | B-1 | U-2 | none | E-1 | H-1 | 2/2 |
| Example 45 | P-29 | B-5 | U-2 | none | E-1 | H-1 | 2/2 |
| Example 46 | P-30 | B-2 | U-2 | none | E-1 | H-1 | 2/2 |
| Example 47 | P-31 | B-4 | U-2 | none | E-1 | H-1 | 2/2 |
| Comparative Example 7 | (CP-1) | B-1 | U-2 | none | E-1 | H-1 | 2/2 |
| Comparative Example 8 | P-1 | (CB-2) | U-2 | none | E-1 | H-1 | 2/2 |
| Comparative Example 9 | (CP-2) | (CB-2) | U-2 | none | E-1 | H-1 | 2/2 |

| | | | Press Life/Scumming of Non-Image Area | | |
|---|---|---|---|---|---|
| | Exposure Wavelength | Developer | No Enforced Aging | 60° C., 3 Days | 45° C., Humidity: 75%, 3 Days |
| Example 32 | 532 | 1 | 80,000 sheets/no scum | 80,000 sheets/no scum | 80,000 sheets/no scum |
| Example 33 | 532 | 1 | 80,000 sheets/no scum | 80,000 sheets/no scum | 80,000 sheets/no scum |
| Example 34 | 532 | 1 | 70,000 sheets/no scum | 70,000 sheets/no scum | 70,000 sheets/no scum |
| Example 35 | 532 | 1 | 70,000 sheets/no scum | 70,000 sheets/no scum | 70,000 sheets/no scum |
| Example 36 | 532 | 1 | 75,000 sheets/no scum | 75,000 sheets/no scum | 75,000 sheets/no scum |
| Example 37 | 532 | 1 | 75,000 sheets/no scum | 75,000 sheets/no scum | 75,000 sheets/no scum |
| Example 38 | 532 | 1 | 70,000 sheets/no scum | 70,000 sheets/no scum | 70,000 sheets/no scum |
| Example 39 | 532 | 1 | 85,000 sheets/no scum | 85,000 sheets/no scum | 85,000 sheets/no scum |
| Example 40 | 532 | 1 | 95,000 sheets/no scum | 95,000 sheets/no scum | 95,000 sheets/no scum |
| Example 41 | 532 | 1 | 90,000 sheets/no scum | 90,000 sheets/no scum | 90,000 sheets/no scum |
| Example 42 | 532 | 1 | 70,000 sheets/no scum | 70,000 sheets/no scum | 70,000 sheets/no scum |
| Example 43 | 532 | 1 | 69,000 sheets/no scum | 69,000 sheets/no scum | 69,000 sheets/no-scum |
| Example 44 | 532 | 1 | 106,000 sheets/no scum | 106,000 sheets/no scum | 106,000 sheets/no scum |
| Example 45 | 532 | 1 | 108,000 sheets/no scum | 108,000 sheets/no scum | 108,000 sheets/no scum |
| Example 46 | 532 | 1 | 106,000 sheets/no scum | 106,000 sheets/no scum | 106,000 sheets/no scum |
| Example 47 | 532 | 1 | 106,000 sheets/no scum | 106,000 sheets/no scum | 106,000 sheets/no scum |
| Comparative Example 7 | 532 | 1 | 55,000 sheets/no scum | 55,000 sheets/scummed | 55,000 sheets/scummed |
| Comparative Example 8 | 532 | 1 | 50,000 sheets/no scum | 50,000 sheets/scummed | 50,000 sheets/no scum |
| Comparative Example 9 | 532 | 1 | 51,000 sheets/no scum | 51,000 sheets/no scum | 51,000 sheets/scummed |

TABLE 12

| | (A) Binder Polymer | (B) Radical Initiator | (C) Polymerizable Compound | (D) Polymerization Inhibitor | (E) Sensitizing Dye | Additive | Support/ Protective Layer |
|---|---|---|---|---|---|---|---|
| Example 48 | P-18 | B-1 | U-1 | D-11 | E-1 | H-1 | 1/1 |
| Example 49 | P-18 | B-2 | U-1 | D-12 | E-1 | H-1 | 1/1 |
| Example 50 | P-18 | B-2 | U-1 | D-13 | E-1 | H-1 | 1/1 |
| Example 51 | P-18 | B-1 | U-1 | D-14 | E-1 | H-1 | 1/1 |
| Example 52 | P-18 | B-1 | U-1 | D-3 | E-1 | H-1 | 1/1 |
| Example 53 | P-18 | B-1 | U-1 | D-16 | E-1 | H-1 | 1/1 |
| Example 54 | P-18 | B-2 | U-1 | D-17 | E-1 | H-1 | 1/1 |
| Example 55 | P-18 | B-5 | U-1 | D-3 | E-1 | H-1 | 1/1 |
| Example 56 | P-18 | B-5 | U-1 | none | E-1 | H-1 | 1/1 |
| Example 57 | P-27 | B-5 | U-1 | D-3 | E-1 | H-1 | 1/1 |
| Example 58 | P-27 | B-1 | U-1 | D-8 | E-1 | H-1 | 1/1 |
| Example 59 | P-27 | B-1 | U-1 | D-3 | E-1 | H-1 | 1/1 |
| Comparative Example 10 | (CP-1) | B-1 | U-1 | D-1 | E-1 | H-1 | 1/1 |
| Comparative Example 11 | P-1 | (CB-2) | U-1 | D-3 | E-1 | H-1 | 1/1 |
| Comparative Example 12 | (CP-2) | (CB-2) | U-1 | D-2 | E-1 | H-1 | 1/1 |

| | Exposure Wavelength | Developer | Press Life/Scumming of Non-Image Area | | |
|---|---|---|---|---|---|
| | | | No Enforced Aging | 60° C., 3 Days | 45° C., Humidity: 75%, 3 Days |
| Example 48 | 532 | 1 | 80,000 sheets/no scum | 80,000 sheets/no scum | 80,000 sheets/no scum |
| Example 49 | 532 | 1 | 80,000 sheets/no scum | 80,000 sheets/no scum | 80,000 sheets/no scum |
| Example 50 | 532 | 1 | 70,000 sheets/no scum | 70,000 sheets/no scum | 70,000 sheets/no scum |
| Example 51 | 532 | 1 | 70,000 sheets/no scum | 70,000 sheets/no scum | 70,000 sheets/no scum |
| Example 52 | 532 | 1 | 82,000 sheets/no scum | 82,000 sheets/no scum | 82,000 sheets/no scum |
| Example 53 | 532 | 1 | 75,000 sheets/no scum | 75,000 sheets/no scum | 75,000 sheets/no scum |
| Example 54 | 532 | 1 | 70,000 sheets/no scum | 70,000 sheets/no scum | 70,000 sheets/no scum |
| Example 55 | 532 | 1 | 85,000 sheets/no scum | 85,000 sheets/no scum | 85,000 sheets/no scum |
| Example 56 | 532 | 1 | 68,000 sheets/no scum | 68,000 sheets/no scum | 68,000 sheets/no scum |
| Example 57 | 532 | 1 | 100,000 sheets/no scum | 100,000 sheets/no scum | 100,000 sheets/no scum |
| Example 58 | 532 | 1 | 91,000 sheets/no scum | 91,000 sheets/no scum | 91,000 sheets/no scum |
| Example 59 | 532 | 1 | 93,000 sheets/no scum | 93,000 sheets/no scum | 93,000 sheets/no scum |
| Comparative Example 10 | 532 | 1 | 55,000 sheets/no scum | 55,000 sheets/scummed | 55,000 sheets/scummed |
| Comparative Example 11 | 532 | 1 | 50,000 sheets/no scum | 50,000 sheets/scummed | 50,000 sheets/no scum |
| Comparative Example 12 | 532 | 1 | 51,000 sheets/no scum | 51,000 sheets/no scum | 51,000 sheets/scummed |

TABLE 13

| | (A) Binder Polymer | (B) Radical Initiator | (C) Polymerizable Compound | (D) Polymerization Inhibitor | (E) Sensitizing Dye | Additive | Support/ Protective Layer |
|---|---|---|---|---|---|---|---|
| Example 60 | P-21 | B-1 | DPHA | none | E-4 | none | 3/2 |
| Example 61 | P-22 | B-1 | DPHA | none | E-4 | none | 3/2 |
| Example 62 | P-23 | B-1 | DPHA | none | E-4 | none | 3/2 |
| Example 63 | P-24 | B-1 | DPHA | none | E-4 | none | 3/2 |
| Example 64 | P-25 | B-4 | DPHA | none | E-4 | none | 3/2 |
| Example 65 | P-26 | B-4 | DPHA | none | E-4 | none | 3/2 |
| Example 66 | P-27 | B-4 | DPHA | none | E-4 | none | 3/2 |
| Example 67 | P-28 | B-4 | DPHA | none | E-4 | none | 3/2 |
| Example 68 | P-29 | B-1 | DPHA | none | E-4 | none | 3/2 |
| Example 69 | P-30 | B-1 | DPHA | none | E-4 | none | 3/2 |
| Example 70 | P-31 | B-1 | DPHA | none | E-4 | none | 3/2 |
| Comparative Example 13 | (CP-1) | B-1 | DPHA | none | E-4 | none | 3/2 |
| Comparative Example 14 | P-1 | (CB-2) | DPHA | none | E-4 | none | 3/2 |
| Comparative Example 15 | (CP-2) | (CB-2) | DPHA | none | E-4 | none | 3/2 |

TABLE 13-continued

|  |  |  | Press Life/Scumming of Non-Image Area | | |
|---|---|---|---|---|---|
|  | Exposure Wavelength | Developer | No Enforced Aging | 60° C., 3 Days | 45° C., Humidity: 75%, 3 Days |
| Example 60 | 830 | 2 | 75,000 sheets/no scum | 75,000 sheets/no scum | 75,000 sheets/no scum |
| Example 61 | 830 | 2 | 75,000 sheets/no scum | 75,000 sheets/no scum | 75,000 sheets/no scum |
| Example 62 | 830 | 2 | 70,000 sheets/no scum | 70,000 sheets/no scum | 70,000 sheets/no scum |
| Example 63 | 830 | 2 | 70,000 sheets/no scum | 70,000 sheets/no scum | 70,000 sheets/no scum |
| Example 64 | 830 | 2 | 75,000 sheets/no scum | 75,000 sheets/no scum | 75,000 sheets/no scum |
| Example 65 | 830 | 2 | 75,000 sheets/no scum | 75,000 sheets/no scum | 75,000 sheets/no scum |
| Example 66 | 830 | 2 | 85,000 sheets/no scum | 85,000 sheets/no scum | 85,000 sheets/no scum |
| Example 67 | 830 | 2 | 85,000 sheets/no scum | 85,000 sheets/no scum | 85,000 sheets/no scum |
| Example 68 | 830 | 2 | 80,000 sheets/no scum | 80,000 sheets/no scum | 80,000 sheets/no scum |
| Example 69 | 830 | 2 | 90,000 sheets/no scum | 90,000 sheets/no scum | 90,000 sheets/no scum |
| Example 70 | 830 | 2 | 80,000 sheets/no scum | 80,000 sheets/no scum | 80,000 sheets/no scum |
| Comparative Example 13 | 830 | 2 | 55,000 sheets/no scum | 55,000 sheets/scummed | 55,000 sheets/scummed |
| Comparative Example 14 | 830 | 2 | 50,000 sheets/no scum | 50,000 sheets/scummed | 50,000 sheets/no scum |
| Comparative Example 15 | 830 | 2 | 51,000 sheets/no scum | 51,000 sheets/no scum | 51,000 sheets/scummed |

TABLE 14

|  | (A) Binder Polymer | (B) Radical Initiator | (C) Polymerizable Compound | (D) Polymerization Inhibitor | (E) Sensitizing Dye | Additive | Support/ Protective Layer |
|---|---|---|---|---|---|---|---|
| Example 71 | P-25 | B-1 | U-1 | D-15 | E-4 | none | 1/2 |
| Example 72 | P-25 | B-1 | U-1 | D-2 | E-4 | none | 1/2 |
| Example 73 | P-25 | B-1 | U-1 | D-3 | E-4 | none | 1/2 |
| Example 74 | P-25 | B-1 | U-1 | D-4 | E-4 | none | 1/2 |
| Example 75 | P-25 | B-4 | U-1 | none | E-4 | none | 1/2 |
| Example 76 | P-28 | B-4 | U-1 | D-9 | E-4 | none | 1/2 |
| Example 77 | P-28 | B-4 | U-1 | D-3 | E-4 | none | 1/2 |
| Example 78 | P-28 | B-5 | U-1 | D-3 | E-4 | none | 1/2 |
| Comparative Example 16 | (CP-1) | B-1 | U-1 | D-9 | E-4 | none | 1/2 |
| Comparative Example 17 | P-1 | (CB-2) | U-1 | D-3 | E-4 | none | 1/2 |
| Comparative Example 18 | (CP-2) | (CB-2) | U-1 | D-3 | E-4 | none | 1/2 |

|  |  |  | Press Life/Scumming of Non-Image Area | | |
|---|---|---|---|---|---|
|  | Exposure Wavelength | Developer | No Enforced Aging | 60° C., 3 Days | 45° C., Humidity: 75%, 3 Days |
| Example 71 | 830 | 2 | 75,000 sheets/no scum | 75,000 sheets/no scum | 75,000 sheets/no scum |
| Example 72 | 830 | 2 | 75,000 sheets/no scum | 75,000 sheets/no scum | 75,000 sheets/no scum |
| Example 73 | 830 | 2 | 70,000 sheets/no scum | 70,000 sheets/no scum | 70,000 sheets/no scum |
| Example 74 | 830 | 2 | 70,000 sheets/no scum | 70,000 sheets/no scum | 70,000 sheets/no scum |
| Example 75 | 830 | 2 | 67,000 sheets/no scum | 67,000 sheets/no scum | 67,000 sheets/no scum |
| Example 76 | 830 | 2 | 85,000 sheets/no scum | 85,000 sheets/no scum | 85,000 sheets/no scum |
| Example 77 | 830 | 2 | 89,000 sheets/no scum | 85,000 sheets/no scum | 85,000 sheets/no scum |
| Example 78 | 830 | 2 | 95,000 sheets/no scum | 80,000 sheets/no scum | 80,000 sheets/no scum |
| Comparative Example 16 | 830 | 2 | 55,000 sheets/no scum | 55,000 sheets/scummed | 55,000 sheets/scummed |
| Comparative Example 17 | 830 | 2 | 50,000 sheets/no scum | 50,000 sheets/scummed | 50,000 sheets/no scum |
| Comparative Example 18 | 830 | 2 | 51,000 sheets/no scum | 51,000 sheets/no scum | 51,000 sheets/scummed |

Structures of (B) the specific radical initiator [(B-1) to (B-6)], Comparative Radical Initiators (BC-1) and (BC-2), (C) the compound having an ethylenically unsaturated bond [(DPHA), (U-1) and (U-2)], Sensitizing Dyes [(E-1) to (E-5)], (D) the polymerization inhibitor [(D-1) to (D-17)] and Additive (H-1) in Tables 9 to 14 are shown below.

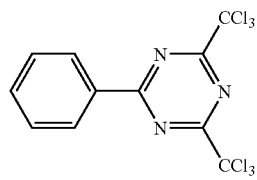 (B-1)
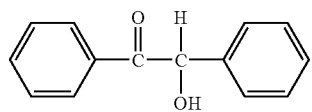 (B-2)
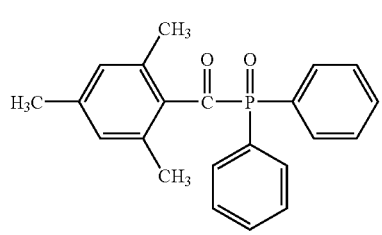 (B-3)
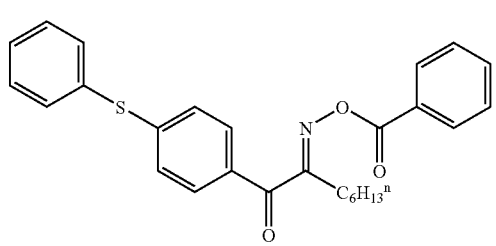 (B-4)
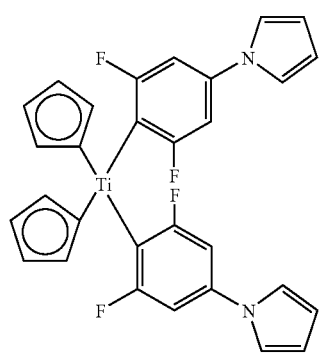 (B-5)
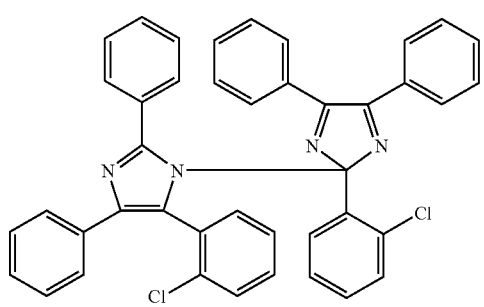 (B-6)
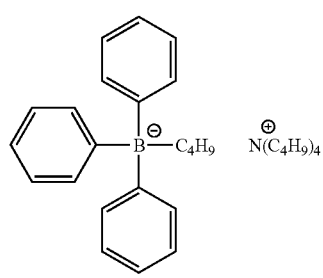 (CB-1)
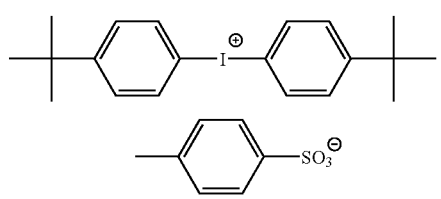 (CB-2)
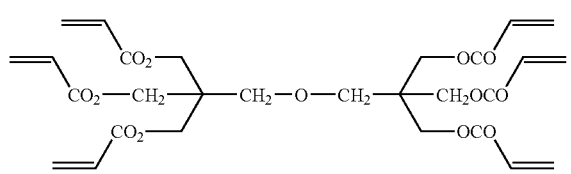 (DPHA)
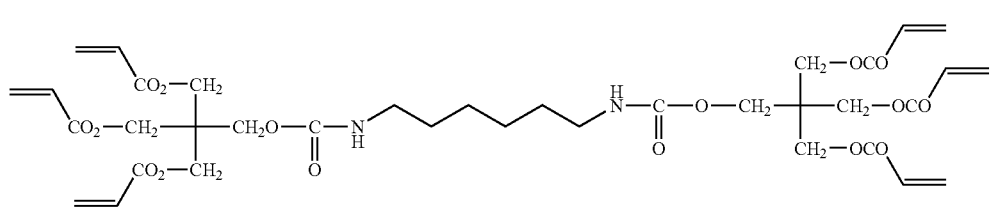 (U-1)

-continued
(U-2)
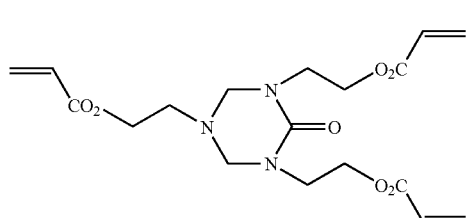
(E-1)
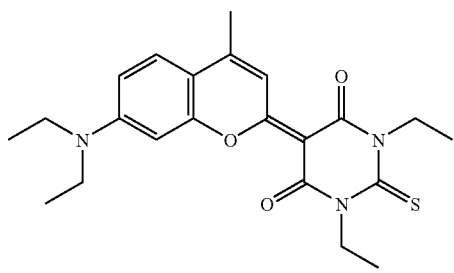
(E-2)
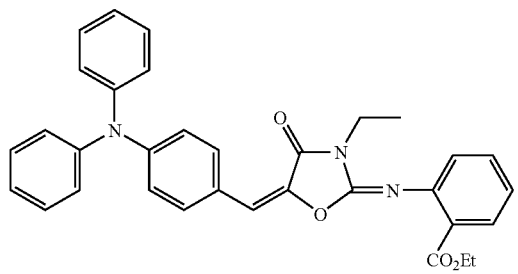
(E-3)
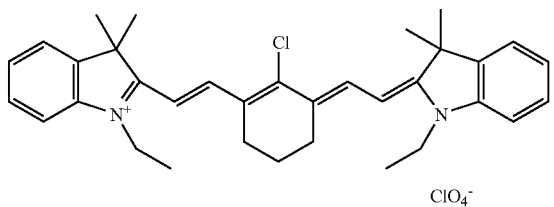
(E-4)
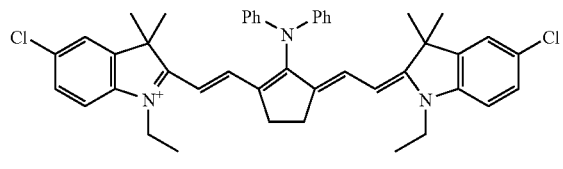
(E-5)
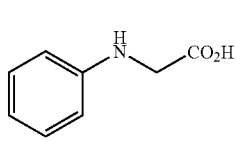
(D-1)
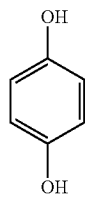
(D-2)
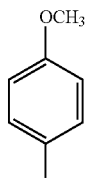
(D-3)
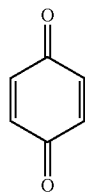
(D-4) $CH_3(CH_2)_2COOH$
(D-5)
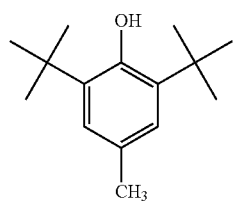
(D-6)
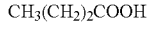
(D-7)
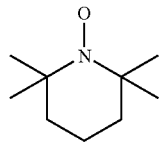
(D-8)
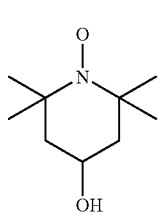

-continued

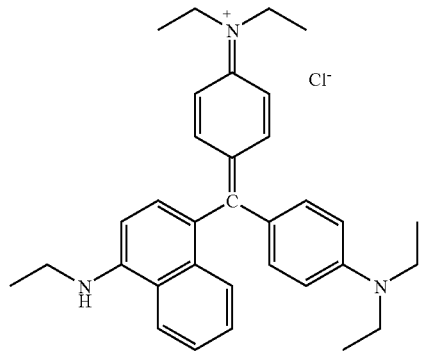

(D-9)

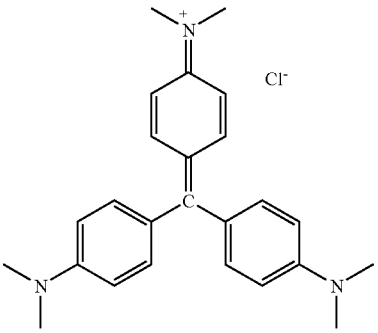

(D-10)

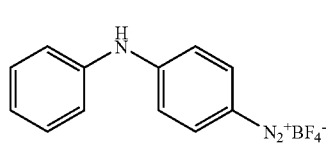

(D-11)

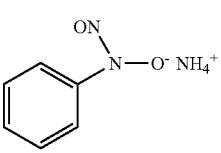

(D-12)

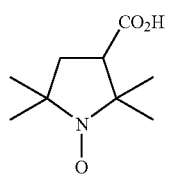

(D-13)

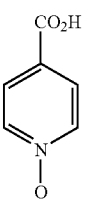

(D-14)

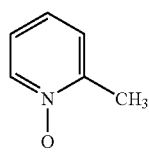

(D-15)

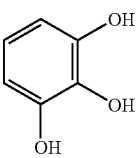

(D-16)

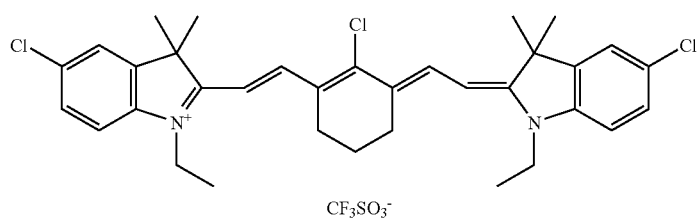

(D-17)

(H-1):

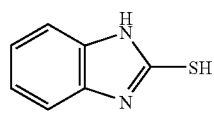

(Formation of Protective Layer 1)

After thus forming the recording layer, in some samples, a 3 mass % aqueous solution of polyvinyl alcohol (saponification degree: 98 mol %; polymerization degree: 550) was coated on the recording layer to have a dry coated amount of 2 g/m² and dried at 100° C. for 2 minutes to form Protective Layer 1.

(Formation of Protective Layer 2)

After forming the recording layer, in some samples, a 5 mass % aqueous solution having the following composition was coated on the recording layer to have a dry coated amount of 2.5 g/m² and dried at 120° C. for 2 minutes to form Protective Layer 2.

<Composition for Protective Layer 2>

| | |
|---|---|
| Polyvinyl alcohol (saponification degree: 98 mol %, polymerization degree: 500) (Kuraray Poval PVA-105, produced by Kuraray Co., Ltd.) | 95 wt % |
| Polyvinylpyrrolidone (K30, produced by Wako Pure Chemical Industries, Ltd.) | 5 wt % |

In this way, lithographic printing plate precursors of Examples and Comparative Examples were obtained.

(Exposure)

The obtained lithographic printing plate precursors each was exposed by using different light sources according to the exposure wavelength. For example, the lithographic printing plate precursor was exposed in air by using a semiconductor layer at a wavelength of 400 nm, an FD-YAG laser of 532 nm or a semiconductor layer of 830 nm.

(Development Processing)

After the exposure, each lithographic printing plate precursor was developed by using an automatic developing machine Stablon 900NP manufactured by Fuji Photo Film Co., Ltd. As for the developer, either Developer 1 or 2 shown below was used. The processing was performed at a development bath temperature of 30° C. for a development time of 12 seconds.

In this way, each lithographic printing plate was obtained.

<Developer 1>

A 1:8 water dilution of DP-4 produced by Fuji Photo Film Co., Ltd.

<Developer 2>

A 1:4 water dilution of DV-2 produced by Fuji Photo Film Co., Ltd.

(Evaluation of Press Life and Scumming)

The obtained lithographic printing plates each was subjected to printing by using a printing press Lithrone manufactured by Komori Corp. At this time, how many sheets could be printed while maintaining a sufficiently high ink density was measured with an eye, and the press life and scumming of the non-image area were evaluated. The results are shown together in Tables 9 to 14.

Also, some of the obtained lithographic printing plates were scan-exposed to a halftone image from 1 to 99% (in steps of 1%) under the conditions of 175 lines/inch and 4,000 dpi by using violet LD (Violet Boxer (wavelength: 405 nm) produced by FFEI) with an exposure amount of 50 µJ/cm$^2$ as focused on the plate surface, and then developed with the following developer and finisher solution by using an automatic developing machine LP850P-II manufactured by Fuji Photo film Co., Ltd.

Developer:
DV-2 produced by Fuji Photo Film Co., Ltd.: water=1:4.

Finisher:
FP-2W gum solution produced by Fuji Photo Film, which was 3-fold diluted with water.

The thus-produced printing plates each was subjected to printing of 120,000 sheets by using a two-color printing press SOR-KZ manufactured by Heilderberg Co. and using an ink Craph G(N) produced by Dainippon Ink & Chemicals, Inc. The press life was evaluated by the number of printed matters which could reproduce the 2% part of 175 lines/inch. The results obtained are shown in Tables 9 to 14.

As apparent from Tables 9 to 14, when the polymerizable composition of the present invention is applied to the recording layer of a lithographic printing plate precursor, by virtue of its excellent film property and image formability, the obtained lithographic printing plate is excellent in the press life and antiscumming property.

The polymerizable composition of the present invention is expected to be suitably usable, for example, as an image recording material such as synthetic resin relief printing plate, color proof, photoresist and color filter used in three-dimensional stereolithography, holography, lithographic printing plate material and flexographic printing, or as an ink, a coating material or an adhesive, particularly, as an image-recording layer of a negative lithographic printing plate precursor capable of so-called direct plate-making of directly producing a printing plate based on digital signals of a computer or the like by using laser light.

This application is based on Japanese Patent application JP 2004-26049, filed Feb. 2, 2004, and Japanese Patent application JP 2004-245537, filed Aug. 25, 2004, the entire contents of which are hereby incorporated by reference, the same as if set forth at length.

What is claimed is:

1. A polymerizable composition comprising:
   (A) a non-acrylic binder polymer containing a polyurethane resin and having an ethylenically unsaturated bond on a side chain;
   (B) a neutrally charged hexaarylbiimidazole compound capable of generating a radical under light or heat; and
   (C) a compound having an ethylenically unsaturated bond;
   wherein the polyurethane resin is a reaction product of a diisocyanate compound and a diol compound, and the diol compound contains (i) at least one diol compound having an ethylenically unsaturated bond group, with at least one being a secondary alcohol, and (ii) at least one diol compound having a carboxyl group.

2. The polymerizable composition according to claim 1, further comprising:
   (D) a polymerization inhibitor.

3. The polymerizable composition according to claim 2, wherein the polymerization inhibitor (D) contains a 1,4-benzoquinone derivative.

4. The polymerizable composition according to claim 1, wherein the polyurethane resin has 0.3 meq/g or more of an ethylenically unsaturated bond group on a side chain, and has 0.4 meq/g or more of a carboxyl group on a side chain.

5. The polymerizable composition according to claim 1, wherein the diol compound having an ethylenically unsaturated bond group is a compound represented by the following formula (G):

$$\text{(G)}$$

wherein $R^1$, $R^2$ and $R^3$ each independently represents a hydrogen atom or a monovalent organic group, A represents a divalent organic residue, X represents an oxygen atom, a sulfur atom or —N($R^{12}$)—, and $R^{12}$ represents a hydrogen atom or a monovalent organic group.

6. The polymerizable composition according to claim 1, further comprising (E') a dye having a maximum absorption wavelength in a region of from 350 to 450 nm.

7. The polymerizable composition according to claim 1, further comprising an infrared absorbent.

8. A lithographic printing plate precursor comprising a support and a recording layer containing the polymerizable composition according to claim 1.

9. A polymerizable composition comprising:

(A') a polyurethane resin having an ethylenically unsaturated bond on a side chain, which is a reaction product of an isocyanate compound and a diol compound including a diol compound represented by the following formula (G):

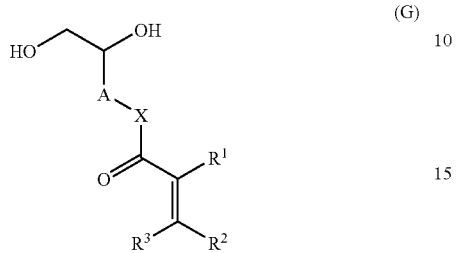

wherein $R^1$, $R^2$ and $R^3$ each independently represents a hydrogen atom or a monovalent organic group, A represents a divalent organic residue, X represents an oxygen atom, a sulfur atom or —N($R^{12}$)—, and $R^{12}$ represents a hydrogen atom or a monovalent organic group;

(B) a neutrally charged hexaarylbiimidazole compound capable of generating a radical under light or heat;
(C) a compound having an ethylenically unsaturated bond;
(D') a 1,4-benzoquinone derivative; and
(E') a dye having a maximum absorption wavelength in a region of from 350 to 450 nm.

10. A polymerizable composition comprising:
(A) a non-acrylic binder polymer containing a polyurethane resin and having an ethylenically unsaturated bond on a side chain;
(B) a neutrally charged hexaarylbiimidazole compound capable of generating a radical under light or heat;
(C) a compound having an ethylenically unsaturated bond; and
(D) a polymerization inhibitor containing a 1,4-benzoquinone derivative;

wherein the polyurethane resin is a reaction product of a diisocyanate compound and a diol compound, and the diol compound contains (i) at least one diol compound having an ethylenically unsaturated bond group, with at least one being a secondary alcohol, and (ii) at least one diol compound having a carboxyl group; and the diol compound having an ethylenically unsaturated bond group is a compound represented by the following formula (G):

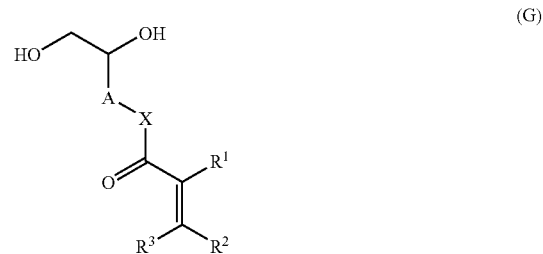

wherein $R^1$, $R^2$ and $R^3$ each independently represents a hydrogen atom or a monovalent organic group, A represents a divalent organic residue, X represents an oxygen atom, a sulfur atom or —N($R^{12}$)—, and $R^{12}$ represents a hydrogen atom or a monovalent organic group.

* * * * *